| (12) | United States Patent | (10) Patent No.: | US 7,795,700 B2 |
|---|---|---|---|
| | Rofougaran | (45) Date of Patent: | Sep. 14, 2010 |

(54) INDUCTIVELY COUPLED INTEGRATED CIRCUIT WITH MAGNETIC COMMUNICATION PATH AND METHODS FOR USE THEREWITH

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 242 days.

(21) Appl. No.: 12/039,256

(22) Filed: Feb. 28, 2008

(65) Prior Publication Data

US 2009/0218701 A1 Sep. 3, 2009

(51) Int. Cl.
*H01L 27/08* (2006.01)

(52) U.S. Cl. .............................. 257/531; 257/E21.022; 257/277; 257/904; 257/924; 438/108

(58) Field of Classification Search .......... 257/E23.114, 257/778–781, 783, 786, 723–725, 277, 531, 257/904, 924, E21.022; 438/108; 29/840; 219/121.63, 121.64
See application file for complete search history.

(56) References Cited

U.S. PATENT DOCUMENTS

| 5,196,821 | A | * | 3/1993 | Partin et al. ............... 338/32 R |
|---|---|---|---|---|
| 5,519,582 | A | * | 5/1996 | Matsuzaki ................... 361/783 |
| 5,829,125 | A | * | 11/1998 | Fujimoto et al. .............. 29/840 |
| 6,011,307 | A | * | 1/2000 | Jiang et al. ................... 257/746 |
| 6,356,068 | B1 | * | 3/2002 | Steiner et al. ........... 324/117 H |
| 6,362,525 | B1 | * | 3/2002 | Rahim ......................... 257/738 |
| 6,885,561 | B1 | * | 4/2005 | Hashemi et al. ............. 361/760 |
| 7,095,112 | B2 | * | 8/2006 | Endo et al. ................... 257/724 |
| 7,234,218 | B2 | * | 6/2007 | Farooq et al. ............... 29/426.4 |
| 7,295,448 | B2 | * | 11/2007 | Zhu ............................. 363/17 |
| 7,345,563 | B2 | * | 3/2008 | Pavier ......................... 336/200 |
| 7,397,107 | B2 | * | 7/2008 | Brennan et al. ............. 257/532 |
| 7,531,893 | B2 | * | 5/2009 | Koduri ......................... 257/676 |
| 7,642,618 | B2 | * | 1/2010 | Shiramizu et al. ........... 257/531 |
| 7,655,982 | B2 | * | 2/2010 | Kubo et al. ................... 257/343 |

* cited by examiner

*Primary Examiner*—Chris Chu
(74) *Attorney, Agent, or Firm*—Garlick Harrison & Markison; Bruce E. Stuckman

(57) ABSTRACT

An integrated circuit includes a first integrated circuit die having a first circuit and a first inductive interface and a second integrated circuit die having a second circuit and a second inductive interface. A substrate is coupled to support the first integrated circuit die and the second integrated circuit die, the substrate including a magnetic communication path aligned with the first inductive interface and the second inductive interface, to magnetically communicate signals between the first circuit and the second circuit.

17 Claims, 43 Drawing Sheets

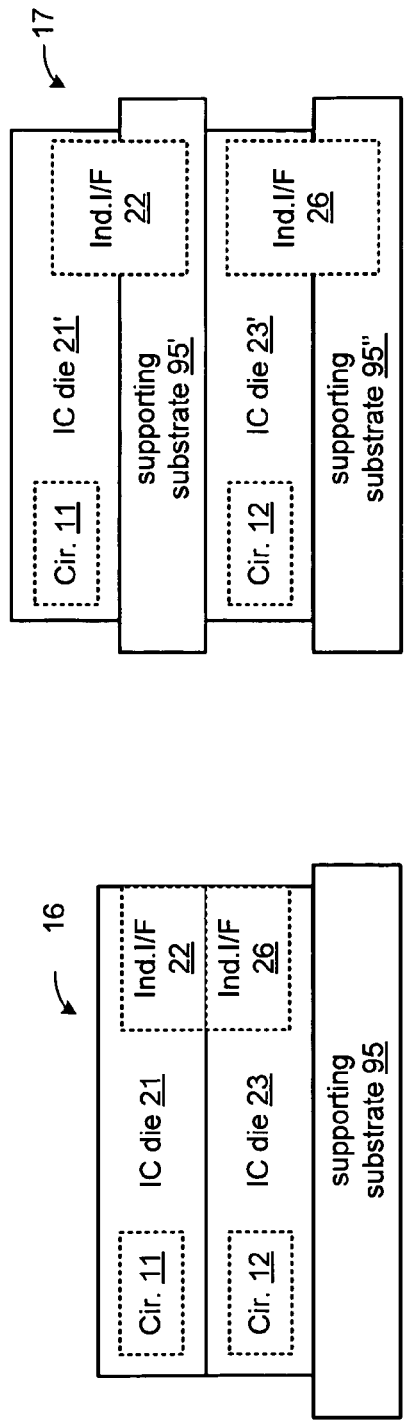
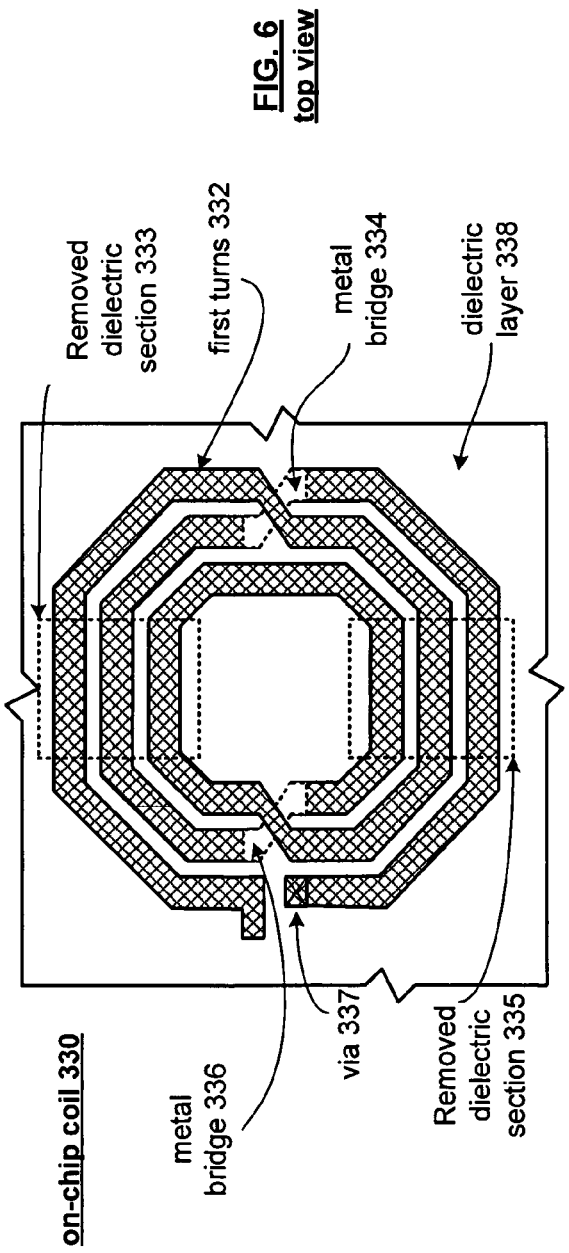

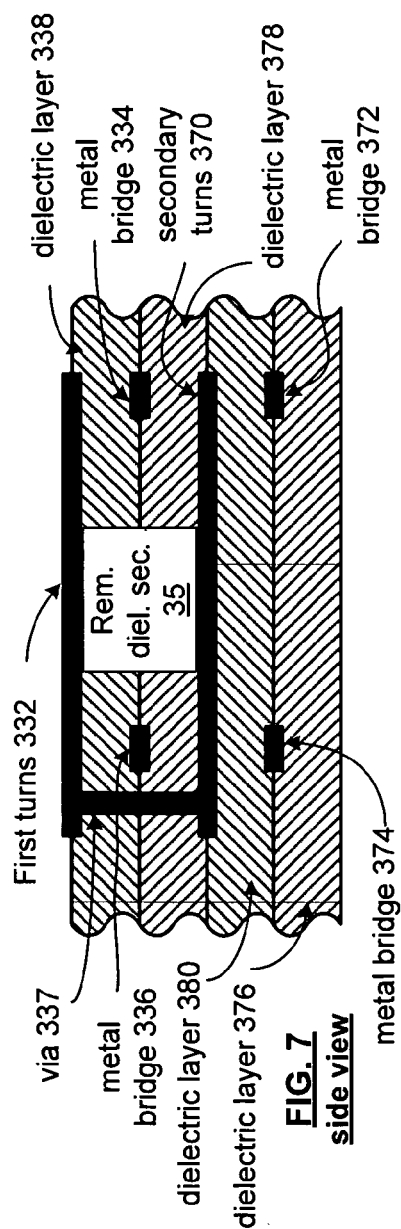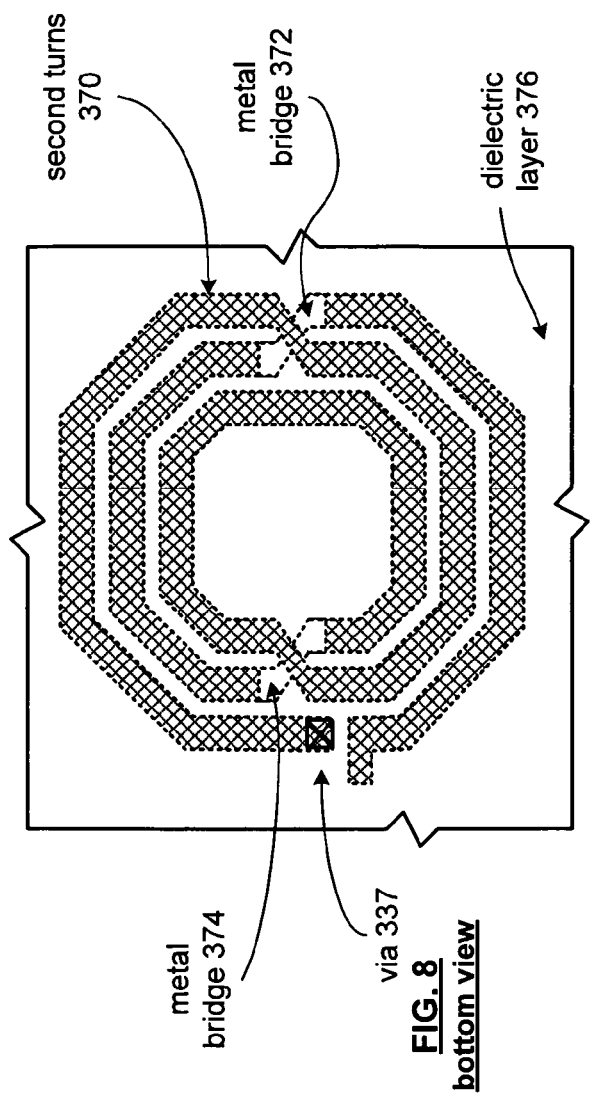
FIG. 7 side view
FIG. 8 bottom view

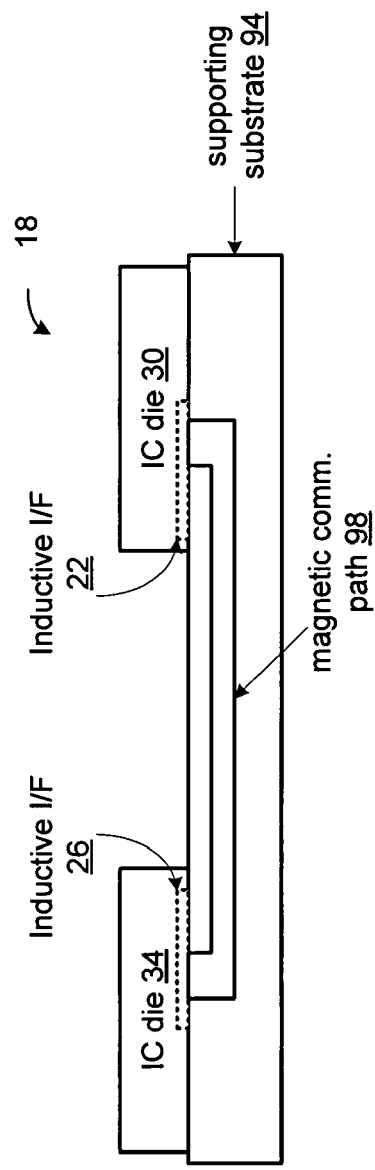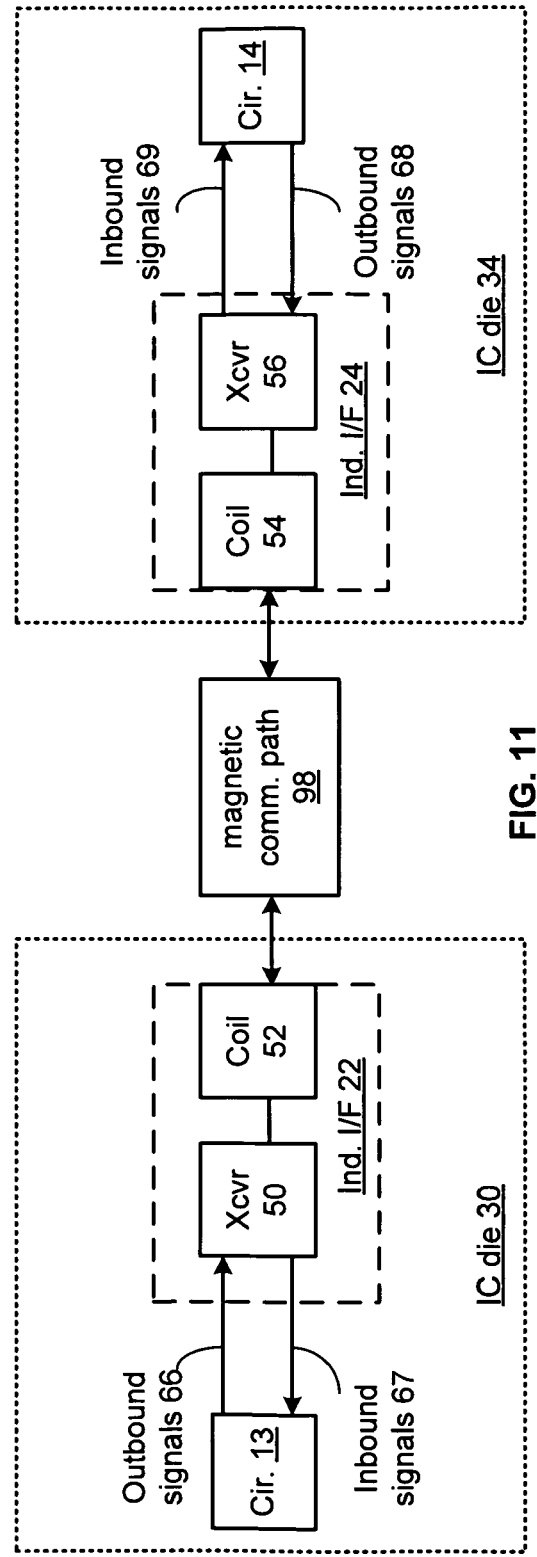

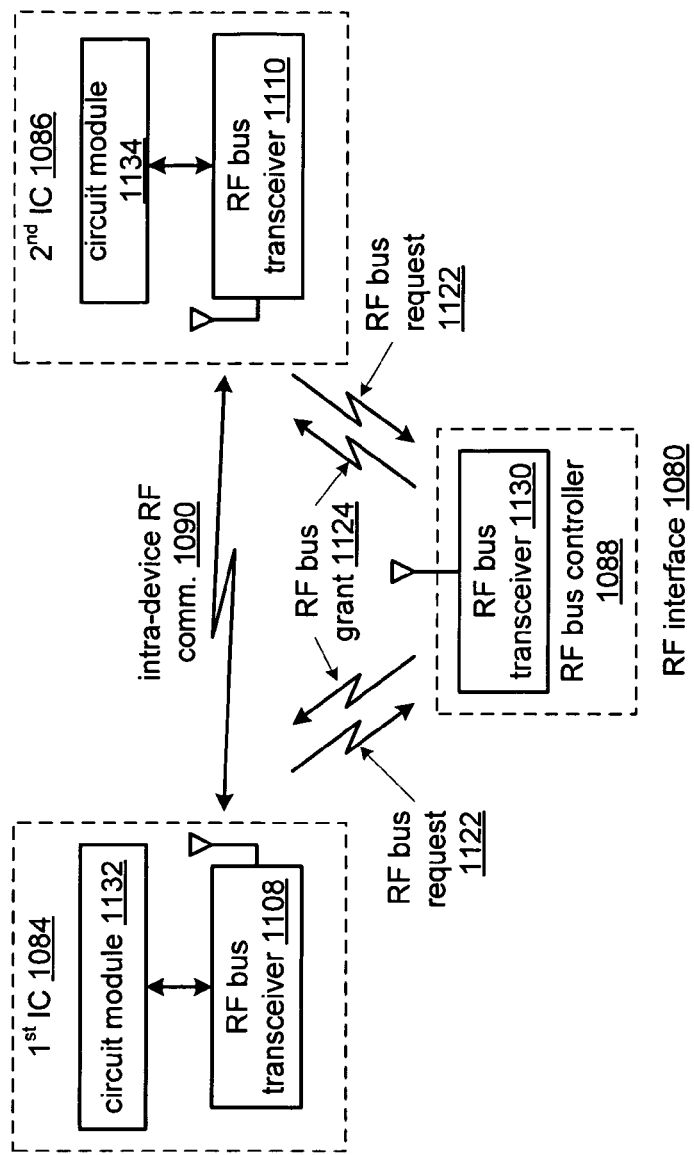

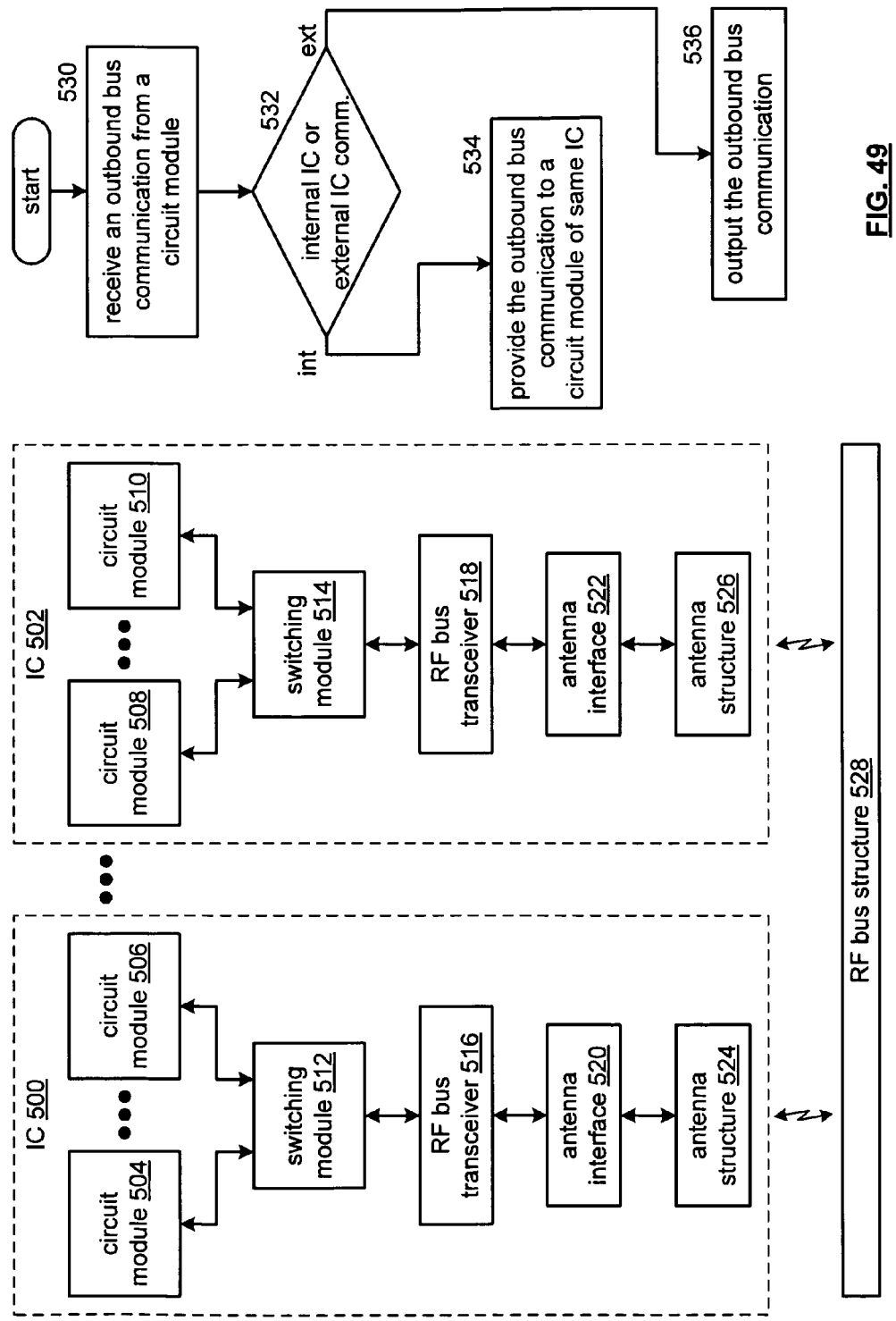

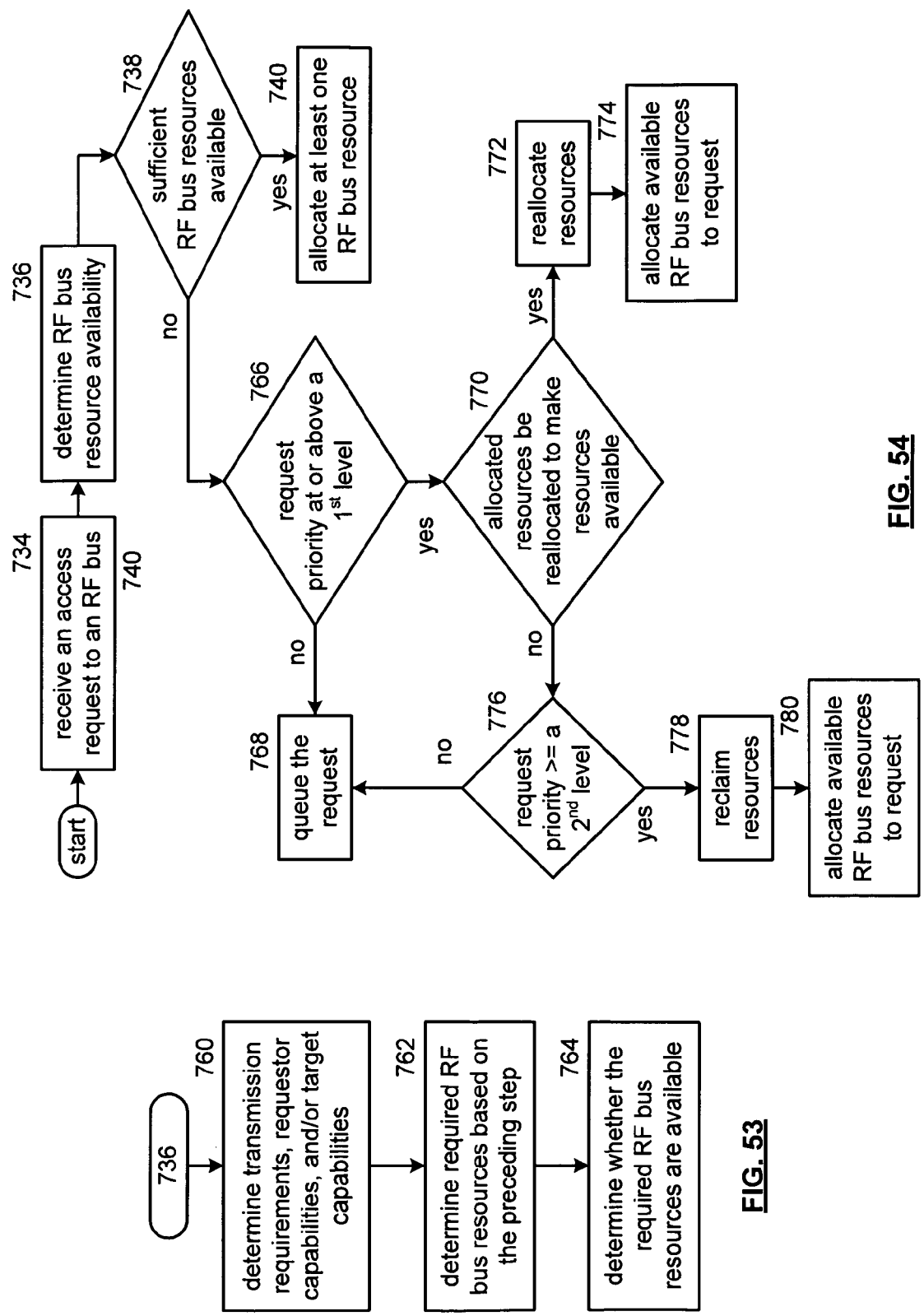

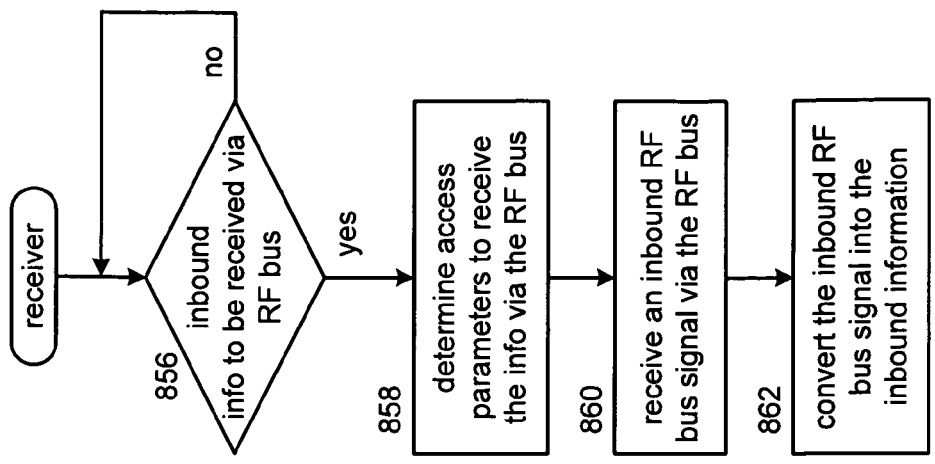
FIG. 60
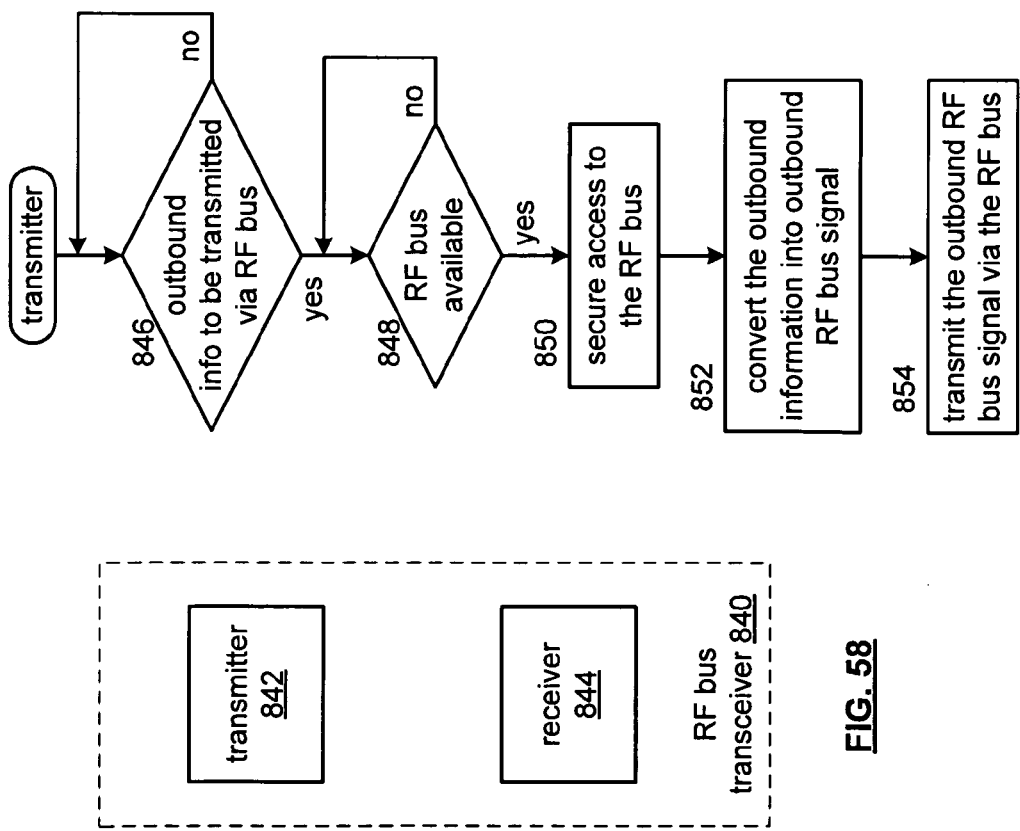
FIG. 59
FIG. 58

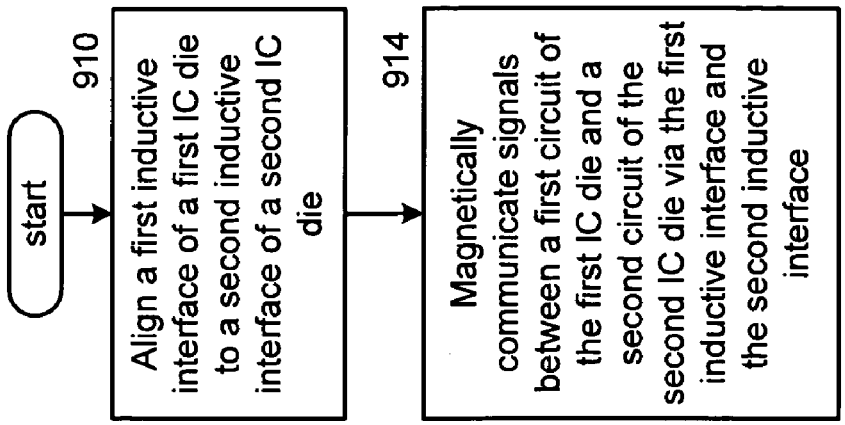
FIG. 64
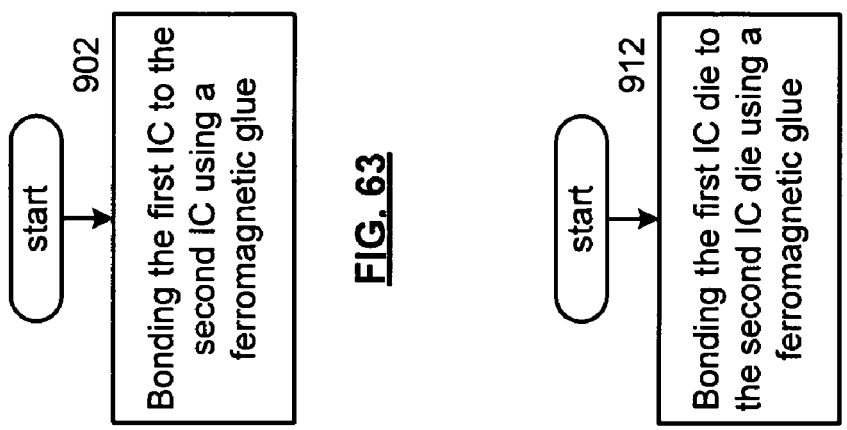
FIG. 63
FIG. 65
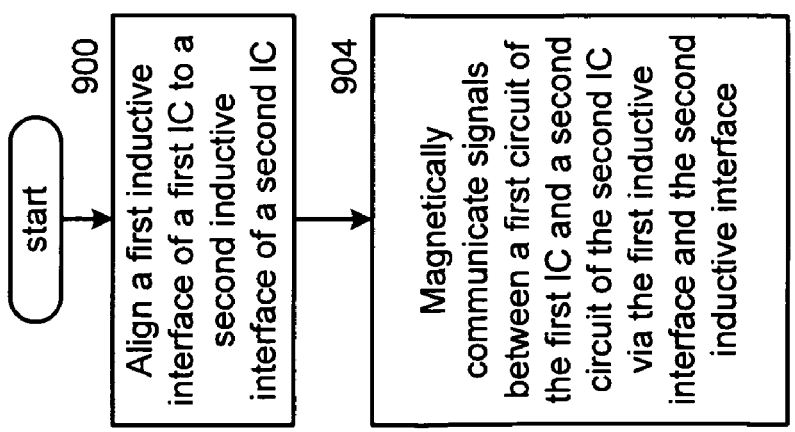
FIG. 62

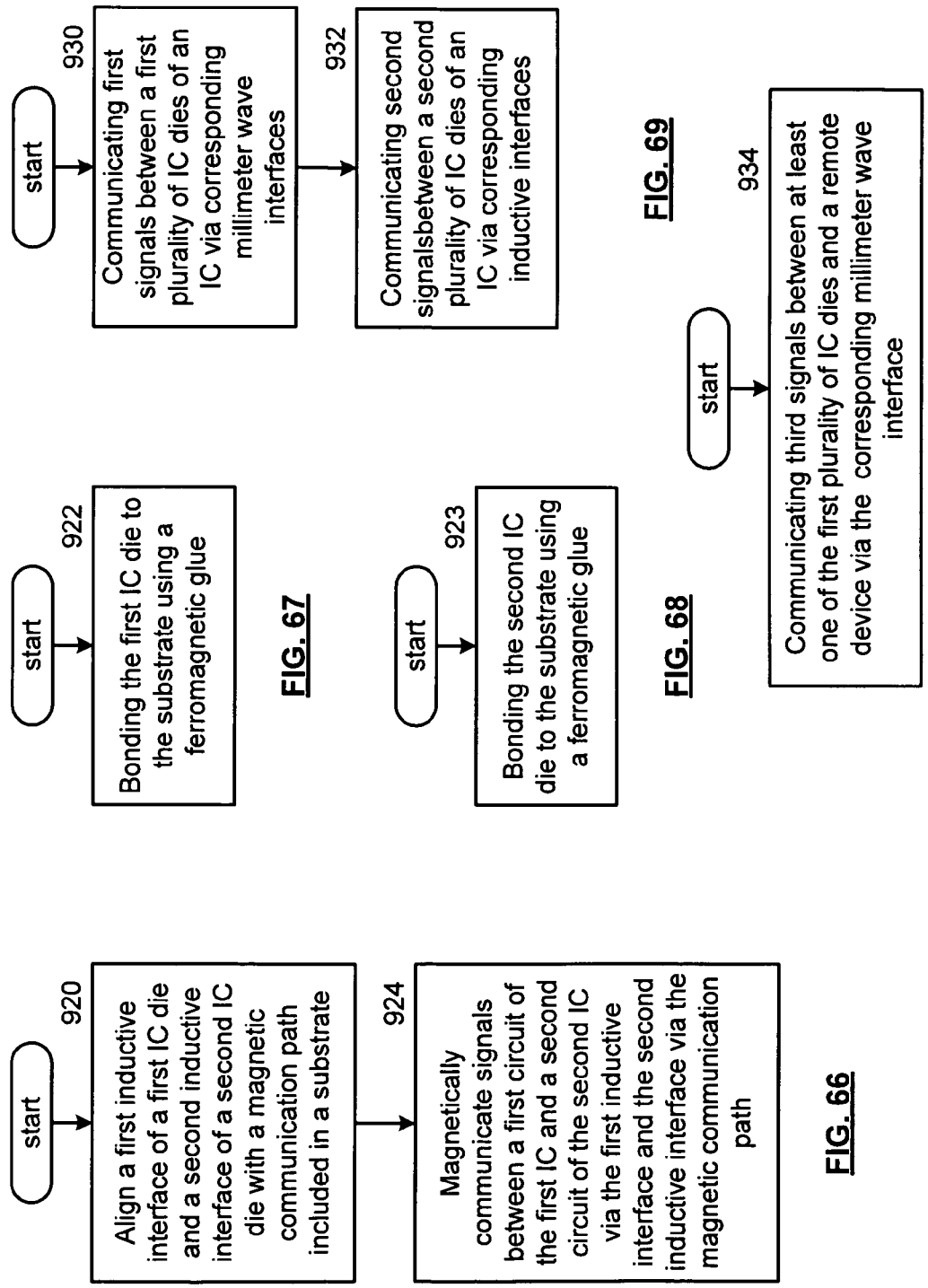

INDUCTIVELY COUPLED INTEGRATED CIRCUIT WITH MAGNETIC COMMUNICATION PATH AND METHODS FOR USE THEREWITH

CROSS-REFERENCE TO RELATED APPLICATIONS

The present application is related to the following patent applications that are commonly assigned and are concurrently filed herewith:

U.S. application Ser. No. 12/038,260, entitled, INDUCTIVELY COUPLED INTEGRATED CIRCUIT AND METHODS FOR USE THEREWITH, filed on Feb. 27, 2008;

U.S. application Ser. No. 12/040,301, entitled, INTEGRATED CIRCUIT WITH MILLIMETER WAVE AND INDUCTIVE COUPLING AND METHODS FOR USE THEREWITH, filed on Feb. 29, 2008;

U.S. application Ser. No. 12/041,463, entitled, INDUCTIVELY COUPLED INTEGRATED CIRCUIT WITH NEAR FIELD COMMUNICATION AND METHODS FOR USE THEREWITH, filed on Mar. 3, 2008; and U.S. application Ser. No. 12/041,723, entitled, INDUCTIVELY COUPLED INTEGRATED CIRCUIT WITH MULTIPLE ACCESS PROTOCOL AND METHODS FOR USE THEREWITH, filed on Mar. 4, 2008.

BACKGROUND OF THE INVENTION

1. Technical Field of the Invention

This invention relates generally to integrated circuits and coupling methods used therein.

2. Description of Related Art

As IC fabrication technology continues to advance, ICs will become smaller and smaller with more and more transistors. While this advancement allows for reduction in size of electronic devices, it does present a design challenge of providing and receiving signals, data, clock signals, operational instructions, etc., to and from a plurality of ICs of the device. Currently, this is addressed by improvements in IC packaging and multiple layer PCBs. For example, ICs may include a ball-grid array of 100-200 pins in a small space (e.g., 2 to 20 millimeters by 2 to 20 millimeters). A multiple layer PCB includes traces for each one of the pins of the IC to route to at least one other component on the PCB. Clearly, advancements in communication between ICs are needed to adequately support the forth-coming improvements in IC fabrication.

Wireless communication devices include a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In most applications, radio transceivers are implemented in one or more integrated circuits (ICs), which are inter-coupled via traces on a printed circuit board (PCB). The radio transceivers operate within licensed or unlicensed frequency spectrums. For example, wireless local area network (WLAN) transceivers communicate data within the unlicensed Industrial, Scientific, and Medical (ISM) frequency spectrum of 900 MHz, 2.4 GHz, and 5 GHz.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

Figure 9:
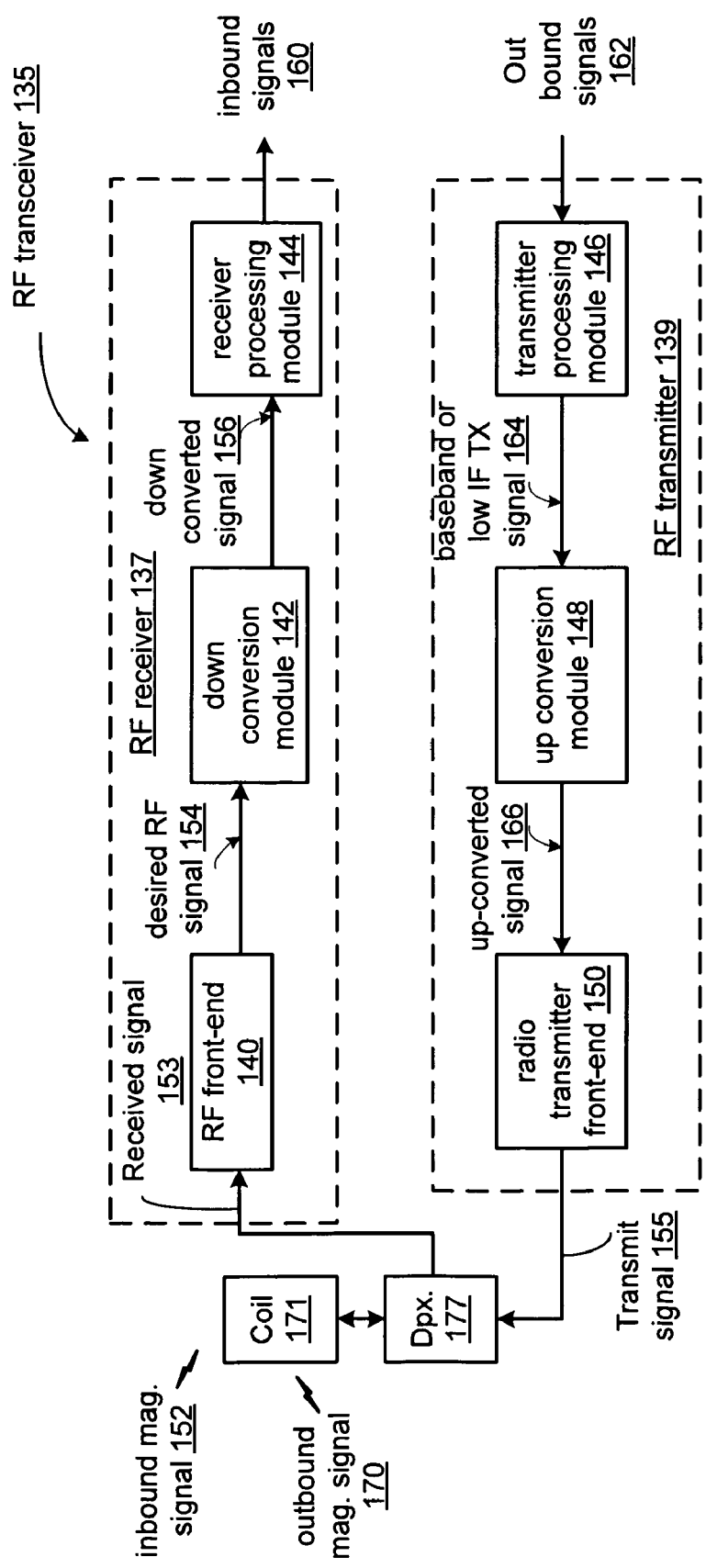
Figure 12:
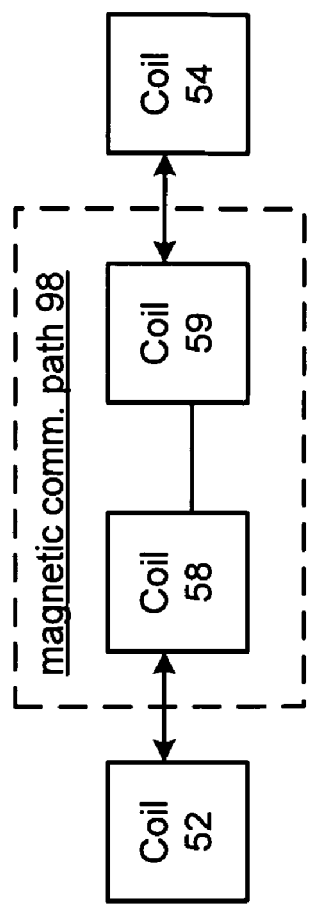
Figure 13:
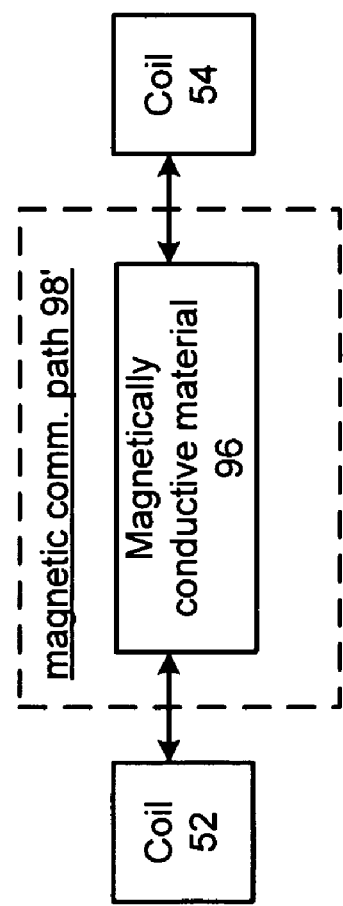
Figure 14:
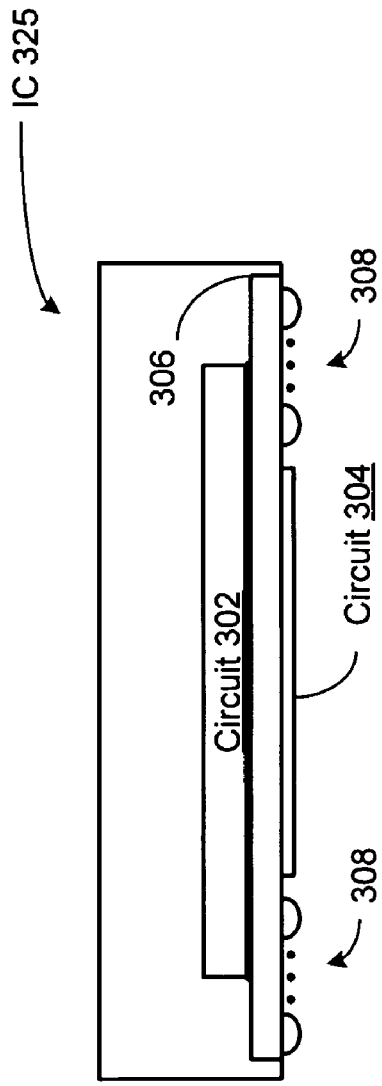
Figure 15:
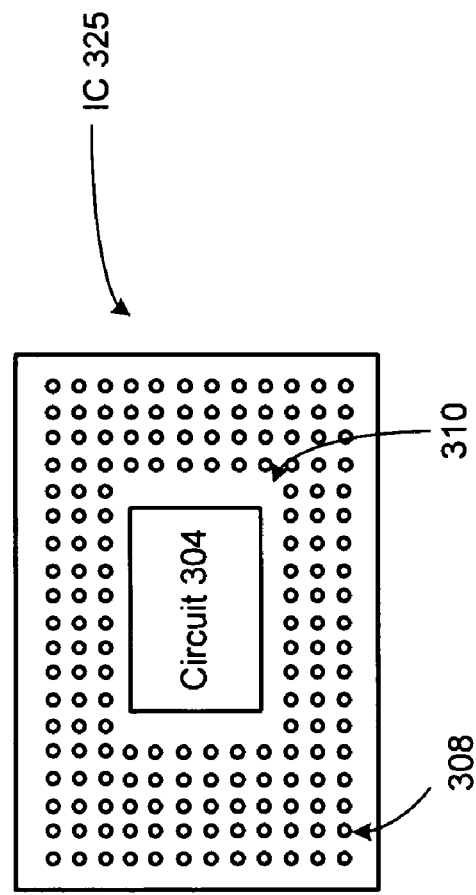
Figure 16:
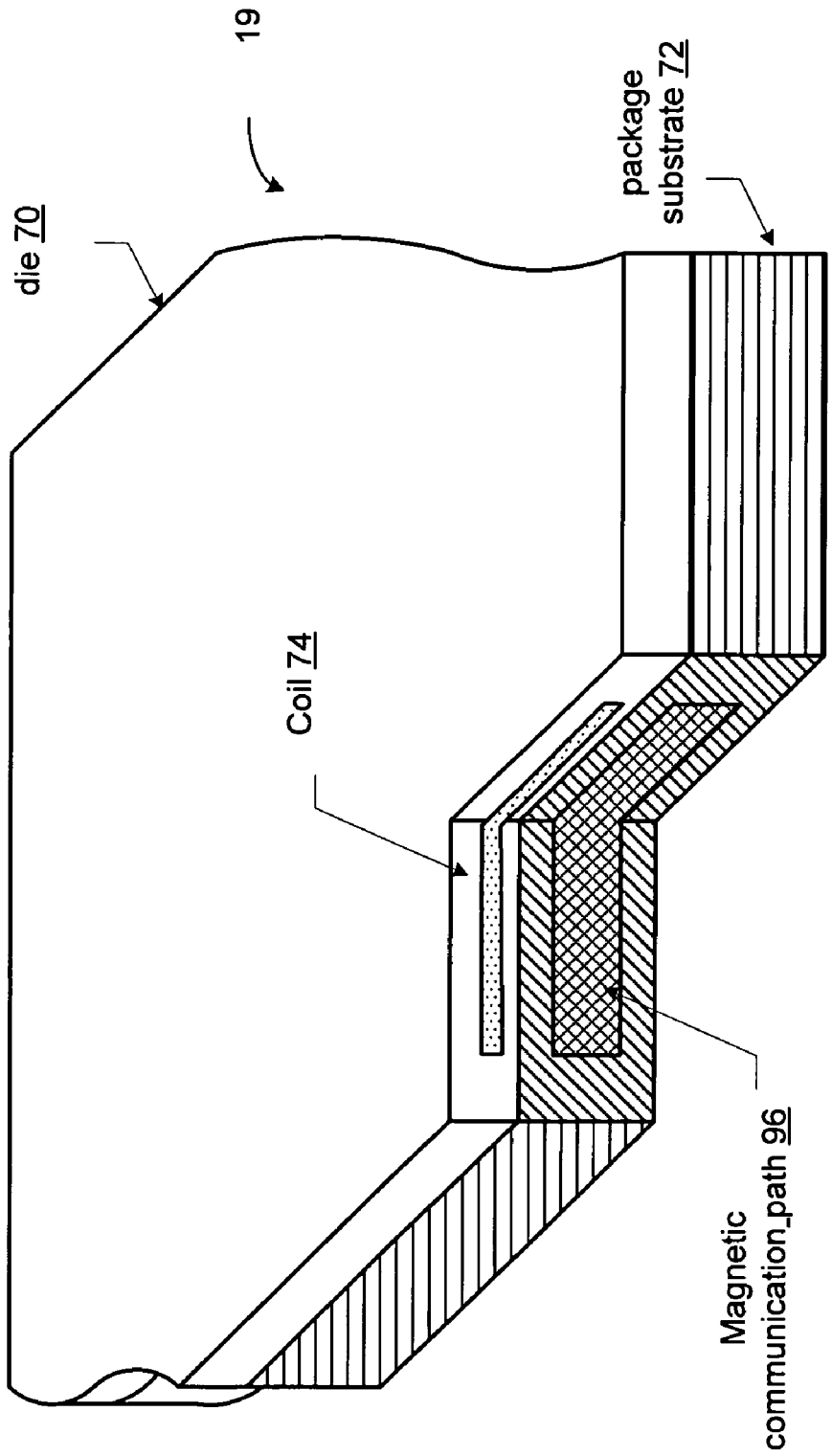
Figure 17:
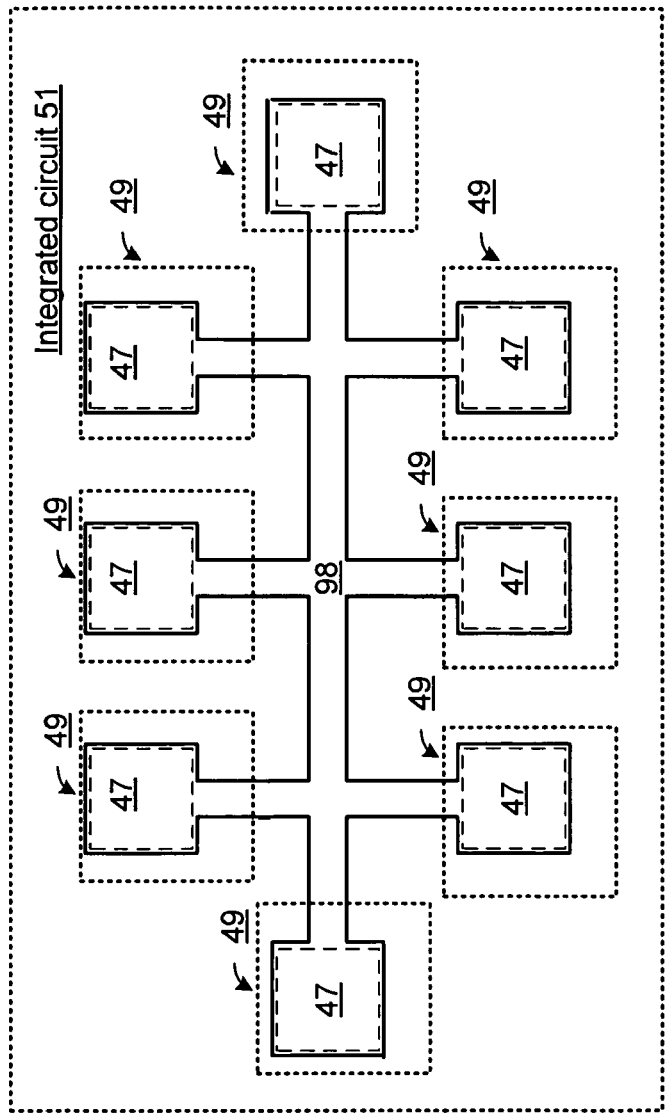
Figure 18:
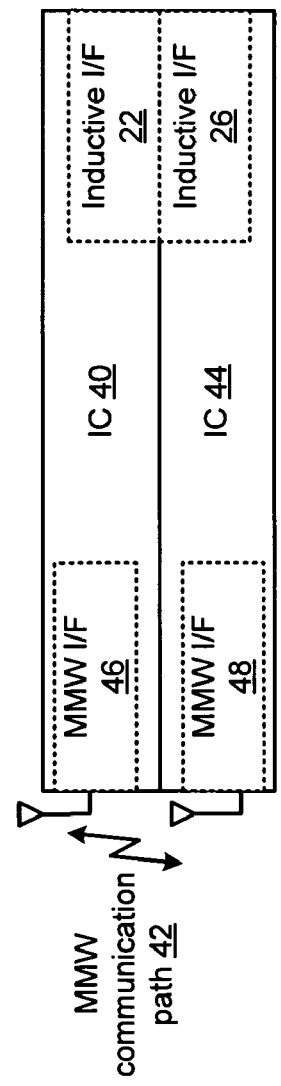
Figure 19:
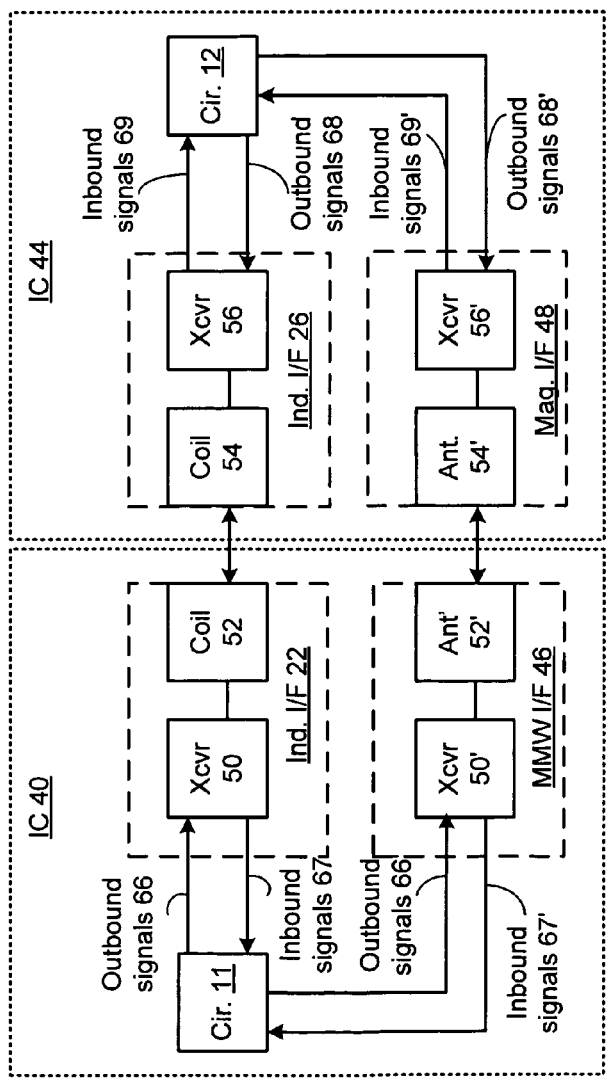
Figure 20:
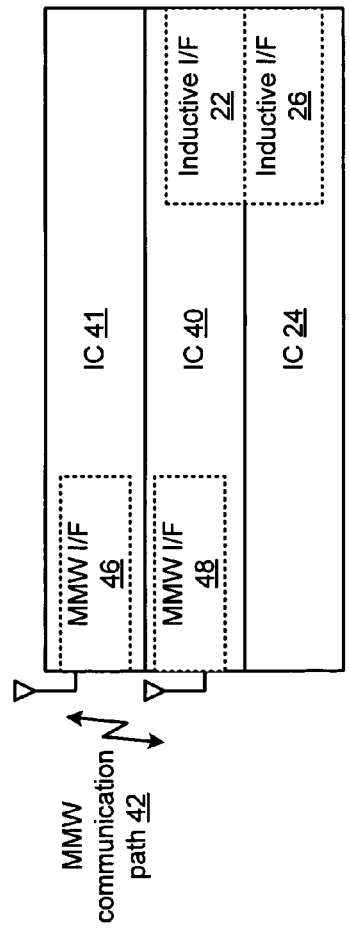
Figure 21:
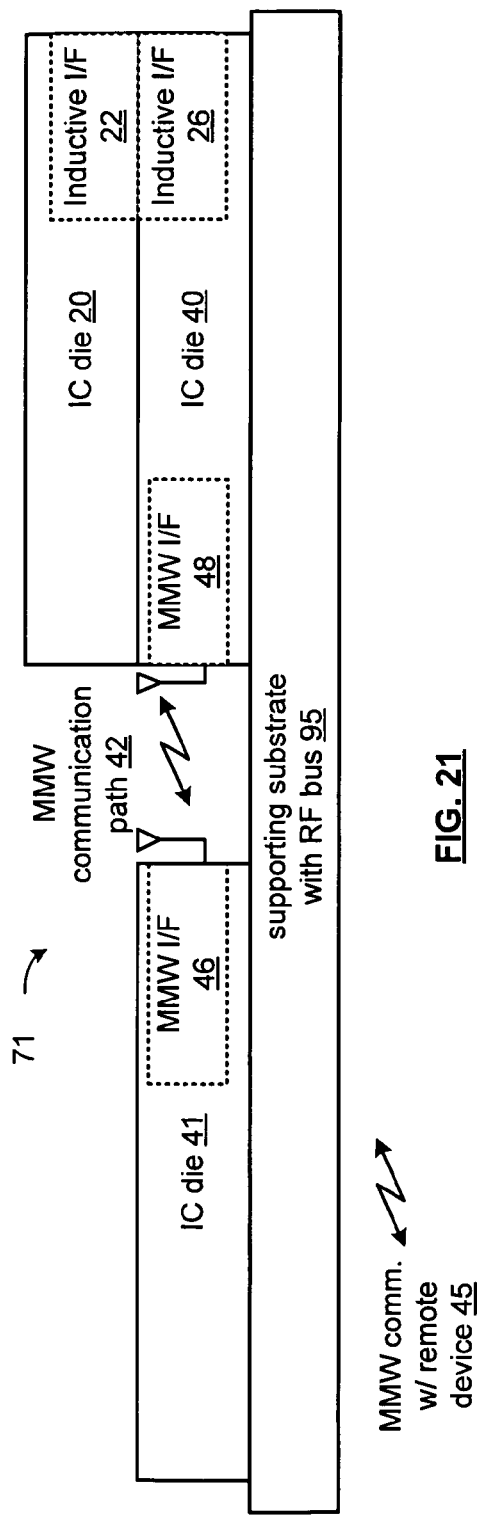
Figure 22:
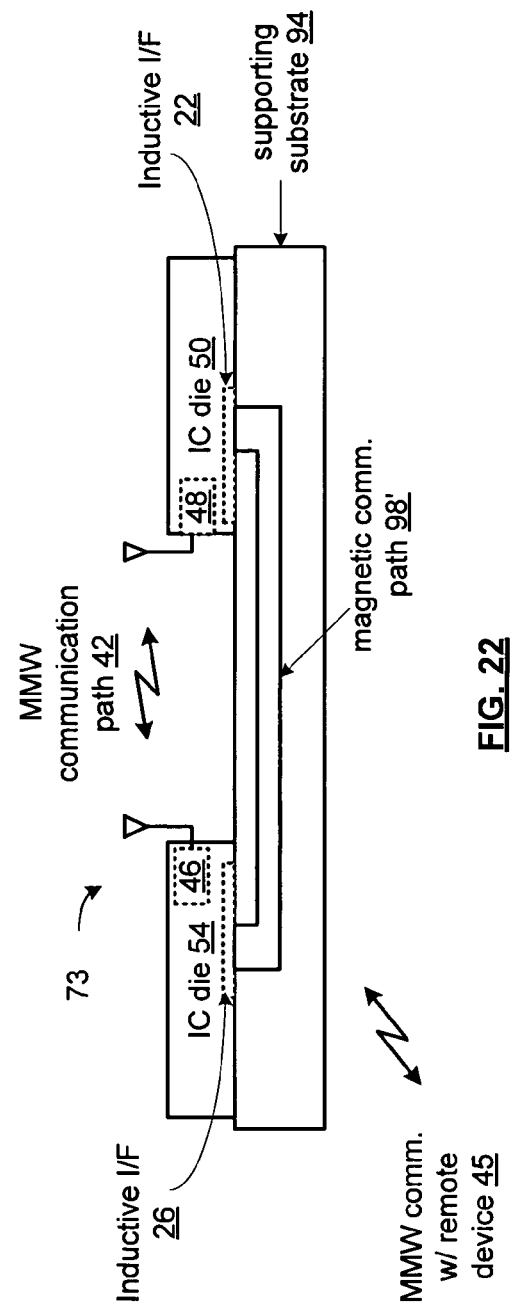
Figure 23:
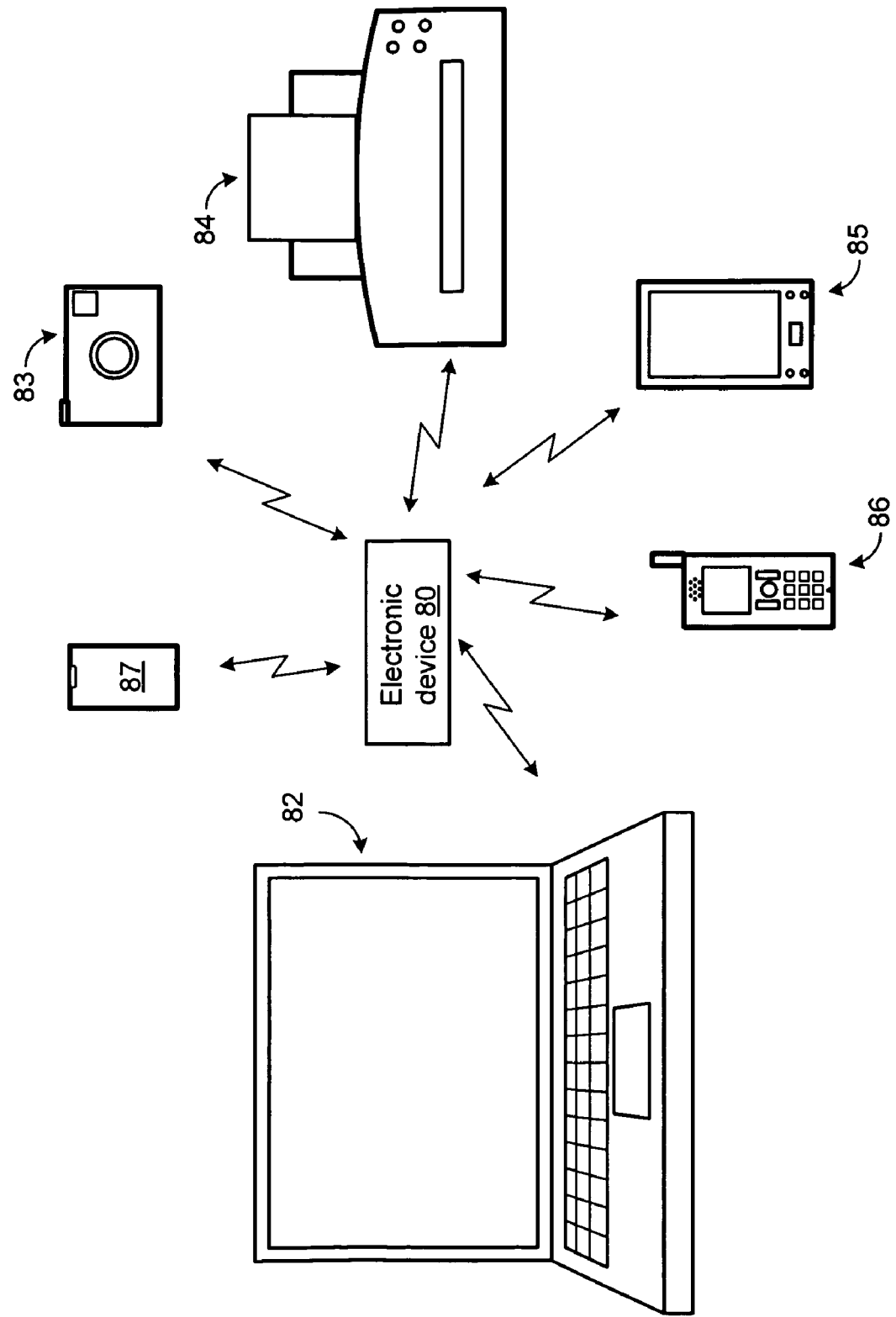
Figure 24:
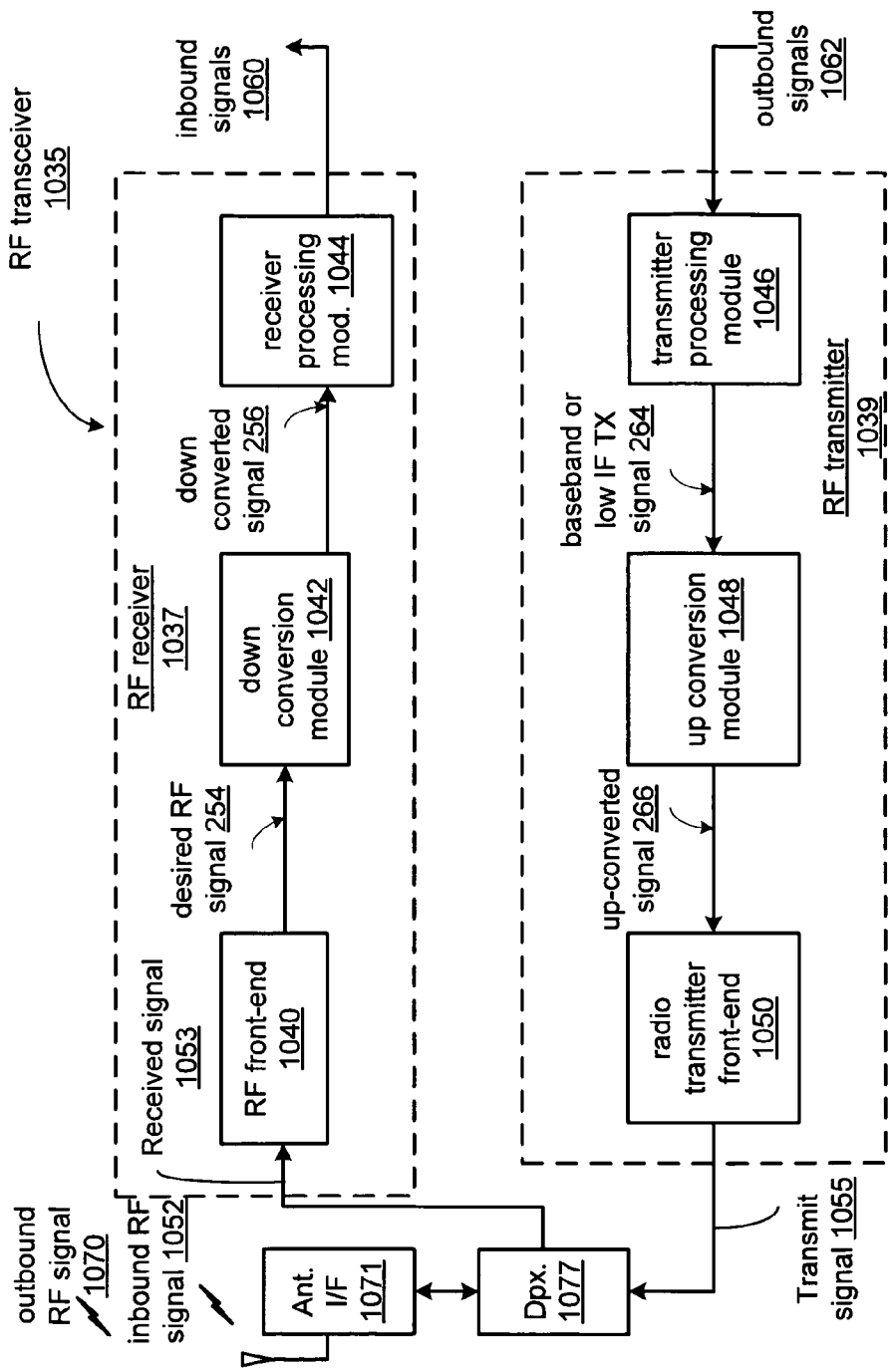
Figure 25:
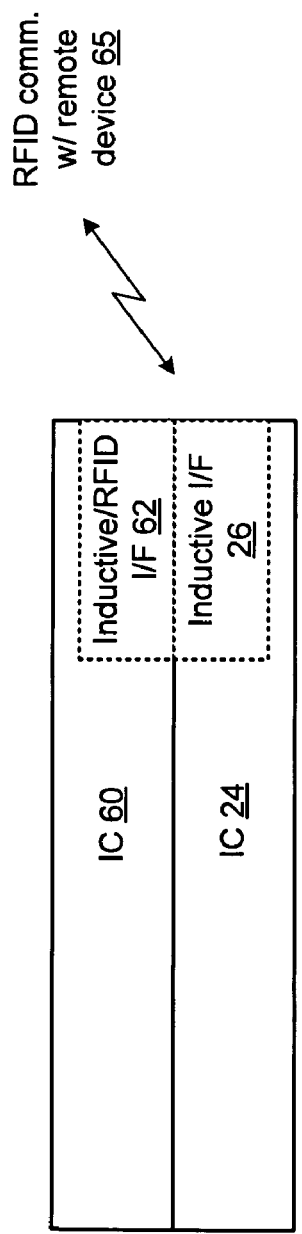
Figure 26:
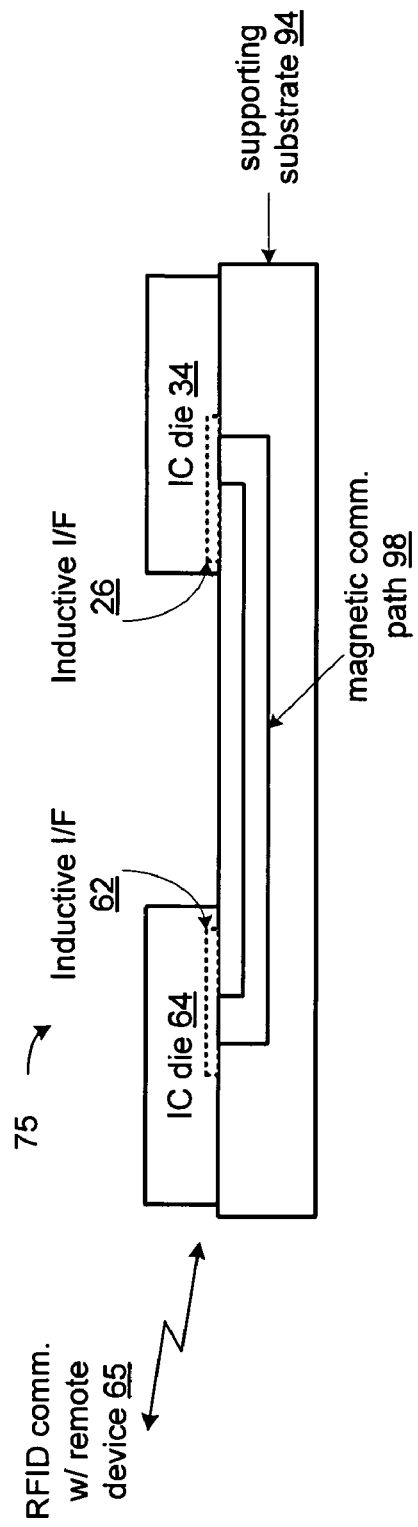
Figure 27:
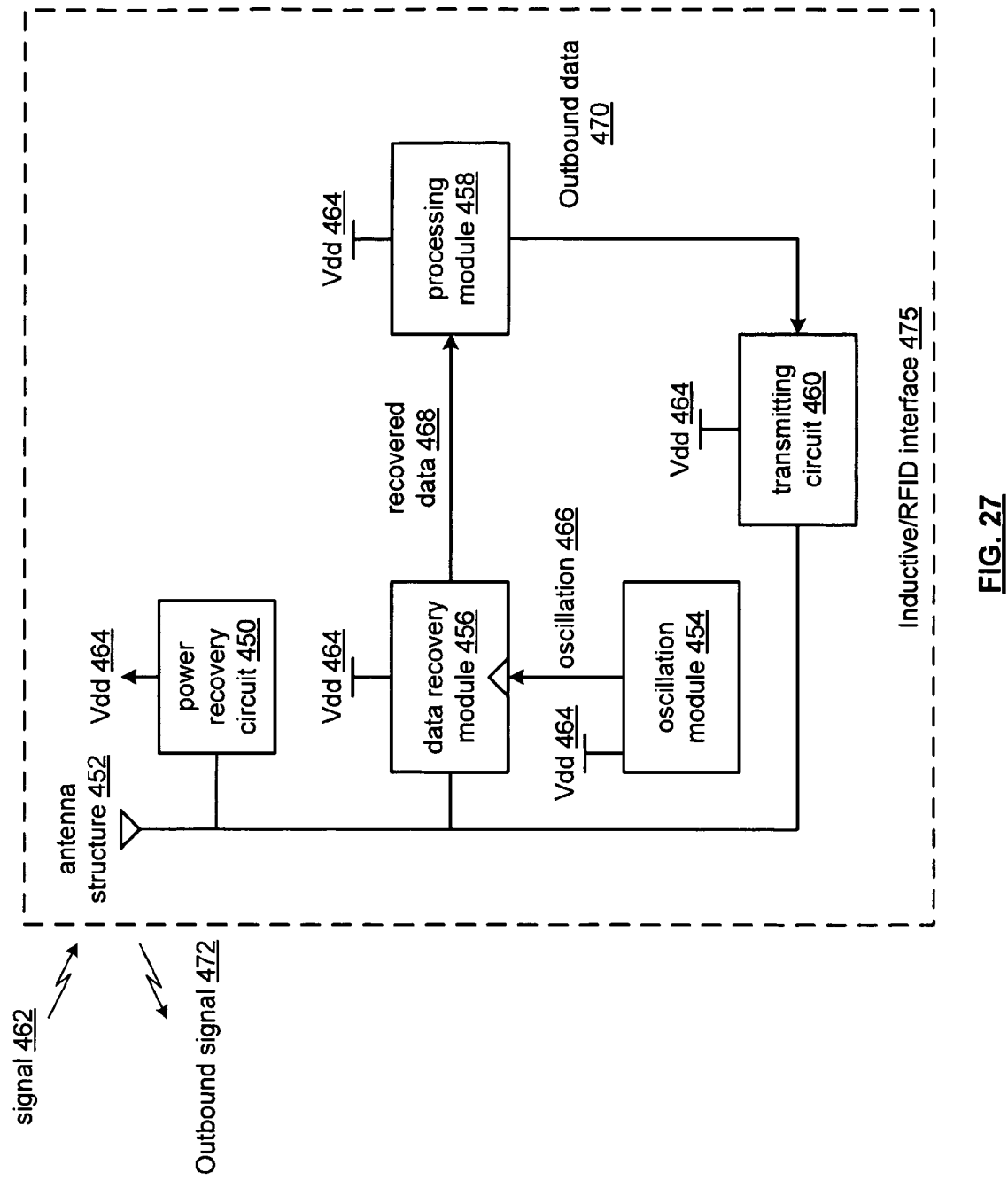
Figure 28:
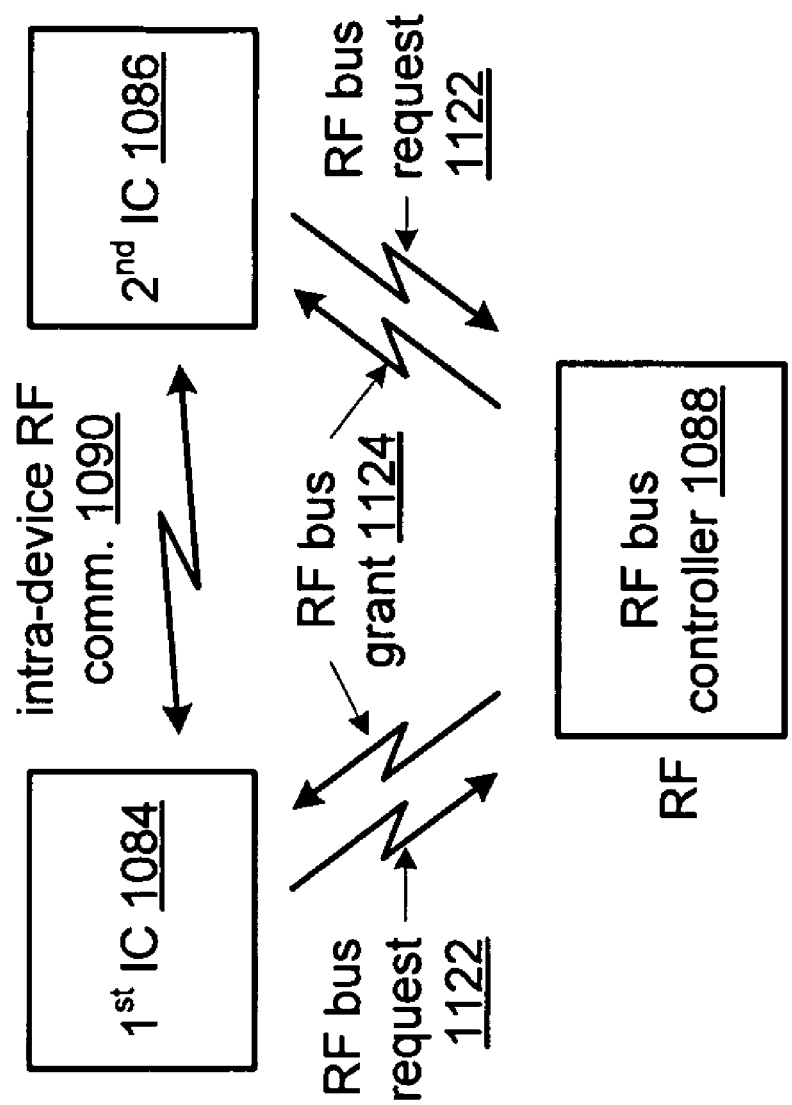
Figure 36:
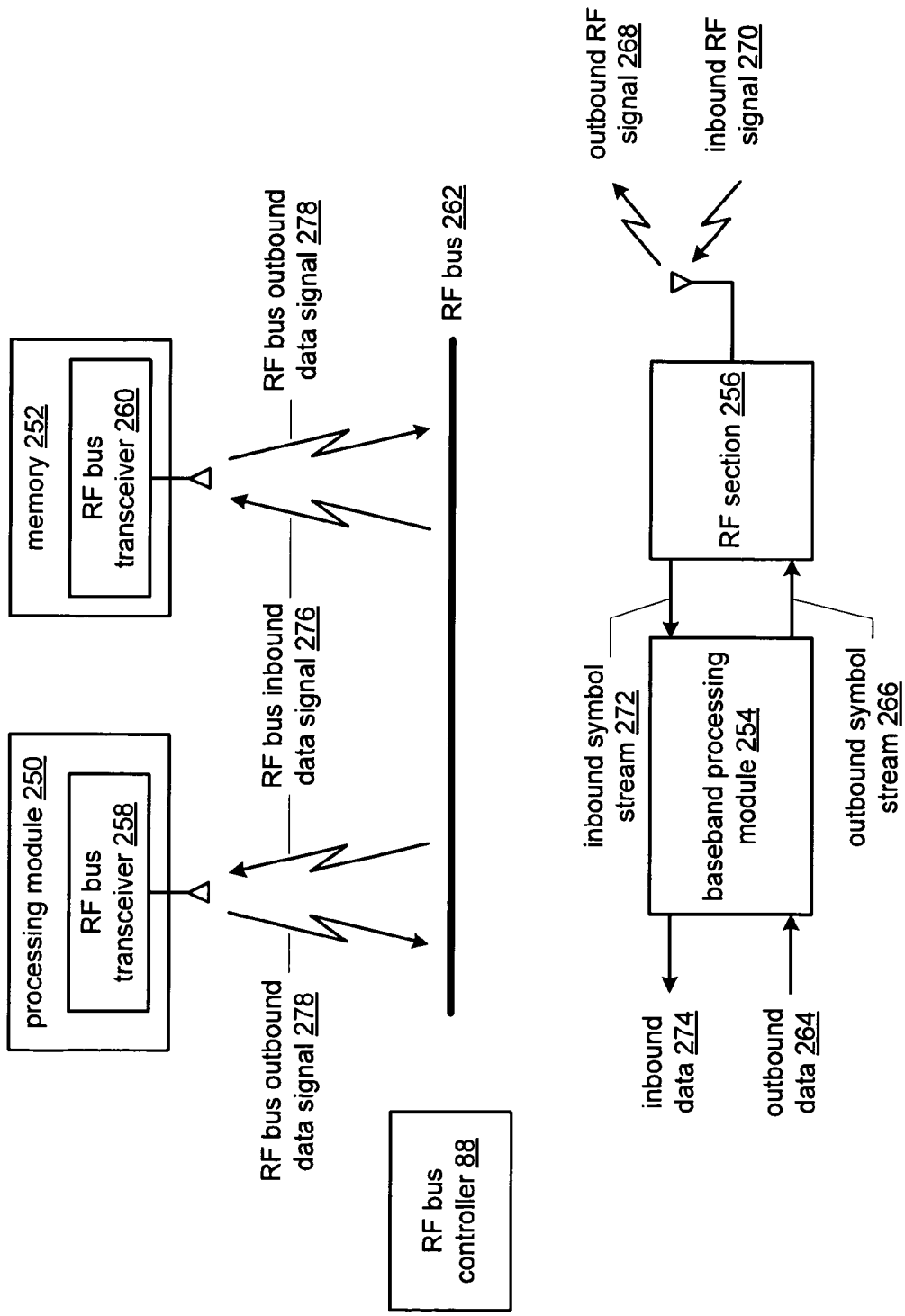
Figure 37:
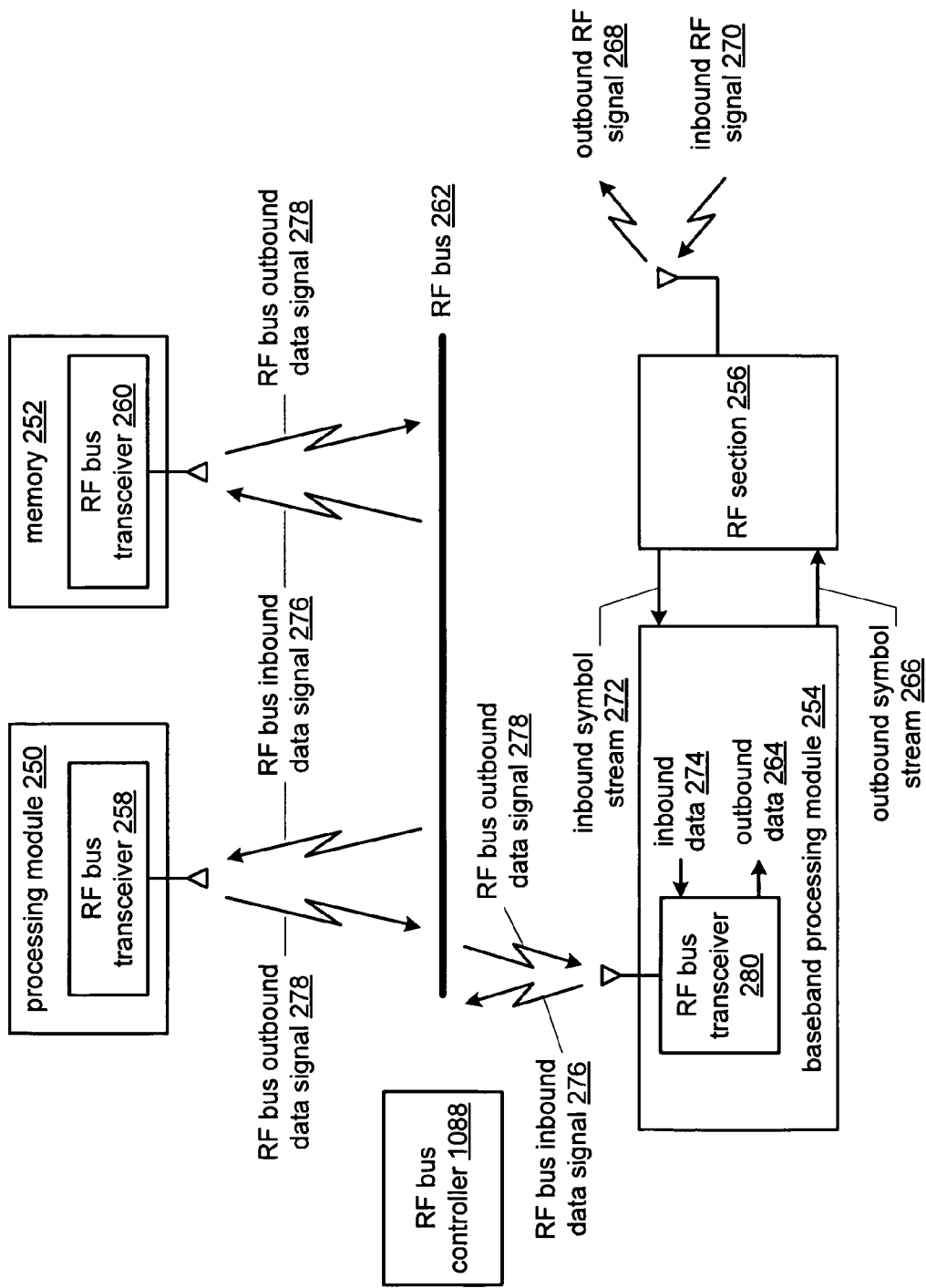
Figure 38:
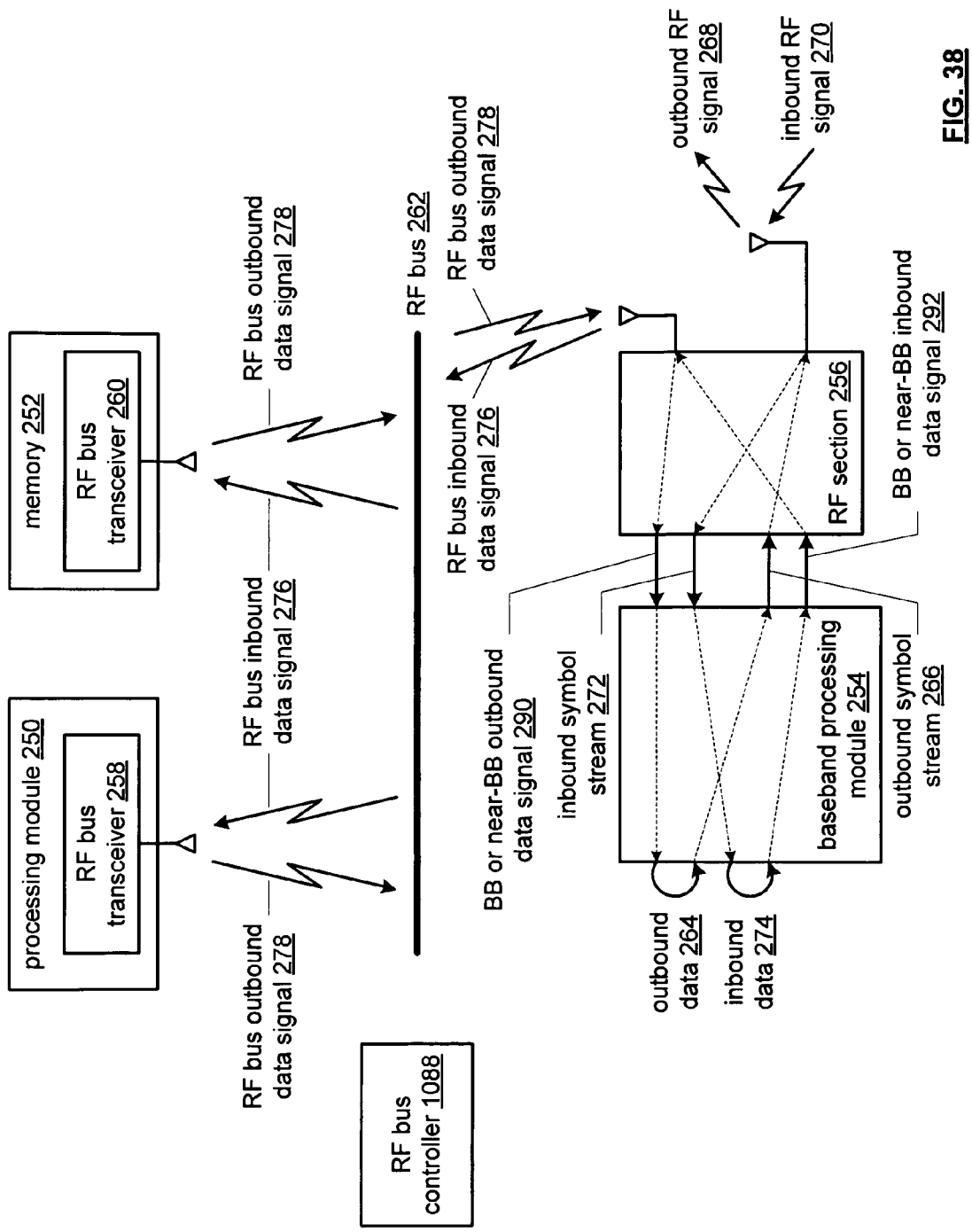
Figures 39, 40:
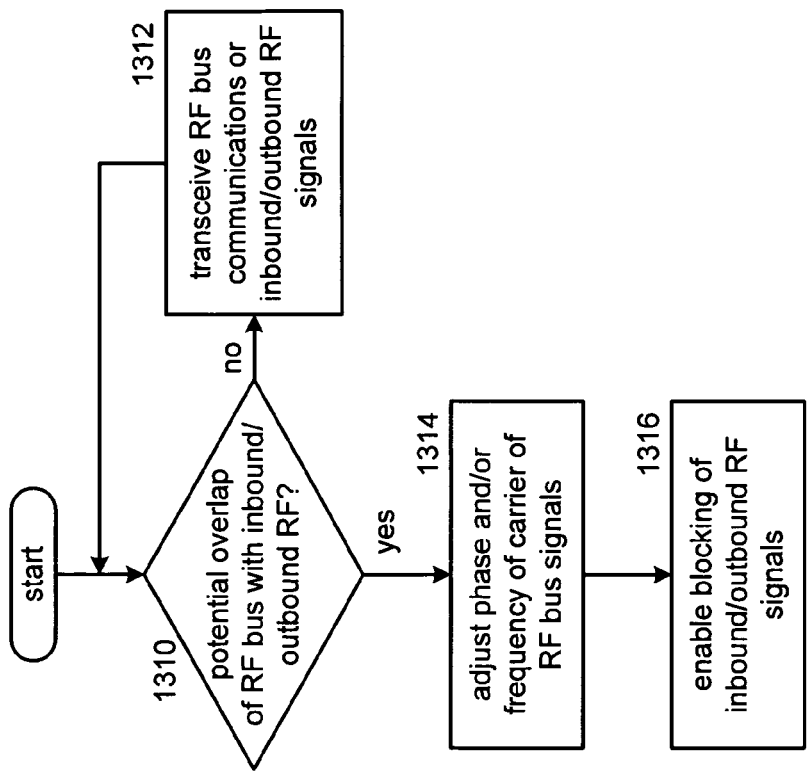
Figure 41:
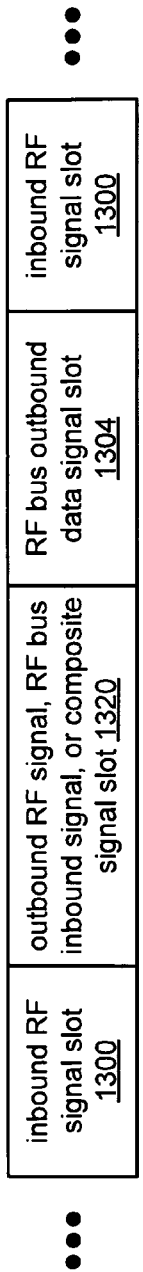
Figure 42:
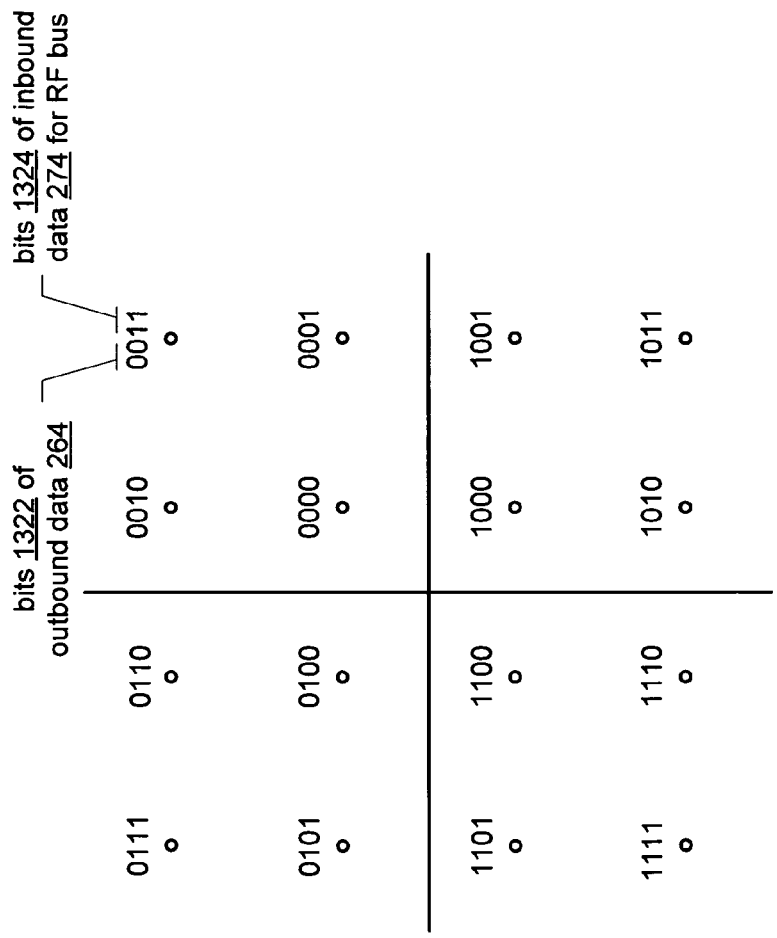
Figure 43:
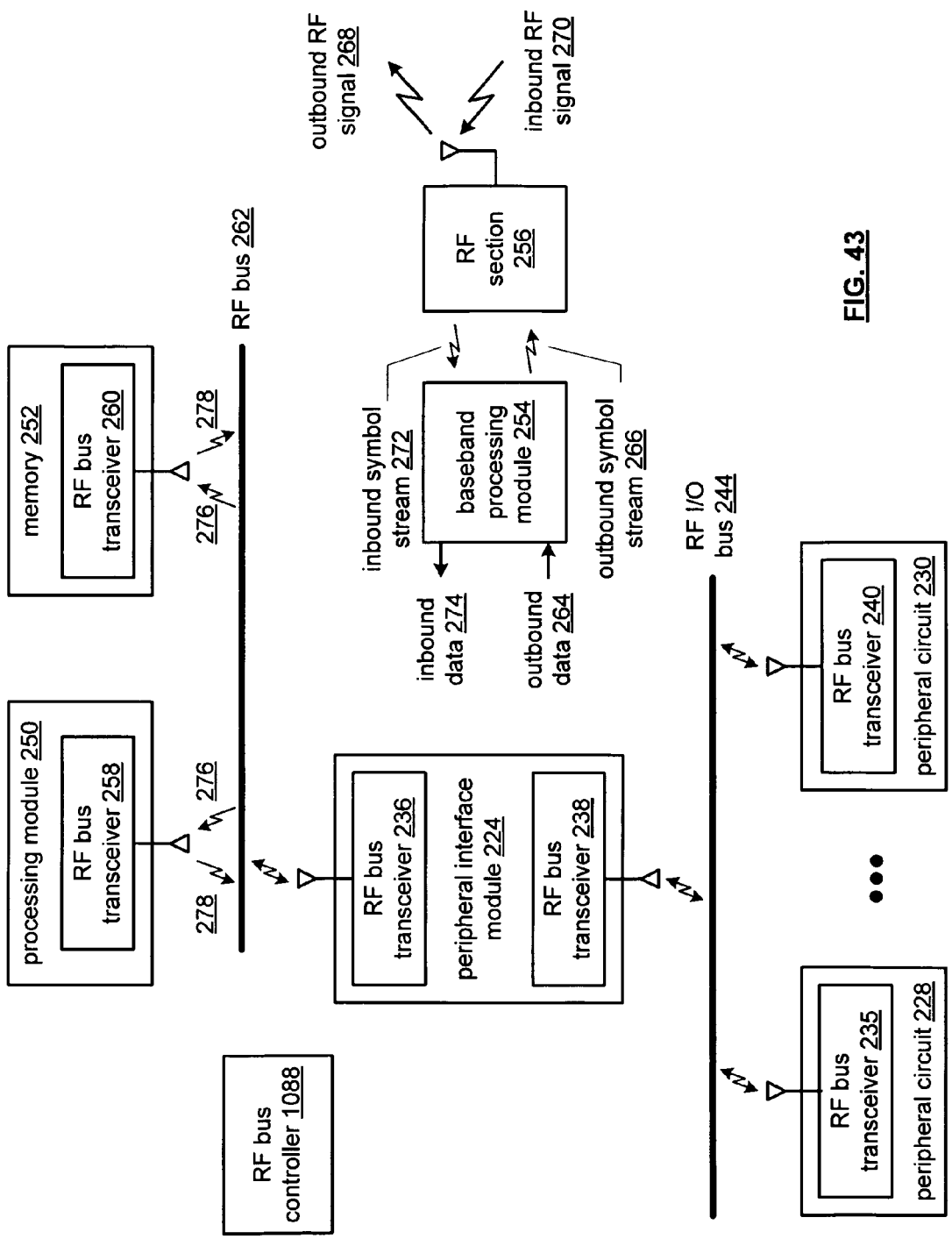
Figure 44:
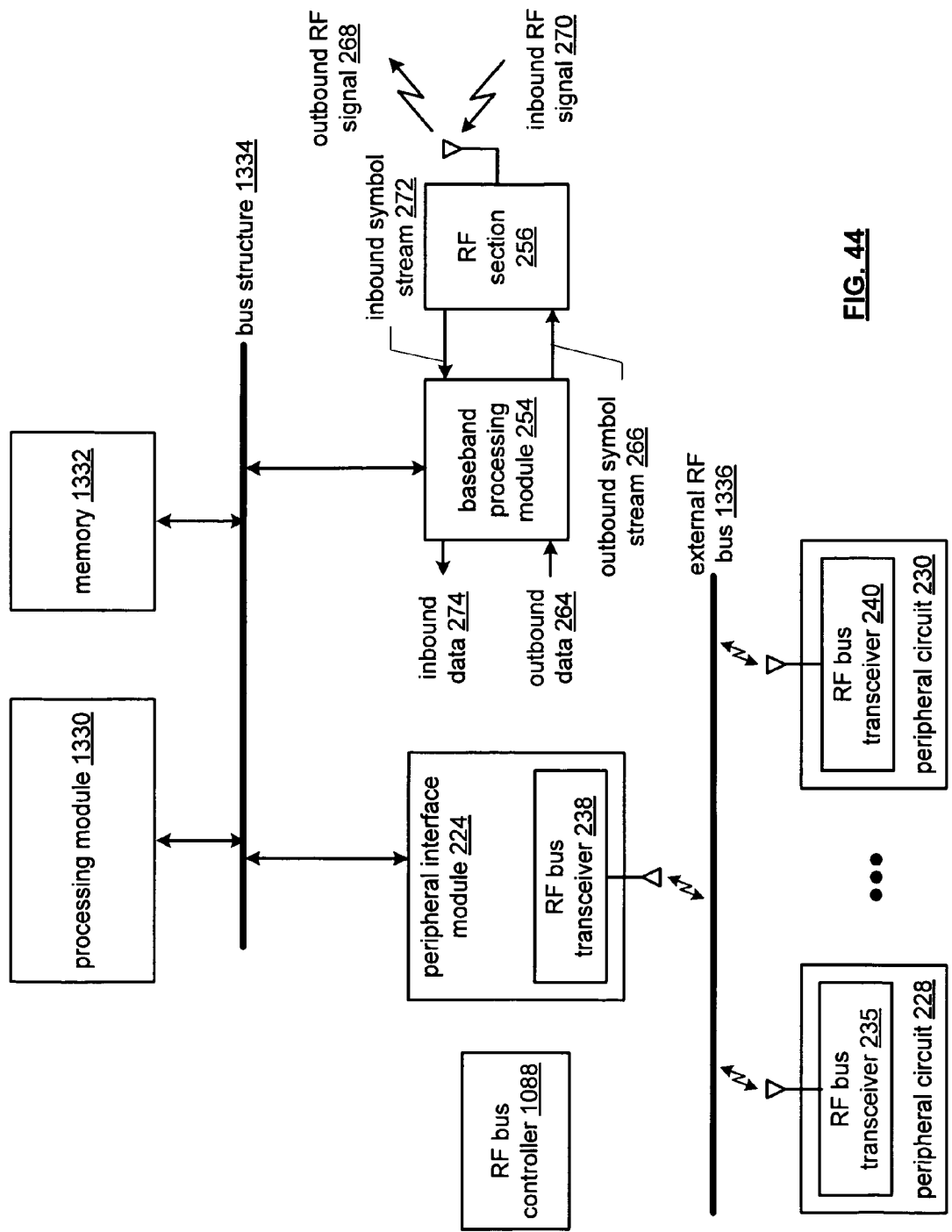
Figure 45:
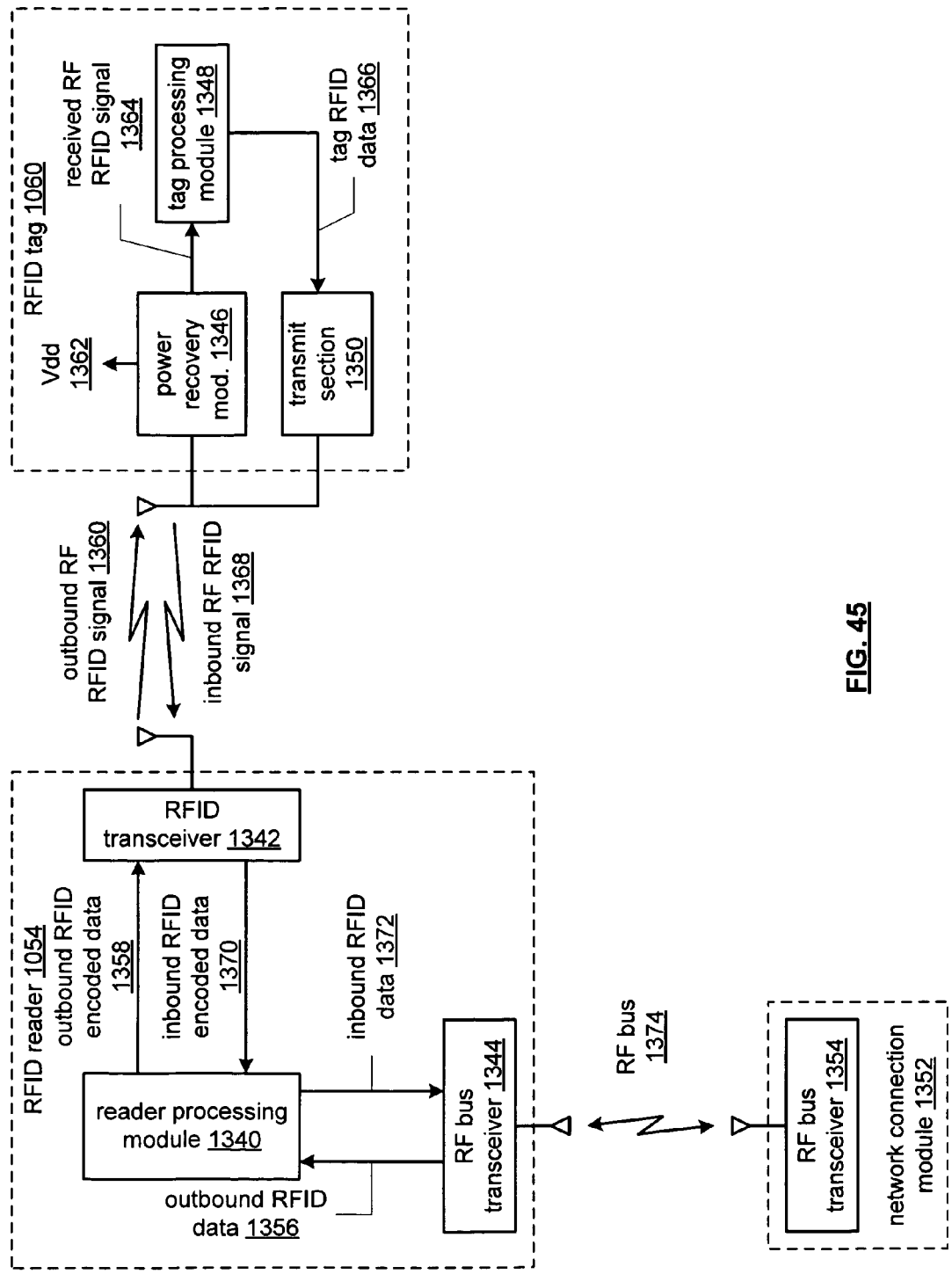
Figure 46:
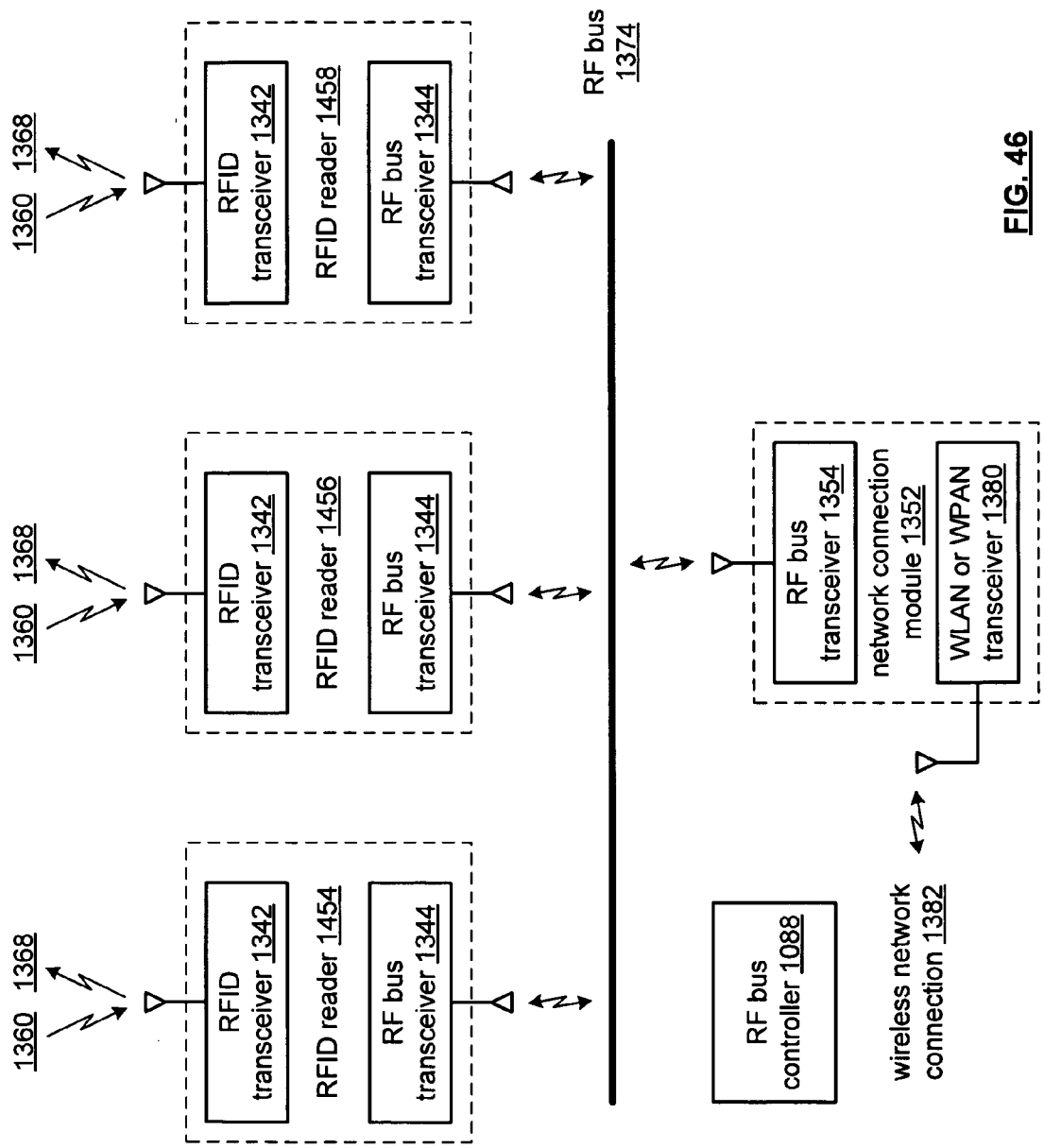
Figure 47:
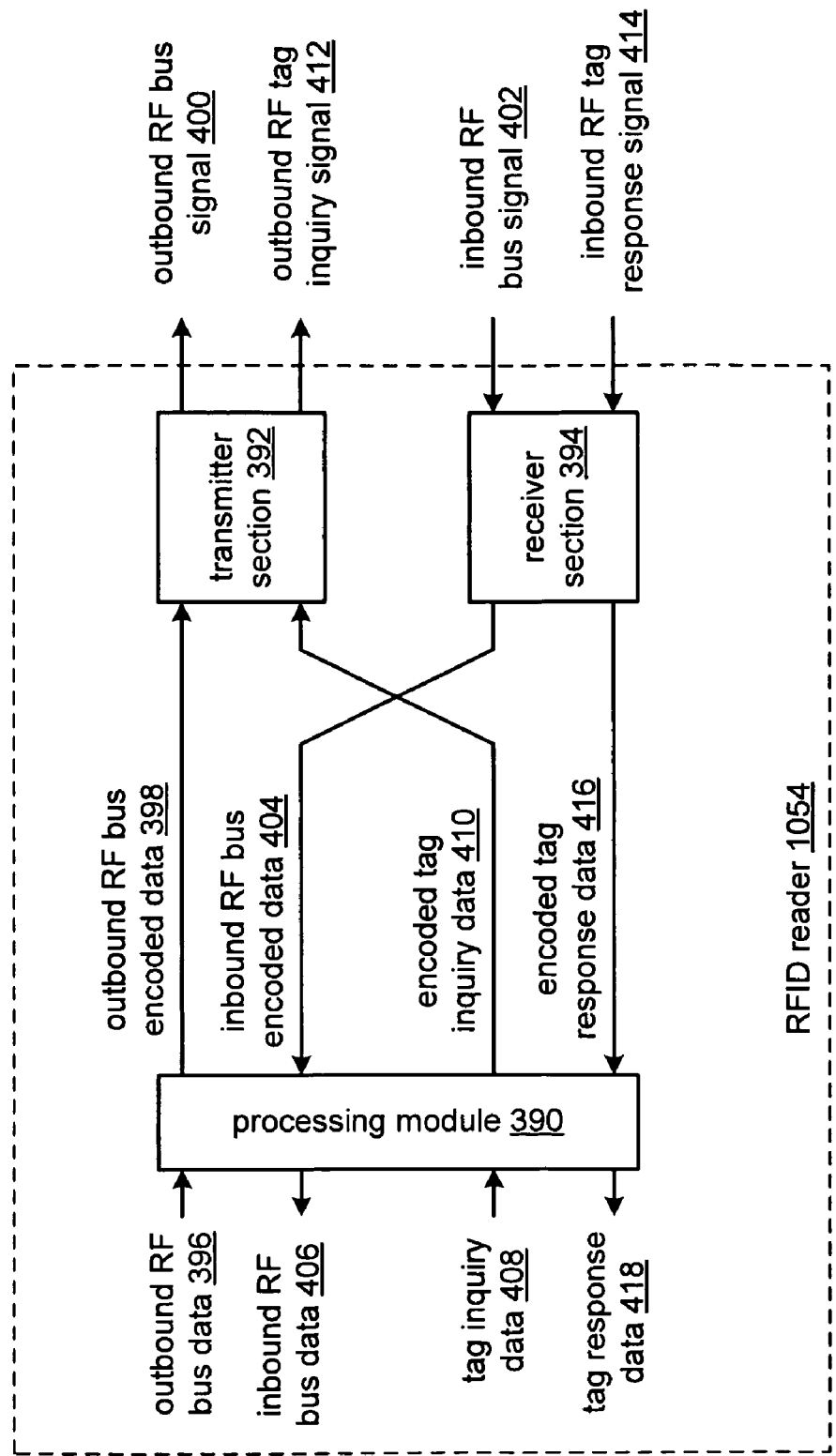
Figure 52:
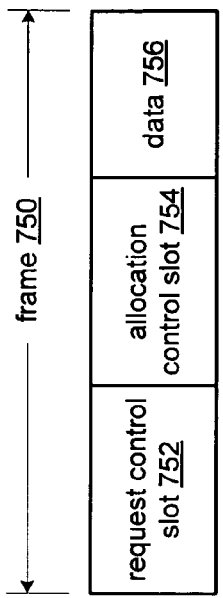
Figure 51:
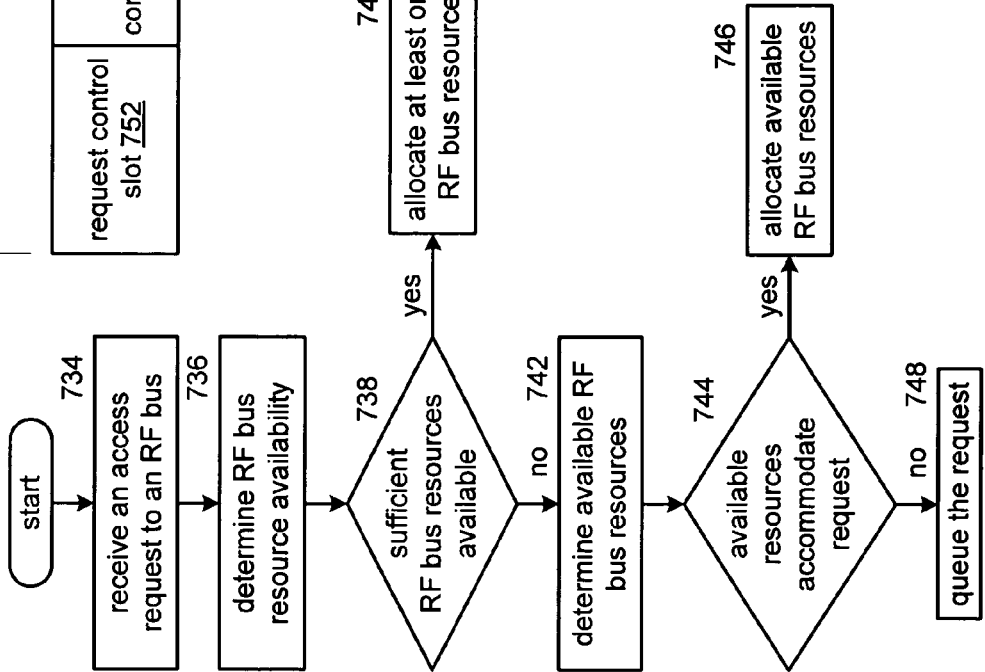
Figure 50:
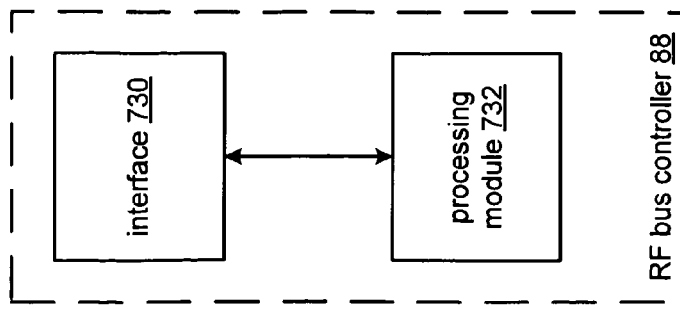
Figure 55:
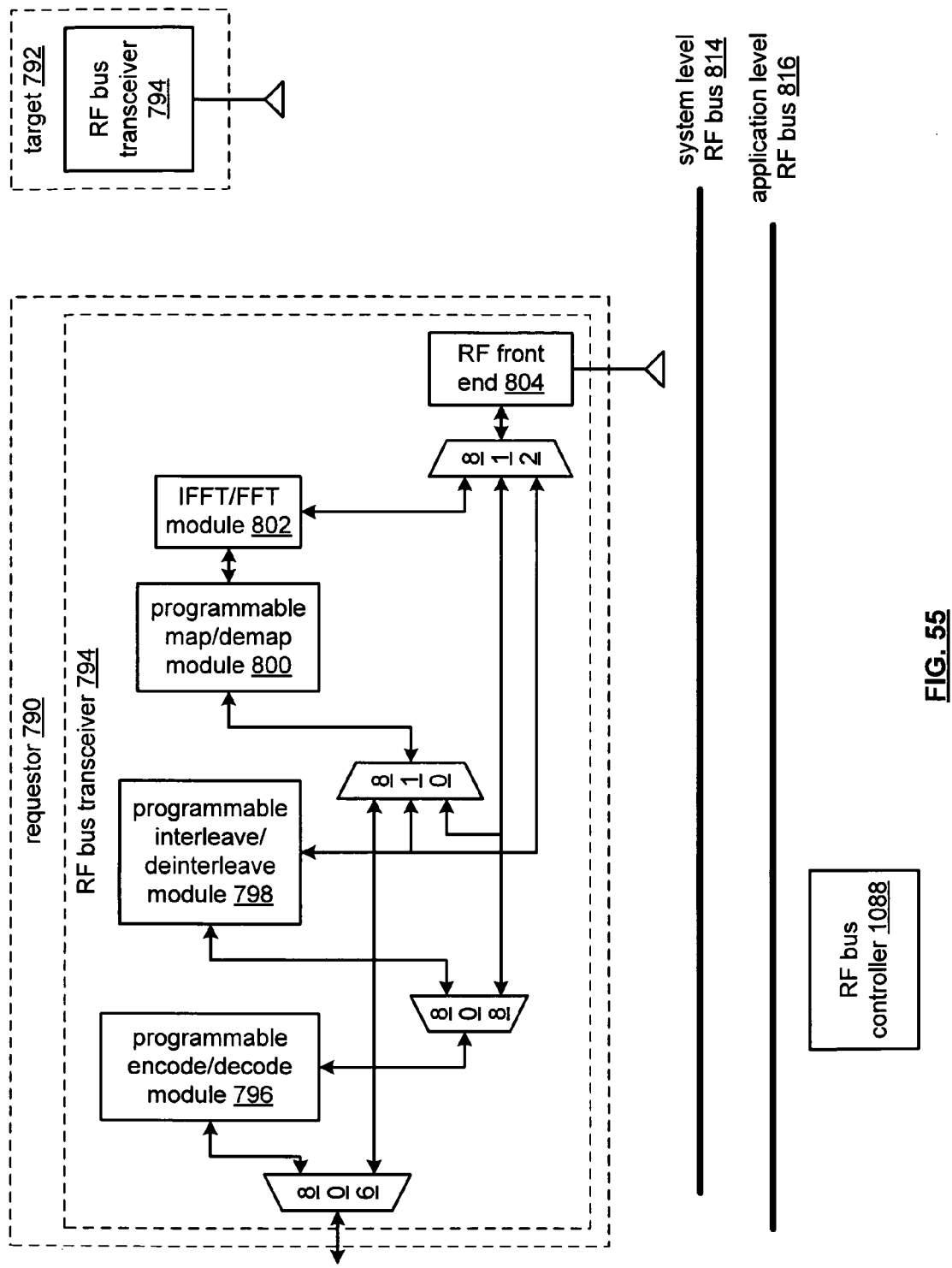
Figure 57:
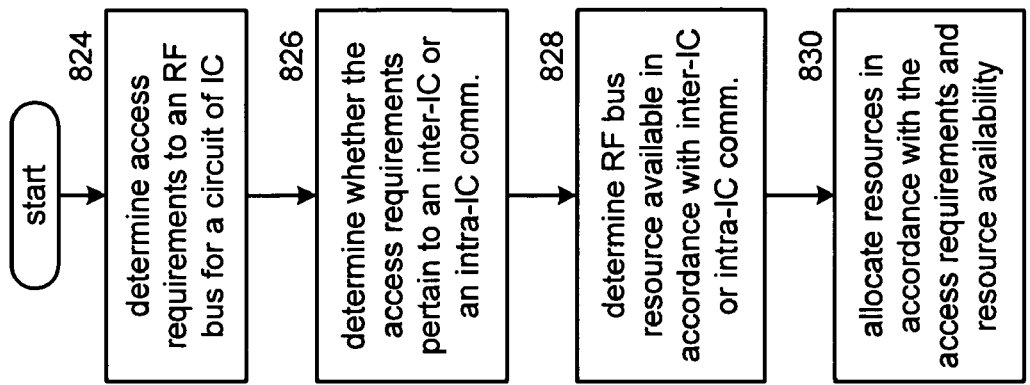
Figure 56:
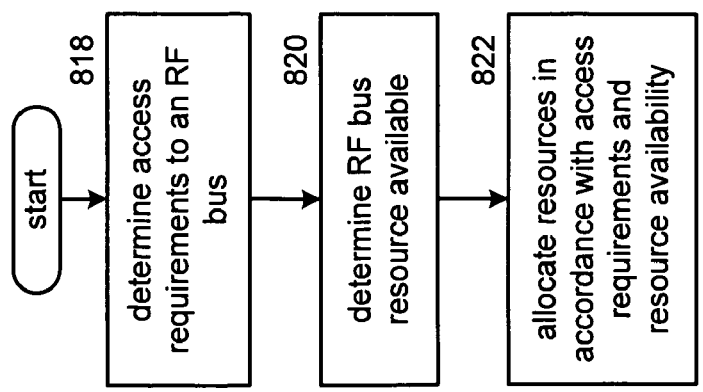
Figure 61:
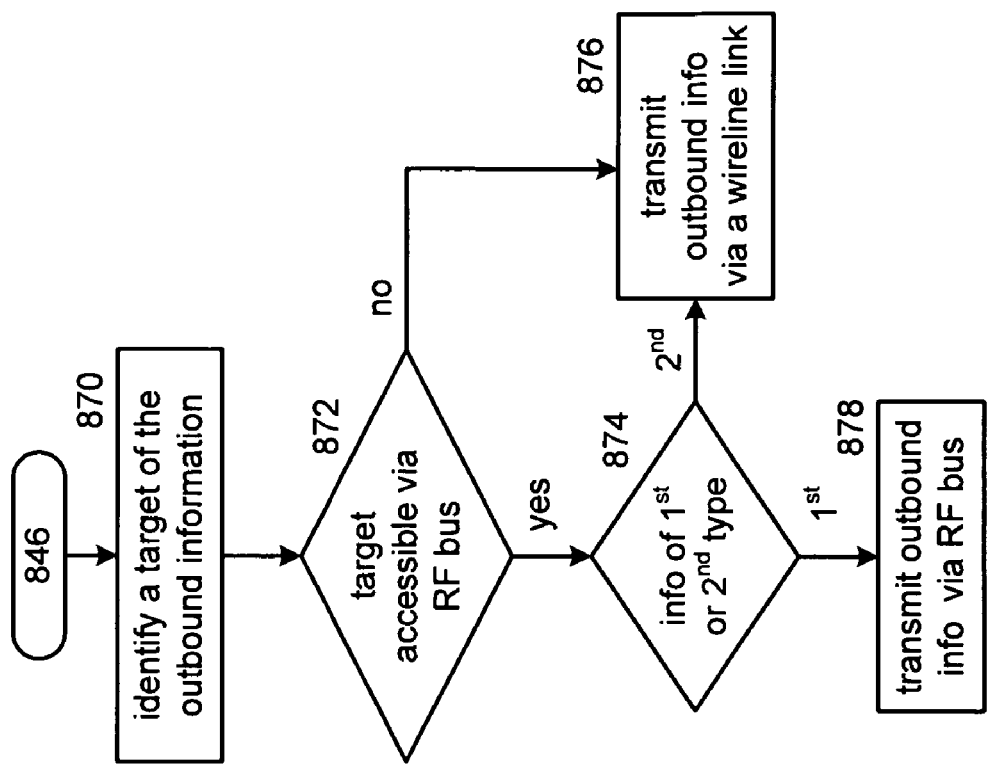
Figure 73:
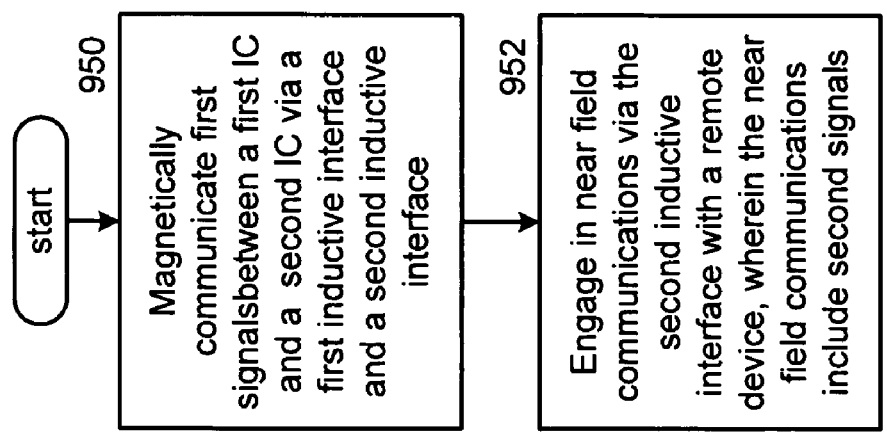
Figure 72:
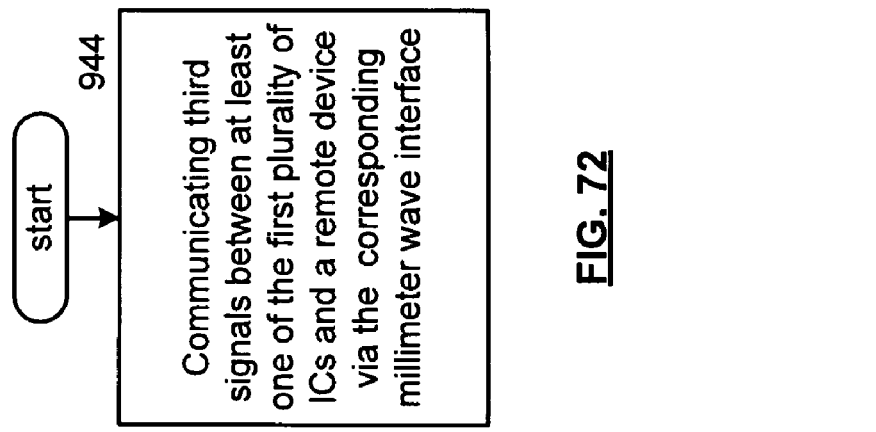
Figure 71:
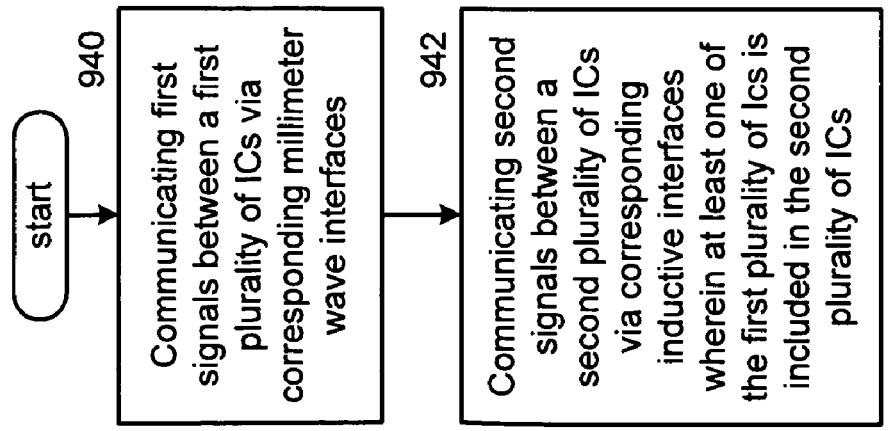
Figure 75:
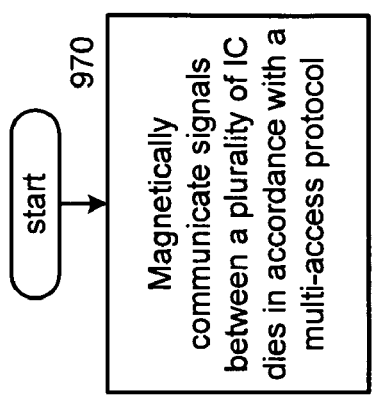
Figure 76:
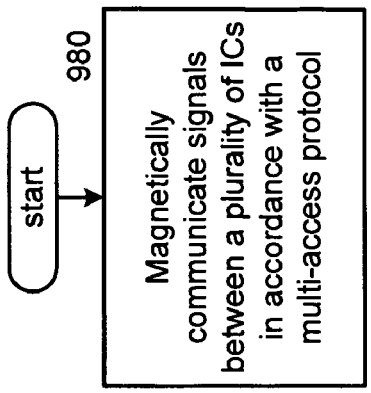
Figure 74:
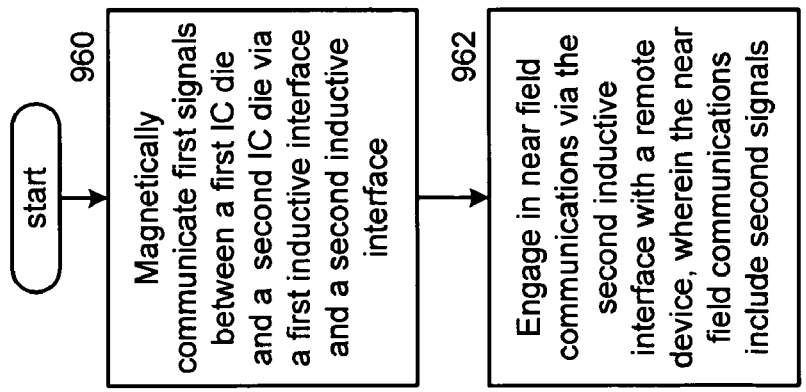

FIG. 4 presents a schematic block diagram representation of an integrated circuit 16 in accordance with an embodiment of the present invention;

FIG. 5 presents a schematic block diagram representation of an integrated circuit 17 in accordance with an embodiment of the present invention;

FIG. 6 present pictorial representations of a top view of on-chip coil 330 in accordance with an embodiment of the present invention;

FIG. 7 present pictorial representations of a side view of on-chip coil 330 in accordance with an embodiment of the present invention;

FIG. 8 present pictorial representations of a bottom view of on-chip coil 330 in accordance with an embodiment of the present invention;

FIG. 9 is a schematic block diagram of an embodiment of RF transceiver 135 in accordance with the present invention;

FIG. 10 presents a schematic block diagram representation of an integrated circuit 18 in accordance with an embodiment of the present invention;

FIG. 11 is a schematic block diagram of an embodiment of integrated circuit dies 30 and 34 in accordance with the present invention;

FIG. 12 is a schematic block diagram of magnetic communication path 98 in accordance with an embodiment the present invention;

FIG. 13 is a schematic block diagram of magnetic communication path 98' in accordance with another embodiment the present invention;

FIG. 14 is a pictorial representation of a side view of integrated circuit 325 in accordance with an embodiment the present invention;

FIG. 15 is a pictorial representation of a bottom view of integrated circuit 325 in accordance with an embodiment the present invention;

FIG. 16 is a pictorial representation of integrated circuit 19 in accordance with an embodiment the present invention;

FIG. 17 is a pictorial representation of integrated circuit 51 in accordance with an embodiment the present invention;

FIG. 18 is a schematic block diagram of an embodiment of integrated circuits 40 and 44 in accordance with the present invention;

FIG. 19 is another schematic block diagram of an embodiment of integrated circuits 40 and 44 in accordance with the present invention;

FIG. 20 is a schematic block diagram of an embodiment of integrated circuits 40, 41 and 43 in accordance with the present invention;

FIG. 21 is a pictorial representation of integrated circuit 71 in accordance with an embodiment the present invention;

FIG. 22 is a pictorial representation of integrated circuit 73 in accordance with an embodiment the present invention;

FIG. 23 is a pictorial and block diagram representation of electronic device 80 in accordance with an embodiment the present invention;

FIG. 24 is a schematic block diagram of an embodiment of RF transceiver 1035 in accordance with the present invention;

FIG. 25 is schematic block diagram of an embodiment of integrated circuits 60 and 24 in accordance with the present invention;

FIG. 26 is a pictorial representation of integrated circuit 75 in accordance with an embodiment the present invention;

FIG. 27 is a schematic block diagram of an embodiment of an RFID tag in accordance with the present invention;

FIGS. 28-29 are schematic block diagrams of other embodiments of a device in accordance with the present invention;

FIG. 30 is a diagram of an embodiment of a frame of an intra-device wireless communication in accordance with the present invention;

FIGS. 31-35 are schematic block diagrams of other embodiments of a device in accordance with the present invention;

FIGS. 36-38 are schematic block diagrams of embodiments of an RF transceiver device in accordance with the present invention;

FIG. 39 is a diagram of an example of a frame of an RF transceiver device wireless communication in accordance with the present invention;

FIG. 40 is a logic diagram of an embodiment of a method of resource allocation for an intra-device wireless communication in accordance with the present invention;

FIG. 41 is a diagram of another example of a frame of an RF transceiver device wireless communication in accordance with the present invention;

FIG. 42 is a diagram of an example of mapping data of an RF transceiver device wireless communication in accordance with the present invention;

FIGS. 43 and 44 are schematic block diagrams of other embodiments of an RF transceiver device in accordance with the present invention;

FIG. 45 is a schematic block diagram of another embodiment of an RFID system in accordance with the present invention;

FIG. 46 is a schematic block diagram of another embodiment of an RFID system in accordance with the present invention;

FIG. 47 is a schematic block diagram of an embodiment of an RFID reader in accordance with the present invention;

FIG. 48 is a schematic block diagram of another embodiment of a device in accordance with the present invention;

FIG. 49 is a logic diagram of a method for switching within a device accordance with the present invention;

FIG. 50 is a schematic block diagram of an embodiment of an RF bus controller in accordance with the present invention;

FIG. 51 is a logic diagram of method for controlling access to an RF bus in accordance with the present invention;

FIG. 52 is a diagram of another embodiment of a frame of an RF bus communication in accordance with the present invention;

FIG. 53 is a logic diagram of method for determining RF bus resource availability in accordance with the present invention;

FIG. 54 is a logic diagram of another method for controlling access to an RF bus in accordance with the present invention;

FIG. 55 is a schematic block diagram of another embodiment of a device in accordance with the present invention;

FIG. 56 is a logic diagram of another method for controlling access to an RF bus in accordance with the present invention;

FIG. 57 is a logic diagram of another method for controlling access to an RF bus in accordance with the present invention;

FIG. 58 is a schematic block diagram of an embodiment of an RF bus transceiver in accordance with the present invention;

FIG. 59 is a logic diagram of method for RF bus transmitting in accordance with the present invention;

FIG. 60 is a logic diagram of method for RF bus receiving in accordance with the present invention;

FIG. 61 is a logic diagram of method for determining whether information is to be transmitted via an RF bus in accordance with the present invention;

FIG. 62 is a flowchart representation of a method in accordance with an embodiment of the present invention;

FIG. 63 is a flowchart representation of a method in accordance with an embodiment of the present invention;

FIG. 64 is a flowchart representation of a method in accordance with an embodiment of the present invention;

FIG. 65 is a flowchart representation of a method in accordance with an embodiment of the present invention;

FIG. 66 is a flowchart representation of a method in accordance with an embodiment of the present invention;

FIG. 67 is a flowchart representation of a method in accordance with an embodiment of the present invention;

FIG. 68 is a flowchart representation of a method in accordance with an embodiment of the present invention;

FIG. 69 is a flowchart representation of a method in accordance with an embodiment of the present invention;

FIG. 70 is a flowchart representation of a method in accordance with an embodiment of the present invention;

FIG. 71 is a flowchart representation of a method in accordance with an embodiment of the present invention;

FIG. 72 is a flowchart representation of a method in accordance with an embodiment of the present invention;

FIG. 73 is a flowchart representation of a method in accordance with an embodiment of the present invention;

FIG. 74 is a flowchart representation of a method in accordance with an embodiment of the present invention;

FIG. 75 is a flowchart representation of a method in accordance with an embodiment of the present invention; and FIG. 76 is a flowchart representation of a method in accordance with an embodiment of the present invention;

DETAILED DESCRIPTION OF THE INVENTION

Figure 1:
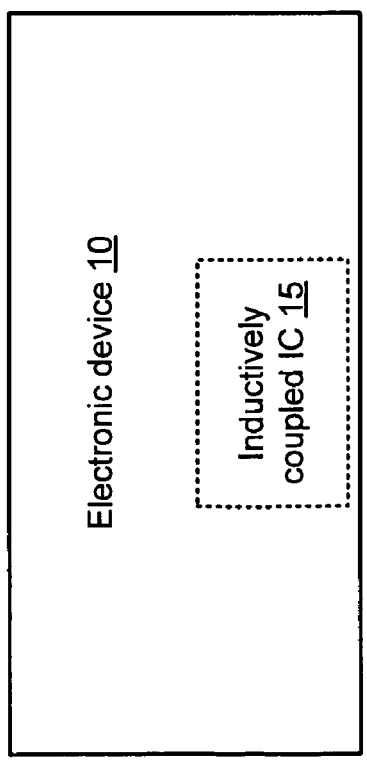
FIG. 1 is a schematic block diagram of an embodiment of an electronic device 10 in accordance with the present invention.

FIG. 1 is a schematic block diagram of an embodiment of an electronic device 10 in accordance with the present invention. In particular, an electronic device 10 is presented that includes inductively coupled integrated circuit (IC) 15. Electronic device 10 can be a mobile telephone, wireless local area network device, cable modem, Bluetooth compatible device, or other communication device, a personal computer, server, printer, router or other computer, computer peripheral or computer networking device, a television, set-top box, game console, game, personal audio player or other consumer electronic device or any other type of electronic device.

In accordance with the present invention the inductively coupled IC 15 includes one or more coils or other inductive elements that are used to couple integrated circuit dies within the integrated circuit package and/or to couple the inductively coupled IC 15 to other inductively coupled ICs that are positioned in proximal location to each other. These coils operate as a transformer to generate electrical signals that are based on the magnetic flux generated by the other coil or coils. In this fashion, signaling between integrated circuits and/or integrated circuit dies can be accomplished inductively via magnetic field variations. The use of inductive coupling reduces or eliminates the need for direct electrical connections such as bonding wires, pins or pads and associated drivers and buffers and/or can substantially reduce the power consumption of the inductively coupled IC 15.

Figure 2:
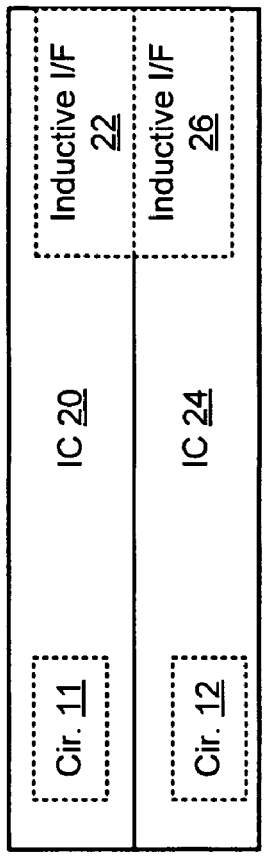
FIG. 2 is a schematic block diagram of an embodiment of integrated circuits 20 and 24 in accordance with the present invention.

Various functions and features of inductively coupled IC 15 are described in conjunction with FIGS. 2-76.

FIG. 2 is a schematic block diagram of an embodiment of integrated circuits 20 and 24 in accordance with the present invention. In particular, integrated circuits 20 and 24 are each examples of inductively coupled IC 15. IC 20 includes a circuit 11 and IC 24 includes a circuit 12 that perform functions relating to the operation of an electronic device, such as electronic device 10. IC 20 includes inductive interface 22 and IC 24 includes inductive interface 26. The inductive interfaces 22 and 26 are aligned to magnetically communicate signals between the circuit 11 and the circuit 12. These signals can be digital signals, analog signals and or discrete time signals that contain data, clock signals, operational instructions, control information or other signaling that are communicated between the circuits 11 and 12 to, for instance, effectuate the interaction between these two devices, either unidirectionally or bidirectionally. In the embodiment shown, the ICs 20 and 24 are stacked in such a fashion as to align the inductive interfaces 22 and 26.

The ICs 20 and 24 can be bonded together to stabilize the alignment between the inductive interfaces 22 and 26 and to otherwise provide mechanical stability. In an embodiment of the present invention, a ferromagnetic glue is used in this bonding process to facilitate the transmission of magnetic flux between the inductive interfaces 22 and 26. Such a ferromagnetic glue can include a ferromagnetic material that is itself adhesive or bound together with an adhesive substance to form a glue that, once it is set and binds the ICS 20 and 24, conducts magnetic flux between the inductive interfaces 22 and 26.

Figure 3:
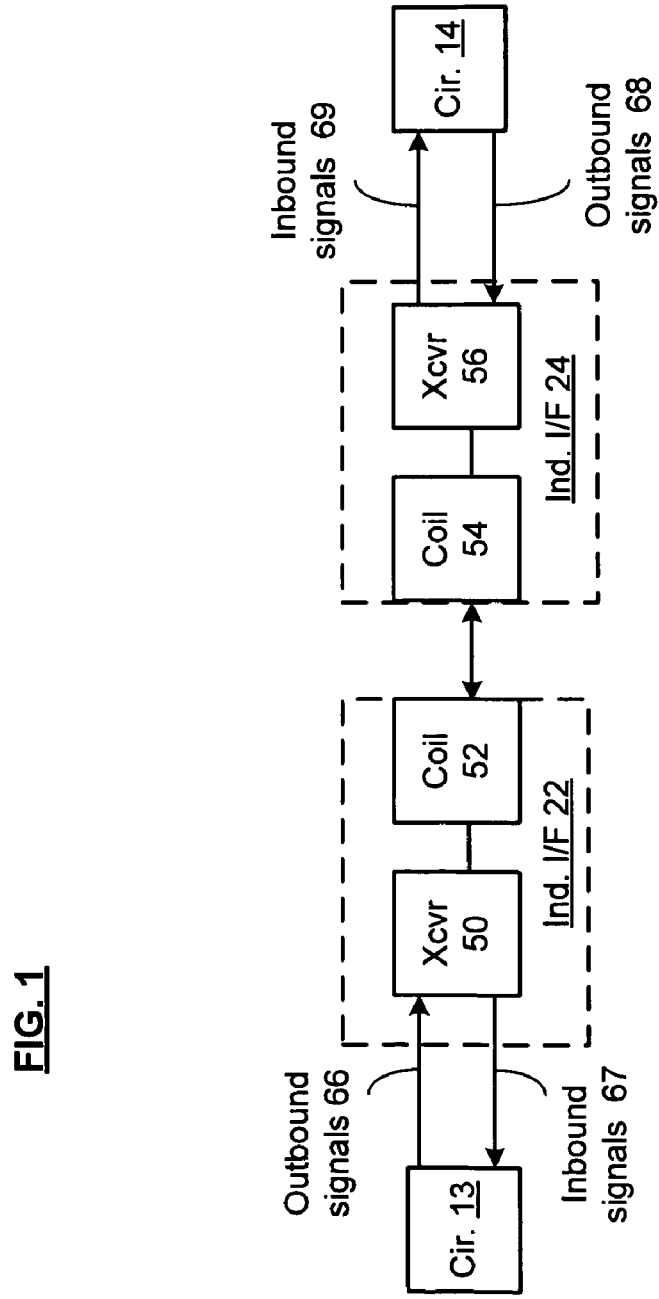
FIG. 3 is a schematic block diagram of an embodiment of inductive interfaces 22 and 26 in accordance with the present invention.

FIG. 3 is a schematic block diagram of an embodiment of inductive interfaces 22 and 26 in accordance with the present invention. While FIG. 2 presents an example where inductive interfaces are implemented in integrated circuits 20 and 24. As will be discussed in conjunction with FIG. 5, the inductive interfaces can each be implemented in a integrated circuit die, in or on a supporting substrate or partially in an integrated circuit die and partially on a substrate.

As shown, inductive interface 22 includes a coil 52 and transceiver 50 and inductive interface 26 includes coil 54 and transceiver 56. Coils 52 and 54 are aligned to magnetically communicate signals between the circuit 13 and the circuit 14. In particular, these coils can include a number of turns such as 1-5 turns or more of metal that are implemented on one or more metal layers of a corresponding IC die, of a supporting substrate or the IC die and substrate. In an embodiment of the present invention, the coils are similarly sized or sized with substantially the same dimensions to facilitate their alignment and to facilitate the inductive coupling between the two coils. In particular, these coils can be implemented in their corresponding IC die and/or substrate so that these coils can be axially and/or planarly aligned.

In operation, outbound signals 66 from circuit 13, such as circuit 11, are converted to radio frequency signals or other signals via transceiver 50 that excite the coil 52 to generate magnetic flux that is recovered by coil 54 and converted to inbound signals 69 to circuit 14, such as circuit 12. Similarly, outbound signals 68 from circuit 14 are converted to radio frequency signals or other signals via transceiver 56 that excite the coil 54 to generate magnetic flux that is recovered by coil 52 and converted to inbound signals 67 to circuit 13.

In an embodiment of the present invention the transceivers 50 and 56 excite the coils with frequencies ranging from 200 MHz to 13.1 GHz depending on the implementation, however greater or lesser frequencies could likewise be used. It should be recognized that separate frequencies can be used for each direction of communication to allow the contemporaneous bidirectional transmission of signals. While inductive interfaces 22 and 26 are shown with transceivers 50 and 56, these transceivers are optional. For instance, high frequency clock signals can be included in outbound signals 66 and 68 without up-conversion to radio frequencies and with only optionally amplification or using other drivers, buffers that generate inductive signaling based on outbound signals 66 and 68 and other receivers that generate inbound signals 67 and 69 in response thereto.

FIG. 4 presents a schematic block diagram representation of an integrated circuit 16 in accordance with an embodiment of the present invention. In this example, integrated circuit includes integrated circuit dies 21 and 23 that are stacked on a supporting substrate 95. As in the embodiment of FIG. 2, inductive interfaces 22 and 26 are stacked and aligned to magnetically communicate signals between the circuit 11 and the circuit 12. Similarly to the embodiment of FIG. 2, the IC dies 21 and 23 can be bonded together, using a ferromagnetic glue or otherwise, provide magnetic communication between the inductive interfaces 22 and 26 and to stabilize their alignment and to otherwise provide mechanical stability.

FIG. 5 presents a schematic block diagram representation of an integrated circuit package 17 in accordance with an embodiment of the present invention. An integrated circuit package 17 is shown that includes a stacked multi-substrate configuration. In this embodiment, inductive interface 22 can be implemented in or on supporting substrate 95', in IC die 21' or partially in both. Similarly, inductive interface 26 can be implemented in or on supporting substrate 95", in IC die 23' or partially in both. For instance, a coil, such as coil 52 or 54 can include multiple turns that are implemented with multiple metal layers that include layers of both the substrate (95' or 95") and the IC die 12' or 23'. The coil 52 or 54 can be implemented entirely within the integrated circuit die 21' or 23' and or entirely within the substrate 95' or 95". The transceiver 50 or 56, if included, can be implemented entirely in within IC die 21' or 23' or at least partially within the substrate 95' or 95".

FIG. 6 is a top view of a coil 330 in accordance with the present invention. In particular a top view of coil 330, such as coil 52 and/or coil 54 is shown as included in a portion of a inductively coupled IC 15. As shown, the first turns 332 includes metal bridges 334 and 336 to couple various sections of the winding together. The first turn is on dielectric layer 338, while the metal bridges 334 and 336 are on a lower dielectric layer, which enables the first turns to maintain their symmetry. Optional removed dielectric sections 333 and 335 are shown that provides greater magnetic coupling to the second turns that are below. The removed dielectric sections 333 and 335 can be removed using a microelectromechanical systems (MEMS) technology such as dry etching, wet etching, electro-discharge machining, or using other integrated circuit fabrication techniques. The remaining elements of the coil 330 can be created by etching, depositing, and/or any other method for fabricating components on an integrated circuit.

FIG. 7 is a side view of a coil 330 in accordance with the present invention. As shown, dielectric layer 338 supports the first turns 332. A lower layer, dielectric layer 348, supports metal bridges 334 and 336. Utilizing conventional integrated circuit technologies, the metal bridges 334 and 336 are coupled to the corresponding portions of the first turns 332. As further shown, dielectric layer 380 supports the second turns 370 while dielectric layer 376 supports the metal bridges 372 and 374. The first turns 332 and the second turns 370 are coupled together by via 337. As discussed above, removed dielectric section 335 removes portions of both dielectric layers 338 and 348 to improve the magnetic coupling between the first turns 332 and second turns 370.

FIG. 8 is a bottom view of a coil 330 in accordance with the present invention. As shown, the second turn 370 on dielectric layer 376 and the metal bridges 372 and 374 couple the winding of the second turns together. The second turns have a symmetrical pattern and is similar to the winding of the first turns 332. As one of average skill in the art will appreciate, the first and second turns may include more or less turns, and additional turns may also be disposed on additional dielectric layers.

It should be noted that while FIGS. 6-8 present a particular configuration of an on-chip coil, other on-chip coil configurations can likewise be employed with the broad scope of the present invention. As discussed in conjunction with FIG. 3, such a coil 330 can be implemented with a fewer or greater number of turns that is shown, on an integrated circuit die, a substrate or partially on both. In a particular configuration the on-chip coil can be implemented on a substrate around a die or a stack of dies that contain the remaining components of the corresponding inductive interface 22 or 26, along the periphery of an integrated circuit die or in other configurations.

FIG. 9 is a schematic block diagram of an embodiment of RF transceiver 135 in accordance with the present invention. The RF transceiver 135, such as transceiver 50 or 56, includes an RF transmitter 139, and an RF receiver 137. The RF receiver 137 includes a RF front end 140, a down conversion module 142 and a receiver processing module 144. The RF transmitter 139 includes a transmitter processing module 146, an up conversion module 148, and a radio transmitter front-end 150.

As shown, the receiver and transmitter are each coupled to coil 171 and a diplexer (duplexer), that couples the transmit signal 155 to the coil 171 to produce outbound magnetic signal 170 and inbound magnetic signal 152 received by the coil 171 to produce received signal 153. Alternatively, a transmit/receive switch can be used in place of diplexer 177. While a single coil 171 is represented, the receiver and transmitter may share a multiple coil structure that includes two or more coils.

In operation, the transmitter receives outbound signals 162 via the transmitter processing module 146. The transmitter processing module 146 processes the outbound signals 162 optionally in accordance with a multiple access protocol, data protocol or other protocol to produce baseband or low intermediate frequency (IF) transmit (TX) signals 164 that contain outbound signals 162. The baseband or low IF TX signals 164 may be digital baseband signals (e.g., have a zero IF) or digital low IF signals, where the low IF typically will be in a frequency range of one hundred kilohertz to a few megahertz. Note that the processing performed by the transmitter processing module 146 can include, but is not limited to, scrambling, encoding, puncturing, mapping, modulation, and/or digital baseband to IF conversion.

The up conversion module 148 can include a digital-to-analog conversion (DAC) module when baseband or low IF TX signals 164 are digital signals, a filtering and/or gain module, and a mixing section. The filtering and/or gain module filters and/or adjusts the gain of the analog signals prior to providing it to the mixing section. The mixing section converts the analog baseband or low IF signals into up-converted signals 166 based on a transmitter local oscillation.

The radio transmitter front end 150 includes a power amplifier and may also include a transmit filter module. The power amplifier amplifies the up-converted signals 166 to produce outbound magnetic signals 170, which may be filtered by the transmitter filter module, if included. The antenna structure transmits the outbound magnetic signals 170 to another IC or IC die or optionally to a remote device.

The receiver receives inbound magnetic signal 152 via the coil 171 that operates to process the inbound magnetic signal 152 into received signal 153 for the receiver front-end 140. The down conversion module 142 includes a mixing section, an optionally analog to digital conversion (ADC) module when the receiver processing module operates in the digital domain, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156 that includes a inbound symbol stream. Note that the ordering of the ADC module and filtering and/or gain module may be switched, such that the filtering and/or gain module is an analog module.

The receiver processing module 144 processes the baseband or low IF signal 156 in accordance with an optional multiple access protocol or other protocol to produce inbound signals 160. The processing performed by the receiver processing module 144 can include, but is not limited to, digital intermediate frequency to baseband conversion, demodulation, demapping, depuncturing, decoding, and/or descrambling.

In an embodiment of the present invention, receiver processing module 144 and transmitter processing module 146 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the these processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 144 and transmitter processing module 146 are shown separately, it should be understood that these elements could be implemented separately, together through the operation of one or more shared processing devices or in combination of separate and shared processing.

FIG. 10 presents a schematic block diagram representation of an integrated circuit 18 in accordance with an embodiment of the present invention. In this configuration, integrated circuit 18 includes integrated circuit dies 30 and 34 having inductive interfaces 22 and 26. Supporting substrate 94 supports integrated circuit dies 30 and 34 and further includes a magnetic communication path 98 that is aligned with the inductive interface 22 and 26 to magnetically communicate signals between circuits that are included on the IC dies 30 and 34. In particular, magnetic communication path 98 operates to couple magnetic signals generated by inductive interface 22 to inductive interface 26 and thus allows IC dies 30 and 34 to communicate in a similar fashion to IC dies 21 and 23 and/or ICs 20 and 24.

Further functions and features of the magnetic communication path 98 will be discussed in conjunction with FIGS. 11-17 that follow.

FIG. 11 is a schematic block diagram of an embodiment of integrated circuit dies 30 and 34 in accordance with the present invention. As discussed in conjunction with FIG. 3, inductive interfaces 22 and 26 include coils 52, 54. In this configuration however, coils 52 and 54 are aligned to bidirectionally or unidirectionally communicate via the magnetic communication path 98. In an embodiment of the present invention, the IC dies 30 and 34 are bonded to supporting substrate 94 using a ferromagnetic glue or other bonding technique that supports the transfer of magnetic flux from coils 52 and 54 to the magnetic communication path 98.

In operation, outbound signals 66 from circuit 13 are converted to radio frequency signals or other signals via transceiver 50 or other driver that excite the coil 52 to generate magnetic flux that is received by magnetic communication path 98 and that generates a corresponding magnetic flux on coil 54. Coil 54 and transceiver 56 or other receiver or amplifier converts this magnetic flux to inbound signals 69 for circuit 14. Similarly, outbound signals 68 from circuit 14 are converted to radio frequency signals or other signals via transceiver 56 or other buffer that excite the coil 54 to generate magnetic flux that is received by magnetic communication path 98 and that generates a corresponding magnetic flux on coil 52. Coil 52 and transceiver 50 or other receiver or amplifier converts this magnetic flux to inbound signals 67 for circuit 13.

While integrated circuit dies 30 and 34 are shown as both being on the same side of the supporting substrate, in an another configuration, the IC dies 30 and 34 can be bonded to opposite sides of the supporting substrate, such as in the flip chip configuration that is shown in conjunction with FIGS. 14 and 15. In this configuration, the magnetic communication path 98 is provided to conduct magnetic flux through the supporting substrate 94 to opposing sides of the supporting substrate at points that align with the coils of inductive interfaces 22 and 26.

FIG. 12 is a schematic block diagram of magnetic communication path 98 in accordance with an embodiment the present invention. In particular, magnetic communication path 98 can include two coils 58 and 59 that are coupled together and that are aligned with the coils 52 and 54 of the inductive interfaces 22 and 26. In operation, the pairs of coils (52,58) and (59,54) coils are similarly sized or sized with substantially the same dimensions to facilitate their alignment and to facilitate the inductive coupling between the coil pairs. In particular, these coils can be implemented in their corresponding IC die or substrate so that these coils can be axially and/or planarly aligned. Magnetic flux from coil 52 is received by coil 58 and converted to an electrical signal that generates a corresponding electrical flux via coil 59 that is received by coil 54. Similarly, magnetic flux from coil 54 is received by coil 59 and converted to an electrical signal that generates a corresponding electrical flux via coil 58 that is received by coil 52.

FIG. 13 is a schematic block diagram of magnetic communication path 98' in accordance with another embodiment the present invention. In particular, magnetic communication path 98' operates in place of magnetic communication path 98, yet with magnetically conductive material 96 provided in place of coils 58 and 59. In particular, the substrate of an IC such as IC 18, is provided with one or more ferrite rods, a powdered iron structure, another ferromagnetic material or other magnetically conductive material that conducts magnetic flux from coil 52 to coil 54 and from coil 54 to coil 52. In operation, the coils 52 and 54 are aligned to the magnetically conductive path 98' to facilitate the inductive coupling between the coils 52 and 54. Magnetic flux from coil 52 is received by coil 54. Similarly, magnetic flux from coil 54 is received by coil 52.

FIG. 14 is a side view of a pictorial representation of an integrated circuit package in accordance with the present invention. RF IC 325 is similar to IC 18 however, as discussed in conjunction with FIG. 11, a flip-chip configuration is shown. In particular, with integrated circuit die 302, such as IC die 30, is bonded to the top of substrate 306, while integrated circuit die 304 is bonded to the bottom of the substrate 36. This figure is not drawn to scale. In particular, the RF IC 325 is integrated in a package having a plurality of bonding pads 308 to connect the RF IC 325 to a circuit board.

Substrate 306 includes a magnetic communication path, such as magnetic communication path 98 or 98' to conduct magnetic flux through the supporting substrate 306 to opposing sides of the supporting substrate at points that align with the inductive interfaces of IC dies 302 and 304. The IC dies 302 and 304 are stacked and inductive coupling is employed to connect these two circuits and minimize the number of bonding pads, (balls) out to the package. IC die 302 and IC die 304 can be coupled to respective ones of the bonding pads 308 via bonding wires or other connections. The positioning of the IC die 304 on the bottom of the package in a flip chip configuration allows good heat dissipation of the IC die 304 to a circuit board.

FIG. 15 is a bottom view of a pictorial representation of an integrated circuit package in accordance with the present invention. As shown, the bonding pads (balls) 308 are arrayed in an area of the bottom of the integrated circuit with an open center portion 310 and wherein the IC die 304 is integrated in the open center portion. While a particular pattern and number of bonding pads 308 are shown, a greater or lesser number of bonding pads can likewise be employed with alternative configurations within the broad scope of the present invention.

FIG. 16 is a pictorial representation of integrated circuit 19 in accordance with an embodiment the present invention. In particular, a portion of integrated circuit 19 is shown with die 70, such as IC die 30 or 34 bonded to package substrate 72, such as supporting substrate 94. A cross section is shown that identifies a region of die 70 that includes a portion of coil 74, such as coil 52 or 54. Further, this cross section also identifies a region of package substrate 72 that includes a portion of magnetic communication path 96, such as magnetic communication path 98 or 98'. As shown by the regions of the coil 74 and magnetic communication path 96 that are included in this cross section, these portions are aligned to facilitate the conduction of magnetic flux therebetween.

FIG. 17 is a pictorial representation of integrated circuit 51 in accordance with an embodiment the present invention. In particular, while FIGS. 10-16 have focused on integrated circuits having a supporting substrate that includes a magnetic communication path that facilitates the communication between two IC dies with inductive interfaces, IC 51 presents a top view, not to scale, of an integrated circuit that includes a magnetic communication path 97, such as magnetic communication path 96, 98 or 98', that couples eight integrated circuit dies 49. While each of these eight IC dies 49 are referred to by common reference numerals, they can be implemented each with different circuits or two or more circuits that are the same. Each of the integrated circuit dies 49 is shown having a coil in the region 47 that is aligned with a portion of the magnetic communication path 97 that lies in the supporting substrate that is beneath the integrated circuit dies 49. While not expressly shown, one or more IC dies could likewise be disposed below the substrate with coils in alignment with the magnetic communication path 97. In this fashion, magnetic communication path 97 couples inductive interfaces, such as inductive interfaces 22 or 26 of a plurality of IC dies above the supporting substrate and also below the supporting substrate. In an embodiment of the present invention, each of the IC dies 49 include inductive interfaces, such as inductive interfaces 22 or 26 that implement a multiple access protocol as part of a transceiver, driver, receiver, etc.

While RF ICs 16, 17, 18, 19, 51 and 325 provide several possible implementations of inductively coupled IC 15, other circuits including other integrated circuit packages can be implemented including other stacked, in-line, surface mount and flip chip configurations.

FIG. 18 is a schematic block diagram of an embodiment of integrated circuits 40 and 44 in accordance with the present invention. In particular ICs 40 and 44 include inductive interfaces 22 and 26 that operate as previously described. In addition, ICs 40 and 44 further include millimeter wave interfaces 46 and 48 that communicate signals therebetween via millimeter wave communication path 42. In this fashion, signaling can be transferred between ICS 40 and 44 via two interfaces. For instance, signals can be segregated into high frequency and low frequency signals or high data rate and low data rate signals based on the implementation of the inductive and millimeter wave communications between the ICs 40 and 44 and transmitted via one or the other of these two communication media. Further, signals can be segregated for transmission into shared medium and dedicated medium signals when either the inductive interfaces 22, 26 or the millimeter wave interfaces 46, 48 share their communication medium with other devices such as other integrated circuits, other integrated circuit dies and/or remote devices. In addition, the magnetic and millimeter wave communication paths between ICs 40 and 44 can be used in the implementation of an RF bus interface between two or more integrated circuits that that includes two or more communication paths.

FIG. 19 is another schematic block diagram of an embodiment of integrated circuits 40 and 44 in accordance with the present invention. In particular, ICs 40 and 44 include inductive interfaces 22 and 26 that operate as described in conjunction with FIG. 3. While FIGS. 18 and 19 present examples where inductive interfaces 22 and 24 are implemented in integrated circuits 40 and 44, as shown in other embodiments, inductive interfaces 22 and 26 can each be implemented in a integrated circuit die, in or on a supporting substrate or partially in an integrated circuit die and partially on a substrate. Further, while FIGS. 18 and 19 present examples where millimeter wave interfaces 46 and 48 are implemented in integrated circuits 40 and 44, as will be discussed in conjunction with FIGS. 21 and 22, the inductive interfaces can each be implemented in a integrated circuit die, or further in or on a supporting substrate or partially in an integrated circuit die and partially on a substrate.

As shown, millimeter wave interface 46 includes an antenna 52' and transceiver 50' and millimeter wave interface 48 includes antenna 54' and transceiver 56'. Antennas 52' and 54' are aligned to electromagnetically communicate signals between the circuit 13 and the circuit 14. In particular, these antennas can include one or more antenna elements that are implemented on one or more metal layers of a corresponding IC die, of a supporting substrate or the IC die and substrate. In an embodiment of the present invention, the antennas are similarly sized and aligned to facilitate the transfer of electromagnetic signals between the two antennas via a wave guide, through a dielectric material, substrate, free space or other other portion of ICs 40 and 44. In particular, these antennas can be implemented in their corresponding IC die and/or substrate to generate electromagnetic emissions that are either substantially omni-directional on one or more planes or transmission or optionally directed toward the other antenna.

In operation, outbound signals 66' from circuit 13, such as circuit 11, are converted to radio frequency signals or other signals via transceiver 50' that excite the antenna 52' to generate an electromagnetic field that is recovered by antenna 54' and converted to inbound signals 69' to circuit 14, such as circuit 12. Similarly, outbound signals 68' from circuit 14 are converted to radio frequency signals or other signals via transceiver 56' that excite the antenna 54' to generate an electromagnetic field that is recovered by coil 52' and converted to inbound signals 67' to circuit 13.

In an embodiment of the present invention the transceivers 50 and 56 operate in a millimeter wave band such as a 60 GHz band, however greater or lesser frequencies could likewise be used. It should be recognized that separate frequencies or frequency channels can be used for each direction of communication to allow the contemporaneous bidirectional transmission of signals.

FIG. 20 is a schematic block diagram of an embodiment of integrated circuits 40, 41 and 43 in accordance with the present invention. In particular, a multiple IC structure is shown with ICs 40, 41 and 43 that includes a plurality of ICs (40, 43) communicating via inductive interfaces and a plurality of ICs (40, 41) communication via millimeter wave interfaces. It should be noted that this stacked structure is not required and further integrated circuits can be implemented in this fashion, with one, several or all of the ICs including corresponding millimeter wave interfaces and one, several or all of the ICs including inductive interfaces as part of a single or dual RF bus structure or to otherwise facilitate communication between these ICs. In this particular structure IC 40 includes both inductive interface 22 and millimeter wave interface 48 and can be used to transfer signals between IC 41 and IC 43 by converting magnetic/inductive communication from IC 43 to millimeter wave communications received by IC 41, and by converting millimeter wave communications from IC 41 to magnetic/inductive communications received by IC 43.

In an embodiment of the present invention, one or more of the millimeter wave interfaces 46 or 48 can further send and receive signals with an external device such as a remote communication device or other device that includes a millimeter wave transceiver.

FIG. 21 is a pictorial representation of integrated circuit 71 in accordance with an embodiment the present invention. IC 71 includes a plurality of integrated circuit dies 51, 53 and 55. In particular, integrated circuit dies 51 and 55 have corresponding millimeter wave interfaces 46 and 48 for communication with each other via millimeter wave communication path 42 or with one or more remote devices such as other ICs, communication devices or other devices that include a millimeter wave transceiver. IC dies 53 and 55 have inductive interfaces 22 and 26 for communication as previously described.

It should be noted that further integrated circuits can be implemented in this fashion, but in different configurations including additional IC dies, with one, several or all of the IC dies including corresponding millimeter wave interfaces and one, several or all of the IC dies including inductive interfaces as part of a single or dual RF bus structure or to otherwise facilitate communication between these IC dies. In this particular structure IC die 55 includes both inductive interface 26 and millimeter wave interface 48 and can be used to transfer signals between IC dies 51 and 53 by converting magnetic/inductive communication from IC die 53 to millimeter wave communications received by IC die 51, and by converting millimeter wave communications from IC die 51 to magnetic/inductive communications received by IC die 53.

FIG. 22 is a pictorial representation of integrated circuit 73 in accordance with an embodiment the present invention. Integrated circuit 73 includes IC dies 54 and 50 that include corresponding circuits and millimeter wave interfaces 46 and 48 that operate as previously described. In this configuration, IC dies 50 and 54 include inductive interfaces 22 and 26 that communication via magnetic communication path 97, 98 or 98' that is included in supporting substrate 94 as previously described.

It should be noted that further integrated circuits can be implemented in this fashion, but in different configurations including additional IC dies, with one, several or all of the IC dies including corresponding millimeter wave interfaces and one, several or all of the IC dies including inductive interfaces as part of a single or dual RF bus structure or to otherwise facilitate communication between these IC dies.

FIG. 23 is a pictorial and block diagram representation of electronic device 80 in accordance with an embodiment the present invention. In particular Electronic device 80 includes an inductively coupled IC such as IC 40, 71 or 73 that can communication with remote devices via a millimeter wave transceiver such as millimeter wave transceiver 50' or 56'. In particular personal computer 82, RFID card 87, camera 83, printer 84, personal digital assistant 85 and mobile communication device 86 present examples of devices that can include a millimeter wave transceiver to communicate with electronic device 80 in accordance with a standard or other wireless protocol. Electronic device 80, like electronic device 10, can itself be a mobile telephone, wireless local area network device, cable modem, Bluetooth compatible device, or other communication device, a personal computer, server, printer, router or other computer, computer peripheral or computer networking device, a television, set-top box, game console, game, personal audio player or other consumer electronic device or any other type of electronic device.

FIG. 24 is a schematic block diagram of an embodiment of RF transceiver 1035 in accordance with the present invention. In particular, The RF transceiver 1035, such as millimeter wave transceiver 50' or 56' includes an RF transmitter 1039, and an RF receiver 1037. The RF receiver 1037 includes a RF front end 1040, a down conversion module 1042 and a receiver processing module 1044. The RF transmitter 1039 includes a transmitter processing module 1046, an up conversion module 1048, and a radio transmitter front-end 1050.

As shown, the receiver and transmitter are each coupled to an antenna through an antenna interface 1071 and a diplexer (duplexer) 1077, that couples the transmit signal 1055 to the antenna to produce outbound RF signal 1070 and couples inbound signal 1052 to produce received signal 1053. Alternatively, a transmit/receive switch can be used in place of diplexer 1077. While a single antenna is represented, the receiver and transmitter may share a multiple antenna structure that includes two or more antennas. In another embodiment, the receiver and transmitter may share a multiple input multiple output (MIMO) antenna structure, diversity antenna structure, phased array or other controllable antenna structure that includes a plurality of antennas. Each of these antennas may be fixed, programmable, and antenna array or other antenna configuration. Also, the antenna structure of the wireless transceiver may depend on the particular standard(s) to which the wireless transceiver is compliant and the applications thereof.

In operation, the transmitter receives outbound signals 1062 from a circuit such as outbound signals 66' or 68' via the transmitter processing module 1046. The transmitter processing module 1046 processes the outbound signals 1062, such as outbound signals 67' or 69' in a millimeter wave protocol to produce baseband or low intermediate frequency (IF) transmit (TX) signals 1064 that contain outbound signals 1062. The baseband or low IF TX signals 1064 may be digital or analog baseband signals (e.g., have a zero IF) or digital low IF signals, where the low IF typically will be in a frequency range of one hundred kilohertz to a few megahertz. Note that the processing performed by the transmitter processing module 1046 can include, but is not limited to, scrambling, encoding, puncturing, mapping, modulation, and/or digital baseband to IF conversion.

The up conversion module 1048 includes an optional digital-to-analog conversion (DAC) module, a filtering and/or gain module, and a mixing section. The DAC module, if included, converts the baseband or low IF TX signals 1064 from the digital domain to the analog domain. The filtering and/or gain module filters and/or adjusts the gain of the analog signals prior to providing it to the mixing section. The mixing section converts the analog baseband or low IF signals into up-converted signals 1066 based on a transmitter local oscillation.

The radio transmitter front end 1050 includes a power amplifier and may also include a transmit filter module. The power amplifier amplifies the up-converted signals 1066 to produce outbound RF signals 1070, which may be filtered by the transmitter filter module, if included. The antenna structure transmits the outbound RF signals 1070 to a targeted device such as an IC or IC die, RF tag, base station, an access point and/or another wireless communication device via an antenna interface 1071 coupled to an antenna that provides impedance matching and optional bandpass filtration.

The receiver receives inbound RF signals 1052 via the antenna and antenna interface 1071 that operates to process the inbound RF signal 1052 into received signal 1053 for the receiver front-end 1040. In general, antenna interface 1071 provides impedance matching of antenna to the RF front-end 1040, optional bandpass filtration of the inbound RF signal 1052.

The down conversion module 1042 includes a mixing section, an optional analog to digital conversion (ADC) module, and may also include a filtering and/or gain module. The mixing section converts the desired RF signal 1054 into a down converted signal 1056 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 1056. Note that the ordering of the ADC module and filtering and/or gain module may be switched, such that the filtering and/or gain module is an analog module.

The receiver processing module 1044 processes the baseband or low IF signal 1056 in accordance with a millimeter wave communication protocol to produce inbound inbound signals 1060, such as inbound signals 67' or 69'. The processing performed by the receiver processing module 1044 can include, but is not limited to, digital intermediate frequency to baseband conversion, demodulation, demapping, depuncturing, decoding, and/or descrambling.

In an embodiment of the present invention, receiver processing module 1044, and transmitter processing module 1406 can be implemented via use of a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the these processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

FIG. 25 is schematic block diagram of an embodiment of integrated circuits 60 and 24 in accordance with the present invention. IC 24 includes a circuit and an inductive interface 26. IC 60 includes a circuit and an inductive interface 62 that operates in a similar fashion to inductive interface 22 to communicate with inductive interface 26 and is further operable to engage in near field communications, such as RFID communications with a remote device 65. In particular, the coil, such as coil 52, used to communicate with inductive interface 26 can be further employed as a near field coil to respond to near field communication with external devices such as an RFID tag or RFID terminal or other near field communications device to send and/or receive signals via these near field communications.

Further functions and features of inductive interface 62 are presented in conjunction with FIG. 27.

FIG. 26 is a pictorial representation of integrated circuit 75 in accordance with an embodiment the present invention. IC 75 includes an IC die 34 that includes a circuit and an inductive interface 26. IC die 64 includes a circuit and an inductive interface 62 that operates in a similar fashion to inductive interface 22 to communicate with inductive interface 26 via magnetic communication path 97, 98 or 98' and is further operable to engage in near field communications, such as RFID communications with a remote device 65. In particular, the coil, such as coil 52, used to communicate with inductive interface 26 can be further employed as a near field coil to respond to near field communication with external devices such as an RFID tag or RFID terminal or other near field communications device to send and/or receive signals via these near field communications.

Further functions and features of inductive interface 62 are presented in conjunction with FIG. 27.

FIG. 27 is a schematic block diagram of an embodiment of an inductive/RFID interface in accordance with the present invention. Inductive/RFID interface 575, such as inductive/RFID interface 62, includes an antenna structure 452, such as coil 52, an optional power recovery circuit 450, a data recovery module 456, a processing module 458, an oscillation module 454, and a transmitting circuit 460. The processing module 458 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the antenna structure 452 can be sized for operation for frequencies used in magnetic communication with other ICs and other IC dies and further for near field communication with remote devices 65. In an embodiment of the present invention, one frequency band is used for both types of communications and alternative multiple access techniques are used to avoid interference and to separate signaling using in inductive coupling and signaling used in near field communications. In another embodiment of the present invention, separate frequency bands are used for inductive coupling and near-field communications and the antenna structure is designed for operation in both frequency bands.

Antenna structure 452 receives an RF signal 462 either via inductive coupling with an inductive interface of another IC die or IC or via near field communications with a remote device. The RF signal 462 may be a continuous wave signal or other signal. The antenna structure 452 provides the received RF signal 462 to the optional power recovery circuit 450 (when included) and the data recovery circuit 456.

When included, the power recovery circuit 450 converts the RF signal 462 into a supply voltage (Vdd) 464. In one embodiment, the power recovery circuit 450 includes a rectifying module, which may be an active cell rectifier or a charge pump rectifier, and a tuning module. The tuning module tunes the rectifying module in accordance with the RF signal. In other words, the tuning module tunes the frequency response of the rectifying module based on the frequency of the RF signal such that the frequency response of the power recovery circuit 450 is optimized for the RF signal 462. The rectifying module, having been tuned, rectifies the RF signal 462 and stores the rectified RF signal in a capacitor to produce the supply voltage 464, which is used to power the data recovery module 456, the processing module 458, the oscillation module 454, and the transmitting circuit 460. When the optional power recovery circuit 450 is not included, the supply voltage Vdd is provided by a conventional or alternative power supply.

The oscillation module 454 produces an oscillation 466 having a frequency approximately equal to a carrier frequency of the RF signal 462. The oscillation module 454 provides the oscillation 466 to the data recovery module 456 and may also provide the oscillation to the processing module 458.

The data recovery module 456 is clocked via the oscillation 466 to recover data 468 from the RF signal 462 including signals and other data received via near field communications or from another inductive interface. For example, the RF signal 462 includes bi-phase encoded data that has the state of the encoded signal change at the bit boundaries and, within the bit boundaries, a constant state may represent a logic one and a toggle state may represent a logic zero. In this example, the data recovery module 456 recovers the bi-phase encoded data as the recovered data 468 and provides it to the processing module 458. In another example, the data recovery module 456 may decode the recovered bi-phase encoded data to produce the recovered data 468.

The processing module 468 processes the recovered data 468 and optionally provides separate feeds of the recovered data 468 representing data resulting from near field communications and data resulting from magnetic communications with other inductive interfaces, to a circuit, such as circuit 11, 12, 13 or 14. In an embodiment of the present invention, the processing module operates in accordance with a multiple access protocol that provides either contemporaneous or serial communication between the two communication paths. Either communication path may be implemented as part of an single or multiple RF bus structure having further functions and features that will be described in greater detail in conjunction with FIGS. 28-61.

When indicated within the recovered data 468 or otherwise in response to signals or data from a circuit such as circuit 11, 12, 13 or 14, outbound data 470 is provided to transmitting circuit 460. The transmitting circuit 460, which may be a transistor or other transmitter circuit provides the outbound data 470 to the antenna structure 452 for transmission as an outbound signal 472.

FIG. 28 is a schematic block diagram of an embodiment of an RF bus that interfaces a plurality of integrated circuits and or integrated circuit dies 1084, and 1086, and includes an RF bus controller 1088. For example, the ICs 1084, 1086, can be any of the ICs or IC dies that include an inductive interface such as inductive interface 22, 26, or 62, and/or that include a millimeter wave interface such as millimeter wave interfaces 46 and 48. ICs 1084 and 1086 each include a circuit such as a microprocessor, microcontroller, digital signal processor, programmable logic circuit, memory, application specific integrated circuit (ASIC), analog to digital converter (ADC), digital to analog converter (DAC), digital logic circuitry, analog circuitry, graphics processor, or other analog or digital circuit.

In this embodiment, IC 1084 includes a first radio frequency (RF) bus transceiver 1108 and IC 1086 includes a second RF bus transceiver 1110 to support intra-device RF communications 1090 therebetween such as transceivers 52, 54, 52' and/or 54'. The intra-device RF communications 1090 may be RF data communications, RF instruction communications, RF control signal communications, and/or RF input/output communications that are transmitted via near-field communications, magnetic communications and/or millimeter wave communications. For example, data, control, operational instructions, and/or input/output signals (e.g., analog input signals, analog output signals, digital input signals, digital output signals) that are traditionally conveyed between ICs via traces on a printed circuit board are, in millimeter wave interface 1080 transmitted via the intra-device RF communications 1090. It should be noted that ICs 1084 and 1086 can include multiple RF buses that operate in different frequency bands and/or with different modes of communications such as near-field communication, millimeter wave communication and magnetic communication. These multiple buses can operate separately or part of a multi-bus architecture.

The intra-device RF communications 1090 may also include operating system level communications and application level communications. The operating system level communications are communications that correspond to resource management of the millimeter wave interface 1080 loading and executing applications (e.g., a program or algorithm), multitasking of applications, protection between applications, device start-up, interfacing with a user of the millimeter wave interface 1080 etc. The application level communications are communications that correspond to the data conveyed, operational instructions conveyed, and/or control signals conveyed during execution of an application.

In an embodiment of the present invention the RF bus operates in accordance with a multi-access protocol such as a time division multiple access protocol, a frequency division multiple access protocol, random access protocol and a code division multiple access protocol. The RF bus controller 1088 is coupled to control the intra-device RF communications 1090 between the first and second RF bus transceivers 1108, 1110. The RF bus controller 1088 may be a separate IC or it may be included in one of the ICs 1084, 1086. In operation, the RF bus controller arbitrates access to the RF bus. In an embodiment of the present invention, the RF bus controller is operable to receive an RF bus access request, determine RF bus resource availability, determine when sufficient RF bus resources are available, and allocate at least one RF bus resource when sufficient RF bus resources are available. Also, the RF bus controller can optionally poll the plurality of inductive interfaces, and allocate at least one RF bus resource in response to poll. Further, the RF bus controller can optionally receive a request to reserve at least one RF bus resource from one of the plurality of inductive interfaces, and reserve one or more RF bus resources in response to the request.

In this embodiment, the intra-device RF communications 1090 occur over a free-space RF communication path. In other words, the intra-device RF communications 1090 are conveyed via the air. In another embodiment, the intra-device RF communications 1090 can occur via a waveguide RF communication path that, for instance, may be formed in a micro-electromechanical (MEM) area of the supporting substrate. In yet another embodiment, a dielectric layer can provide a dielectric RF communication path for the intra-device RF communications 1090. Further intra-device communications can take place vie a magnetic communication path such as magnetic communication path 97, 98 or 98'.

In an embodiment of present invention the RF bus controller 1088 further functions to select a communication path (the waveguide RF communication path, the dielectric layer RF communication path, the magnetic communication path or the free space RF communication path) as well as the particular communications mode (near-field, millimeter wave or magnetic) based on at least one aspect of one of the intra-device RF communications. For example, high data rate and/or non-error tolerant communications (e.g., operating system level communications) may occur over the waveguide RF communication path, while lower data rate and/or error tolerant communications (e.g., some portions of application level communications) may occur over the free-space RF communication path. As another example, the aspect on which the RF communication path is selected may be user defined, operating system level defined, and/or pre-programmed into the device. As yet another example, the aspect may correspond to the IC initiating an intra-device RF communication and/or the IC receiving it. As a further example, the aspect may correspond to the number of intra-device RF communications 1090 an IC currently has in progress.

Further functions and features of the RF bus controller 1088 will be described in greater detail with reference to the figures that follow.

FIG. 29 is a schematic block diagram of an embodiment of an RF interface 1080 that interfaces the ICs 1084, 1086 and includes the RF bus controller 1088. In this embodiment, the RF bus controller 1088 includes an RF bus transceiver 1130, IC 1084 includes a circuit module 1132 and the RF bus transceiver 1108, and IC 1086 includes a circuit module 1134 and the RF bus transceiver 1110. The circuit modules 1132, 1134 may be any type of digital circuit, analog circuit, logic circuit, and/or processing circuit. For example, one of the circuit modules 1132, 1134 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, the inter-device RF communication 1090, RF bus requests 1122, and the RF bus grants 1124 occur within the same frequency spectrum. To minimize interference between the obtaining access to the RF bus and using the RF bus for the inter-device RF communications 1090, the bus controller 1088 controls access to the frequency spectrum by allocating at least one communication slot per frame to the wireless interface and allocating at least one other communication slot per frame for the intra-device RF communications. The communication slots may be time division multiple access (TDMA) slots within a TDMA frame, frequency division multiple access (FDMA) slots of an FDMA frame, and/or code division multiple access (CDMA) slots of a CDMA frame. Note that in this embodiment, frame is equivalent to a packet.

FIG. 30 is a diagram of an example of a frame of obtaining access to an RF Bus and using the RF bus by the embodiment of FIG. 26. The frame, or packet, includes a controller inquiry field 1140, an IC response control field or fields 1142, a resource allocation field or fields 1144, and a data field or fields 1146. The RF bus controller uses the controller inquiry field 1140 to determine whether one or more ICs have an up-coming need to access the RF bus. In one embodiment, the RF bus controller 1088 addresses a single IC per frame as to whether the IC has an up-coming need for the RF bus. In another embodiment, the RF bus controller 1088 addresses two or more ICs as to whether they have an up-coming need for the RF bus. The RF bus controller 1088 may be use a polling mechanism to address the ICs, which indicates how and when to response to the polling inquiry.

The ICs 1084, 1086 respond to the RF bus controller's query in the IC response control field or fields 1142. In one embodiment, the ICs share a single IC response control field using a carrier sense multiple access (CSMA) with collision avoidance technique, using pre-assigned sub-slots, using a round robin technique, using a poll-respond technique, etc. In another embodiment, the ICs have their own IC response control field 1142. In either embodiment, the ICs 1084, 1086 response includes an indication of whether it has data to convey via the RF bus, how much data to convey, the nature of the data (e.g., application data, application instructions, operating system level data and/or instructions, etc.), the target or targets of the data, a priority level of the requester, a priority level of the data, data integrity requirements, and/or any other information relating to the conveyance of the data via the RF bus.

The RF bus controller 1088 uses the resource allocation field or fields 1144 to grant access to the RF bus to one or more ICs 1084, 1086. In one embodiment, the RF bus controller 1088 uses a single field to respond to one or more ICs. In another embodiment, the RF bus controller 1088 responds to the ICs in separate resource allocation fields 1144. In either embodiment, the RF bus grant 1144 indicates when, how, and for how long the IC has access to the RF bus during the one or more data fields 1146. Various embodiments of requesting and obtaining access to the RF bus and transceiving via the RF bus will be described in greater detail with reference to the Figures that follow.

Figure 31:
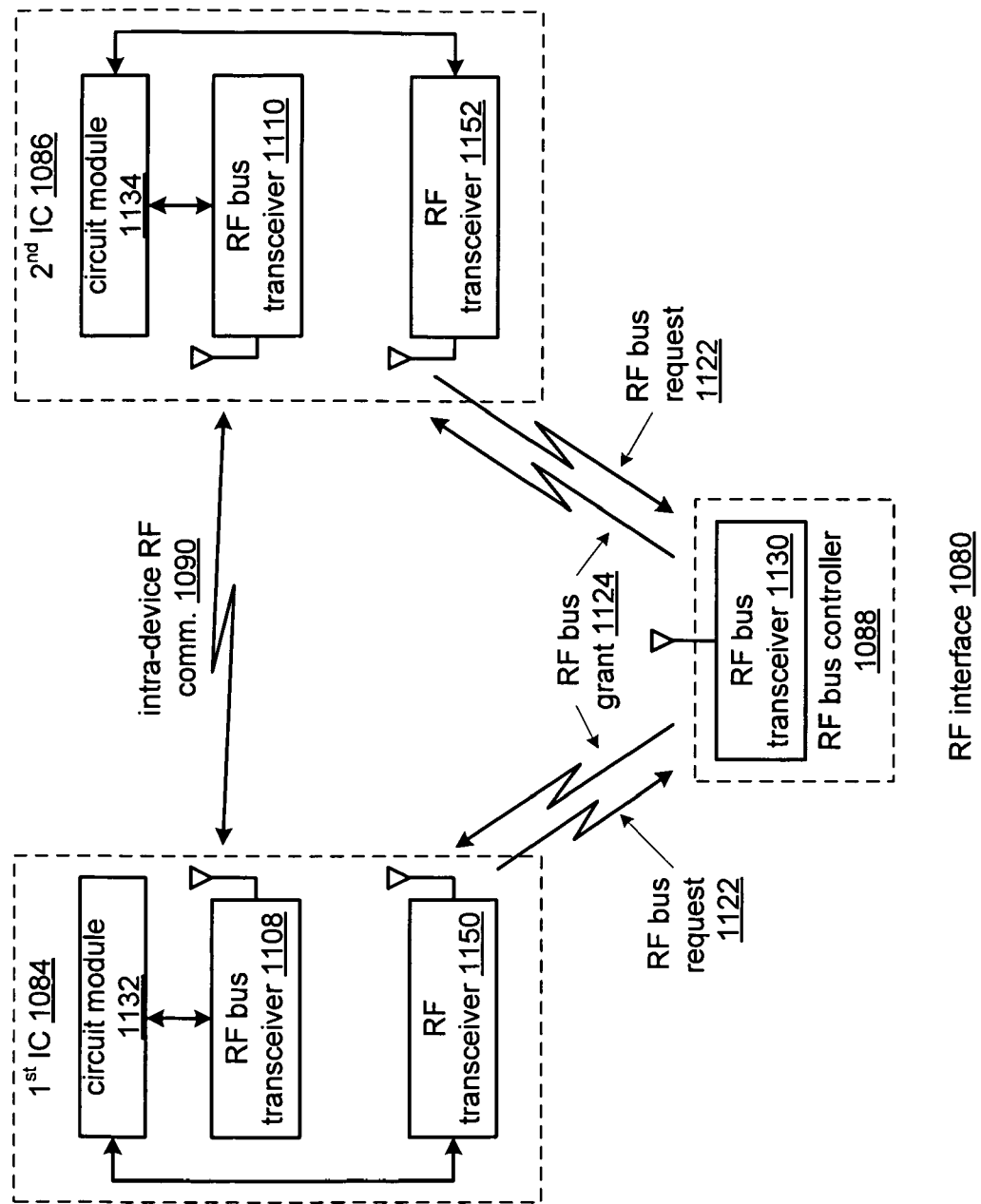

FIG. 31 is a schematic block diagram of another embodiment of the RF interface 1080 that interfaces the ICs 1084, 1086 and includes the RF bus controller 1088. In this embodiment, the RF bus controller 1088 includes an RF bus transceiver 1130. IC 1084 includes the circuit module 132 the RF bus transceiver 1108, and an RF transceiver 1160. IC 1086 includes the circuit module 1134, the RF bus transceiver 1110, and an RF transceiver 1152.

In this embodiment, the inter-device RF communications 1090 occur in a different frequency spectrum than the RF bus requests 1122 and the RF bus grants 1124. As such, they can occur simultaneously with minimal interference. In this manner, the RF bus requests 1122 and RF bus grants 1124 may be communicated using a CSMA with collision avoidance technique, a poll-response technique, allocated time slots of a TDMA frame, allocated frequency slots of an FDMA frame, and/or allocated code slots of a CDMA frame in one frequency spectrum or using one carrier frequency and the inter-device RF communications 1090 may use a CSMA with collision avoidance technique, a poll-response technique, allocated time slots of a TDMA frame, allocated frequency slots of an FDMA frame, and/or allocated code slots of a CDMA frame in another frequency spectrum or using another carrier frequency.

Figure 32:
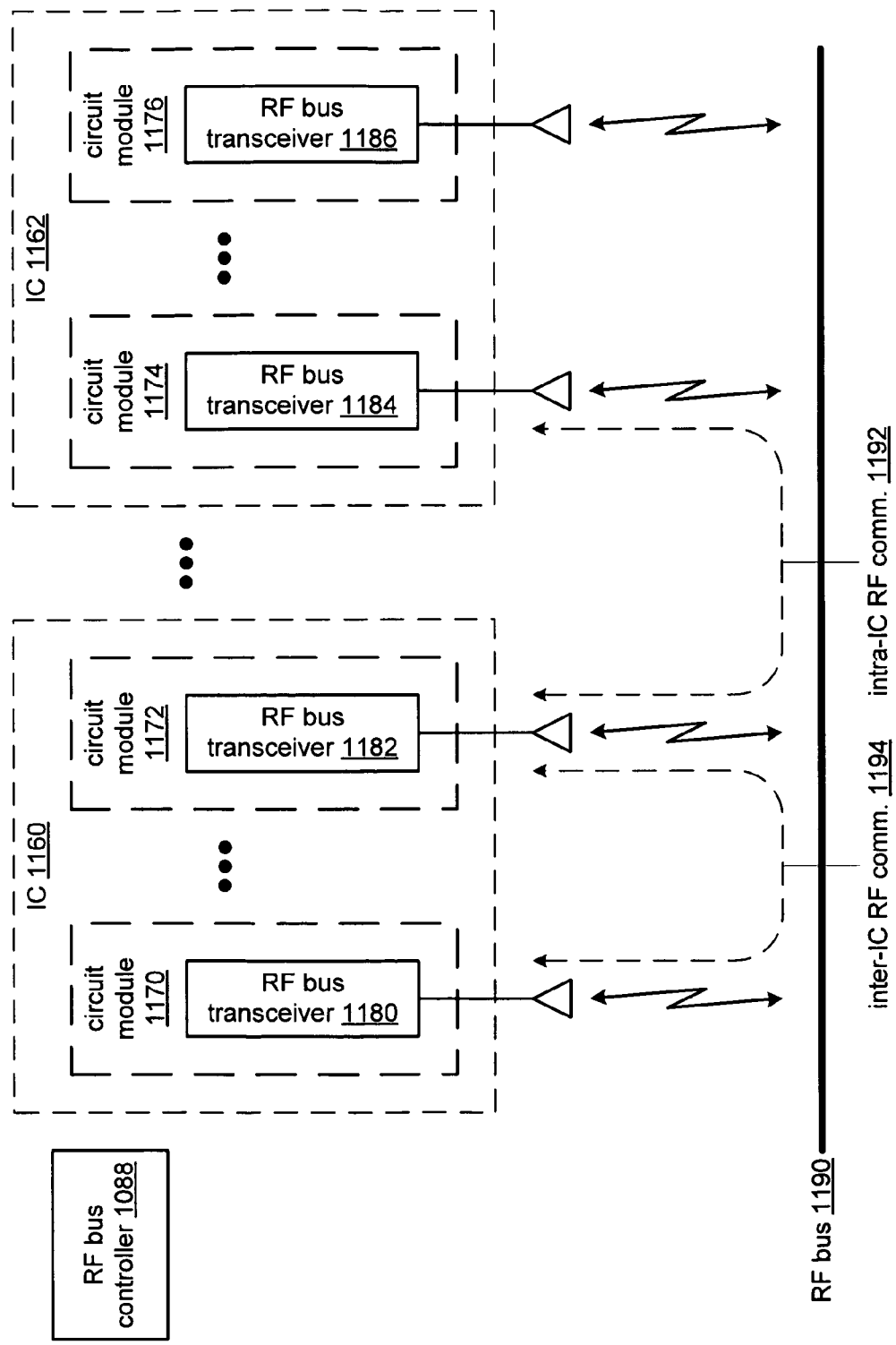

FIG. 32 is a schematic block diagram of another embodiment of the millimeter wave interface 1080 that interfaces a plurality of integrated circuits (ICs) 1160, 1162 and includes the RF bus controller 1088, and an RF bus 1190. Each of the ICs 1160, 1162 includes a plurality of circuit modules 1170-1176 and each of the circuit modules 1170-1176 includes a radio frequency (RF) bus transceiver 1180-1186. The circuit modules 1170-1176 may be any type of digital circuit, analog circuit, logic circuit, and/or processing circuit that can be implemented on an IC. For example, one of the circuit modules 1170-1176 may be, but is not limited to, a microprocessor, a component of a microprocessor, cache memory, read only memory, random access memory, programmable logic, digital signal processor, logic gate, amplifier, multiplier, adder, multiplexer, etc.

In this embodiment, the RF bus controller 1088, which may be a separate IC or contained with one of the ICs 1160-1162, controls intra-IC RF communications 1192 between circuit modules 1170-1176 of different ICs 1160, 1162 and controls inter-IC RF communications 1194 between circuit modules 1170-1172 or 1174-1176 of the same IC. In this manner, at least some of the communication between ICs and between circuit modules of an IC is done wirelessly via the RF bus transceivers 1180-1186. Note that the circuit modules 1170-1172 may also be inter-coupled with one or more traces within the IC 1160, the circuit modules 1174-1176 may also be inter-coupled with one or more traces within the IC 1162, and that IC 1160 may be coupled to IC 1162 via one or more traces on a supporting substrate (e.g., a printed circuit board).

The intra-IC RF communications 1192 and the inter-IC RF communications 1194 may be RF data communications, RF instruction communications, RF control signal communications, and/or RF input/output communications. For example, data, control, operational instructions, and/or input/output communications (e.g., analog input signals, analog output signals, digital input signals, digital output signals) that are traditionally conveyed between ICs via traces on a printed circuit board are at least partially transmitted by the RF bus transceivers 1180-1186 via the RF bus 1190.

The intra-IC RF communications 1192 and/or the inter-IC RF communications 1194 may also include operating system level communications and application level communications. The operating system level communications are communications that correspond to resource management of the millimeter wave interface 1080 loading and executing applications (e.g., a program or algorithm), multitasking of applications, protection between applications, device startup, interfacing with a user of the device, etc. The application level communications are communications that correspond to the data conveyed, operational instructions conveyed, and/or control signals conveyed during execution of an application.

The RF bus 1190 may be one or more of a free-space RF communication path 1096, a waveguide RF communication path 1098, and/or a dielectric RF communication path 1100. For example, the RF bus 1190 may include at least one data RF bus, at least one instruction RF bus, and at least one control RF bus for intra-IC RF communications 1192 and the inter-IC RF communications 1194. In this example, intra-IC RF data communications 1192 may occur over a free-space RF communication path 1096, while the intra-IC RF instruction and/or control communications 1192 may occur over a waveguide RF communication path 1098 and/or a dielectric RF communication path 1100 within the IC 1160 or 1162. Further, inter-IC RF data communications 1194 may occur over a free-space RF communication path, while the intra-IC RF instruction and/or control communications 1194 may occur over a waveguide RF communication path magnetic communication path and/or a dielectric RF communication path within a supporting substrate of the ICs 1160-1162. As an alternative example, the inter- and intra-IC communications 1192-1194 may occur over multiple waveguide RF communication paths, multiple dielectric RF communication paths, and/or multiple free-space RF communication paths (e.g., use different carrier frequencies, distributed frequency patterns, TDMA, FDMA, CDMA, etc.).

Figure 33:
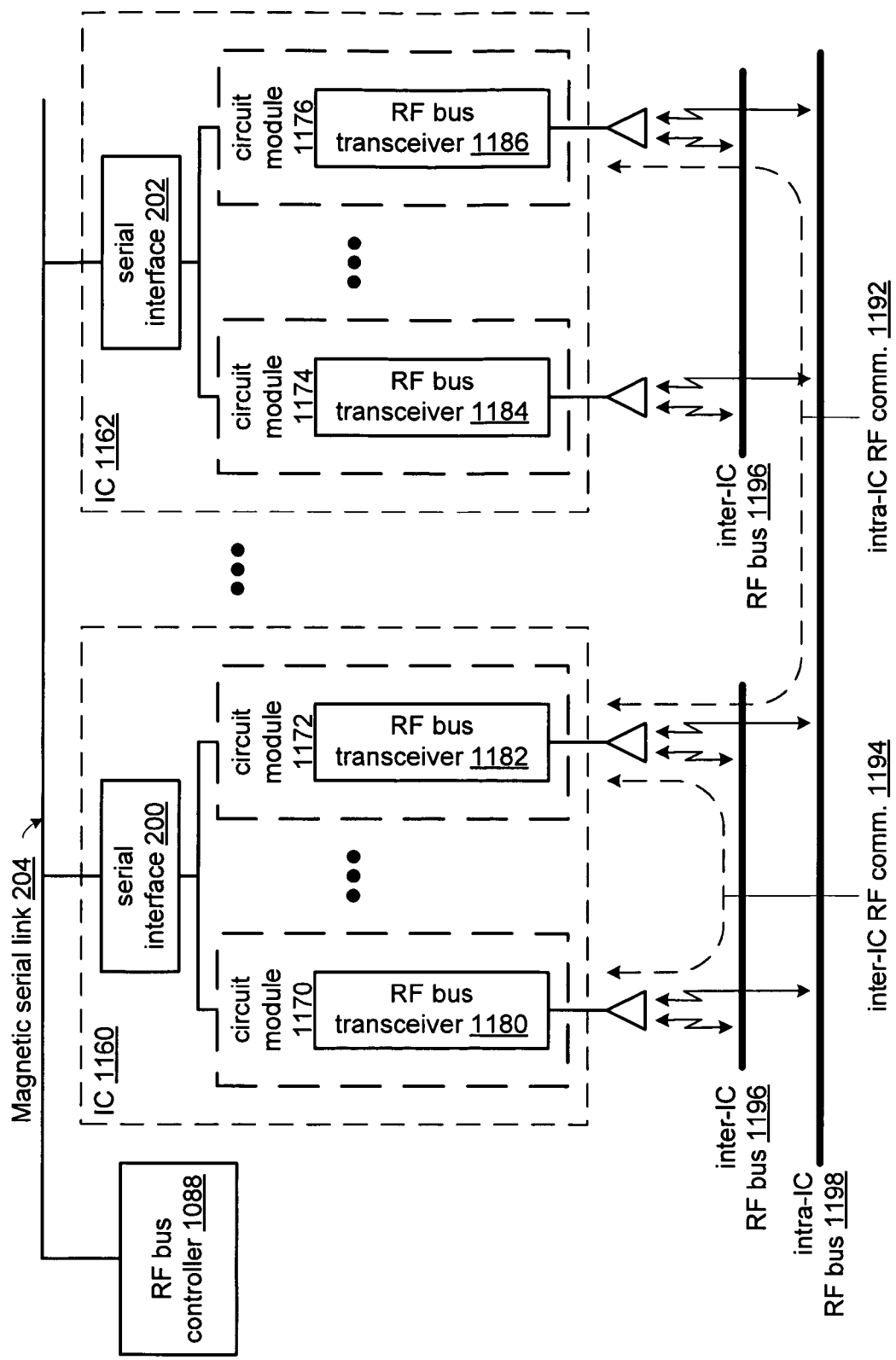

FIG. 33 is a schematic block diagram of another embodiment of the millimeter wave interface 1080 that interfaces a plurality of integrated circuits (ICs) 1160, 1162, and includes the RF bus controller 1088, a plurality of inter-IC RF buses 196, and an intra-IC RF bus 198. Each of the ICs 1160, 1162 includes a plurality of circuit modules 1170-1176 and a serial interface module 200-202. Each of the circuit modules 1170-1176 includes a radio frequency (RF) bus transceiver 1180-1186.

In this embodiment, the RF bus controller 1088 is coupled to the ICs 1160-1162 via a magnetic serial link 204 to control access to the inter-IC RF buses 1196 and to the intra-IC RF bus 1198. For instance, when a circuit module 1170-1176 has data to transmit to another circuit module 1170-1176 of the same IC or of a different IC, the requesting circuit module 1170-1176 provides an RF bus request to the RF bus controller 1088 via the wireline serial link 204 and the corresponding serial interface module 200-202. The serial link 204 and the corresponding serial interface modules 200-202 may be a standardized protocol, a de-facto standard protocol, or a proprietary protocol. For example, the serial link 204 may be implemented via two or more inductive interfaces such as inductive interfaces 22, 26.

The RF bus controller 1088 processes the RF bus request, as will be described in greater detail with reference to figures that follow, to determine at least one of whether the requester needs access to one of the plurality of inter-IC RF buses 1196 or to the intra-IC RF bus 1198, how much data it has to send, the type of the data, the location of the target circuit module (s), the priority of the requestor, the priority of the data, etc. When the RF bus controller 1088 has determined how and when the requestor is to access the RF bus 1196 and/or 1198, the RF bus controller 1088 provides an RF bus grant to the requester via the magnetic link 204.

As shown, the intra-IC RF bus 1198 supports intra-IC RF communications 1194 and the plurality of inter-IC RF buses 196 support corresponding inter-IC RF communications 1192. In this manner, multiple inter-IC RF communications 192 may be simultaneously occurring and may also occur simultaneously with one or more intra-IC RF communications 1194.

Figure 34:
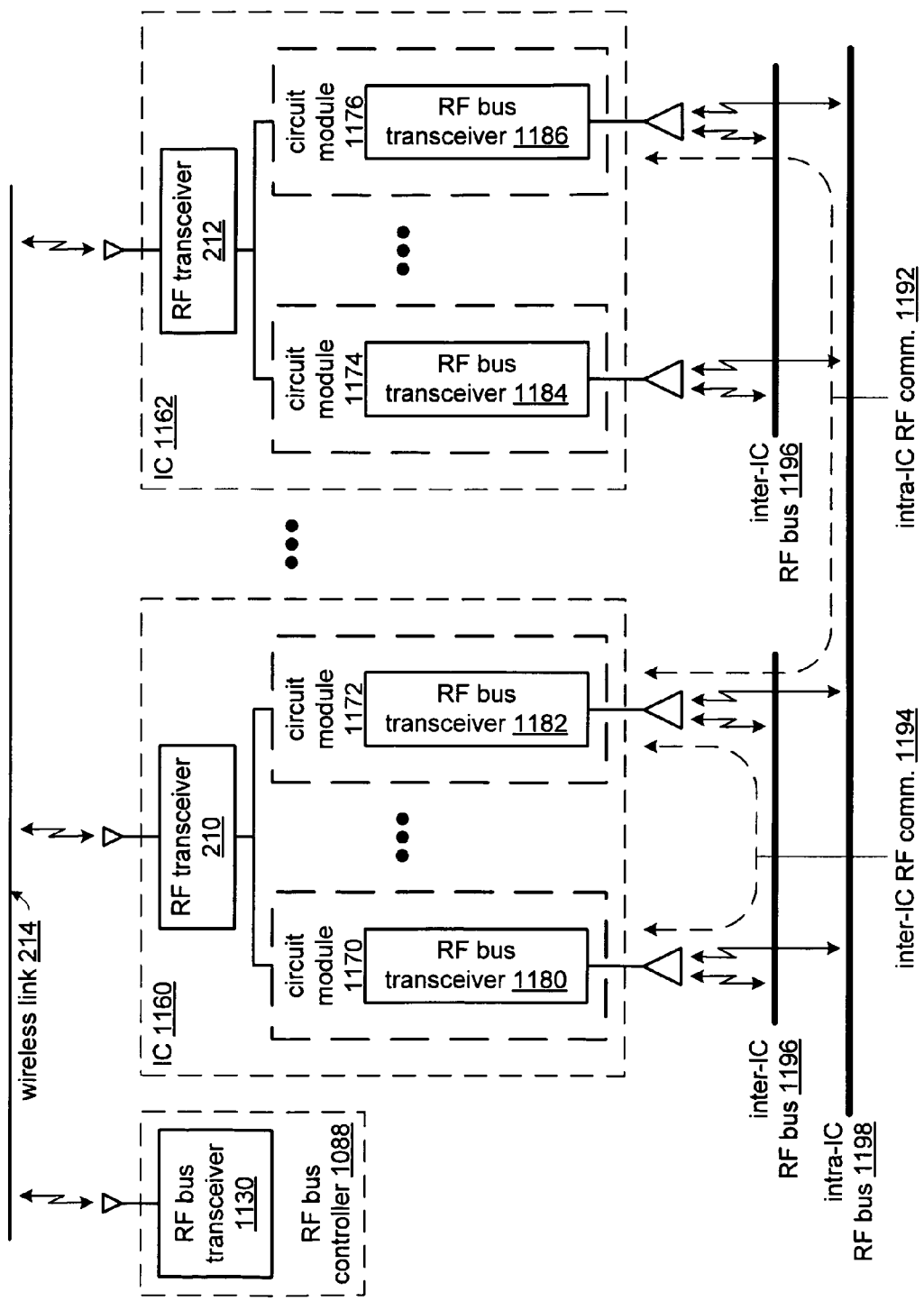

FIG. 34 is a schematic block diagram of another embodiment of RF interface 1080 that interfaces a plurality of integrated circuits (ICs) 1160, 1162, and includes the RF bus controller 1088, a plurality of inter-IC RF buses 1196, and an intra-IC RF bus 1198. Each of the ICs 1160, 1162 includes a plurality of circuit modules 1170-1176 and an RF transceiver 210-212. Each of the circuit modules 1170-1176 includes a radio frequency (RF) bus transceiver 1180-1186 and the RF bus controller 1088 includes the RF bus transceiver 1130.

In this embodiment, the RF bus controller 1088 is coupled to the ICs 1160-1162 via a wireless link 214 to control access to the inter-IC RF buses 1196 and to the intra-IC RF bus 1198. For instance, when a circuit module 1170-1176 has data to transmit to another circuit module 1170-1176 of the same IC or of a different IC, the requesting circuit module 1170-1176 provides an RF bus request to the RF bus controller 1088 via the wireless link 214 and the RF transceiver 210-212. The wireless link 214 and the corresponding RF transceivers 210-212 may be a standardized protocol, a de-facto standard protocol, or a proprietary protocol.

The RF bus controller 1088 processes the RF bus request, as will be described in greater detail with reference to Figures that follow, to determine at least one of whether the requestor needs access to one of the plurality of inter-IC RF buses 1196 or to the intra-IC RF bus 1198, how much data it has to send, the type of the data, the location of the target circuit module(s), the priority of the requestor, the priority of the data, etc. When the RF bus controller 1088 has determined how and when the requestor is to access the RF bus 1196 and/or 1198, the RF bus controller 1088 provides an RF bus grant to the requester via the wireless link 214.

In one embodiment, the RF bus transceiver 1130 operates within a first frequency band and the intra-IC RF communications 192 and the inter-IC RF communications 1194 occur within the first frequency band. In this instance, the RF bus controller 1088 allocates at least one communication slot to the wireless interface link 214, allocates at least one other communication slot for the intra-IC RF communications 1192, and allocates at least another communication slot for the inter-IC RF communications 1194. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the intra-IC RF communications 1192 occur within the first frequency band, and the inter-IC RF communications 1194 occur within a second frequency band. In this instance, the RF bus controller 1088 allocates at least one communication slot in the first frequency band to the wireless link 214 and allocates at least one other communication slot in the first frequency band for the intra-IC RF communications 192. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the inter-IC RF communications 1194 occur within the second frequency band, and the intra-IC RF communications 1192 occur within the frequency band. In this instance, the RF bus controller 1088 allocates at least one communication slot in the second frequency band to the wireless link 214 and allocates at least one other communication slot in the second frequency band for the inter-IC RF communications 194. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the intra-IC RF communications 1192 occur within the second frequency band, and the inter-IC RF communications 1194 occur within a third frequency band. With the different types of communication (e.g., RF bus access, inter-IC, and intra-IC) occurring within different frequency bands, the different types of communication may occur simultaneously with minimal interference from each other.

Figure 35:
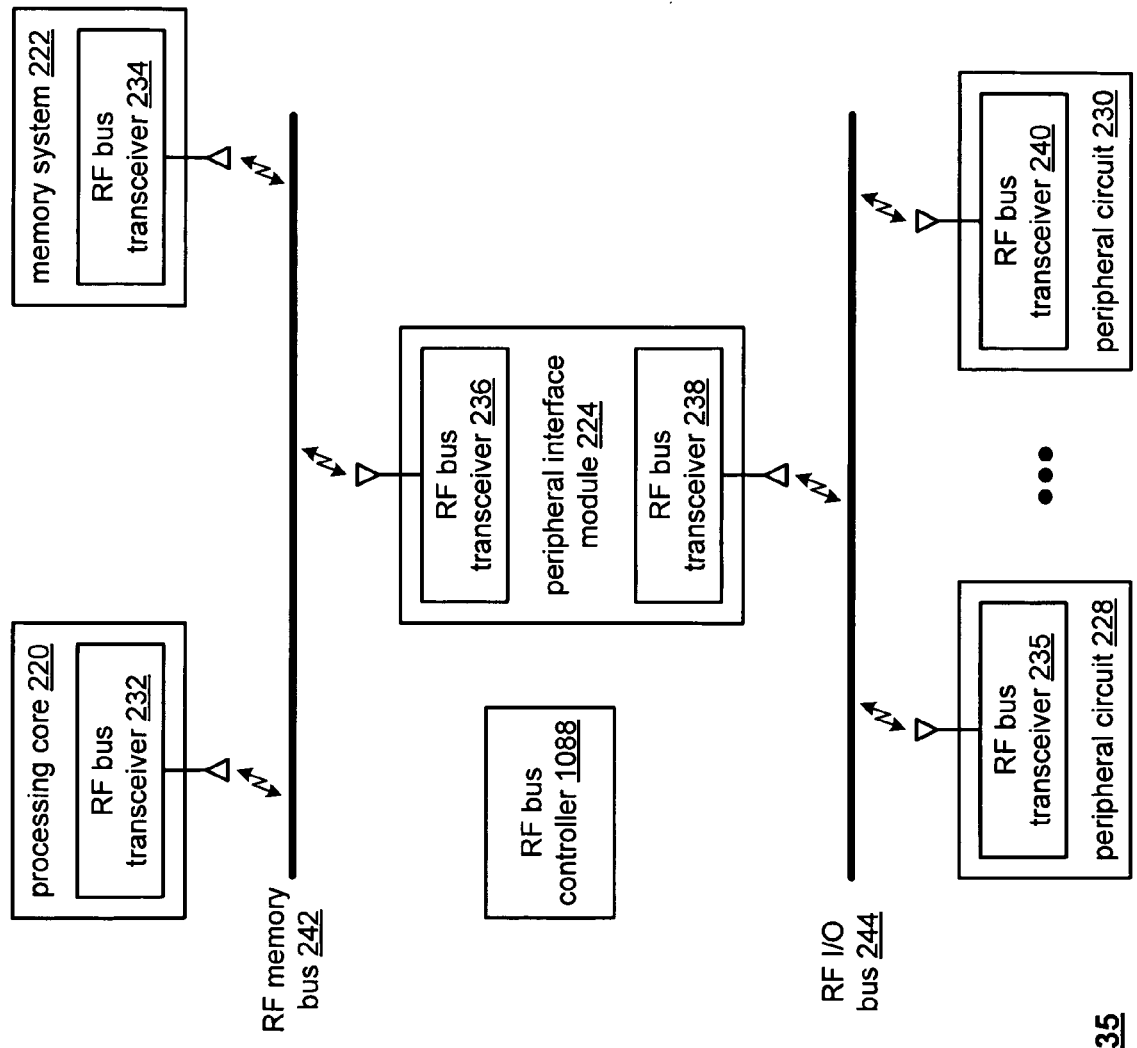

FIG. 35 is a schematic block diagram of another embodiment of the millimeter wave interface 1080 that includes the RF bus controller 1088, a processing core 220, a memory system 222, a peripheral interface module 224, a plurality of peripheral circuits 228-230, an RF memory bus 242, and an RF I/O bus 244. Each of the processing core 220, the memory system 222, the peripheral interface module 224, and the plurality of peripheral circuits 228-230 includes one or more RF bus transceivers 232-240. The plurality of peripheral circuits 228-230 includes two or more of a hard disk drive, a compact disk (CD) drive, a digital video disk (DVD) drive, a video card, an audio card, a wireline network card, a wireless network card, a universal subscriber identity module (USIM) interface and/or security identification module (SIM) card, a USB interface, a display interface, a secure digital input/output (SDIO) interface and/or secure digital (SD) card or multi-media card (MMC), a coprocessor interface and/or coprocessor, a wireless local area network (WLAN) interface and/or WLAN transceiver, a Bluetooth interface and/or Bluetooth transceiver, a frequency modulation (FM) interface and/or FM tuner, a keyboard interface and/or keyboard, a speaker interface and/or a speaker, a microphone interface and/or a microphone, a global positioning system (GPS) interface and/or a GPS receiver, a camera interface and/or an image sensor, a camcorder interface and/or a video sensor, a television (TV) interface and/or a TV tuner, a Universal Asynchronous Receiver-Transmitter (UART) interface, a Serial Peripheral Interface (SPI) interface, a pulse code modulation (PCM) interface, etc.

In this embodiment, the peripheral interface module 224 includes a first RF bus transceiver 236 and a second RF bus transceiver 238. The first RF bus transceiver 236 communicates via the RF memory bus 242 and the second RF bus transceiver communicates via the RF I/O bus 244. In this instance, the peripheral interface module 224 functions as an interface for one of the plurality of peripheral circuits 228-230 to communicate with the processing core 220 and/or the memory system 222 via the RF memory bus 242.

The RF bus controller 1088, which may be coupled to the processing core 220, the memory system 222 and the peripheral interface module 224 via a wireline serial link and/or a wireless link, controls access to the RF input/output bus 244 among the plurality of peripheral circuits 228-230 and the peripheral interface module 224 and controls access to the RF memory bus 242 among the processing core 220, the memory system 222, and the peripheral interface module 224. Note that the RF input/output bus 244 supports at least one of: RF peripheral data communications, RF peripheral instruction communications, and RF peripheral control signal communications, where the RF peripheral control signal communications includes an RF interrupt request communication, and/or an RF interrupt acknowledgement communication.

The RF memory bus 242 supports at least one of: RF memory data communications, RF memory instruction communications, and RF memory control signal communications. The RF memory bus may further support RF operating system level communications and RF application level communications.

FIG. 36 is a schematic block diagram of an embodiment of an RF transceiver device that includes a processing module 250, memory 252, a baseband processing module 254, an RF section 256, the RF bus controller 1088 and an RF bus 262. The processing module 250 includes a processing module RF bus transceiver 258 and the memory includes a memory RF bus transceiver 260. The processing module 250 and the baseband processing module 254 may be the same processing module or different processing modules, where a processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element (e.g., memory 252), which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 33-41.

The baseband processing module 254 is coupled to convert outbound data 264 into an outbound symbol stream 266. This may be done in accordance with one or more wireless communication protocols including, but not limited to, IEEE 802.11, Bluetooth, GSM, RFID, CDMA, Enhanced Data rates for GSM Evolution (EDGE), General Packet Radio Service (GPRS), new and/or current versions thereof, modifications thereof, extensions thereof, combinations thereof, new WLAN standards, new cellular voice and/or data standards, new wireless personal area networks (WPAN) or other protocol whether standard or not.

The RF section 256 converts the outbound symbol stream 266 into an outbound RF signal 268. In an embodiment, the RF section 256 includes a digital to analog conversion module, an up-conversion module, and a power amplifier module. The digital to analog conversion module converts the outbound symbol stream 266 into an analog symbol stream. The up-conversion module, which may be a direct conversion module or a superheterodyne module, mixes the analog symbol stream with a local oscillation to produce an up-converted signal. The power amplifier module amplifies the up-converted signal to produce the outbound RF signal 268. In another embodiment, the up-conversion module modulates phase of the local oscillation based on phase information of the analog symbol stream to produce the up-converted signal. The power amplifier module amplifies the up-converted signal based on a constant amplifier factor or based on amplitude modulation information of the analog symbol stream to produce the outbound RF signal 268.

The RF section 256 is also coupled to and to convert an inbound RF signal 270 into an inbound symbol stream 272. In one embodiment, the RF section 256 includes a low noise amplifier module, a down-conversion module, and an analog to digital conversion module. The low noise amplifier module amplifies the inbound RF signal 270 to produce an amplified inbound RF signal. The down conversion module, which may a direction conversion module or a superheterodyne module, mixes the amplified inbound RF signal with a local oscillation to produce an analog inbound symbol stream. The analog to digital conversion module converts the analog inbound symbol stream into the inbound symbol stream 272.

The baseband processing module 254 is also coupled to convert the inbound symbol stream 272 into inbound data 274. This may be done in accordance with one or more wireless communication protocols including, but not limited to, IEEE 802.11, Bluetooth, GSM, RFID, CDMA, Enhanced Data rates for GSM Evolution (EDGE), General Packet Radio Service (GPRS), new and/or current versions thereof, modifications thereof, extensions thereof, combinations thereof, new WLAN standards, new cellular voice and/or data standards, and/or new wireless personal area networks (WPAN). Note that the inbound and outbound data 264, 274 may be voice signals, audio signals, video signals, text signals, graphics signals, short messaging signals, cellular data signals, etc.

The RF bus controller 1088 is coupled to control access to the RF bus 262, which may include one or more waveguide RF communication paths, one or more dielectric RF communication paths, one or more magnetic communication paths and/or one or more free-space RF communication paths. In one embodiment, the processing module 250 generates the outbound data 264, which is converted into an RF bus outbound data signal 278 by the RF bus transceiver 258. The RF bus controller 1088 controls conveyance of the RF bus outbound data signal 278 on the RF bus 262. In another embodiment, the memory 252 provides the outbound data 264, which is converted into the RF bus outbound data signal 278 by the RF bus transceiver 260.

The RF bus controller 1088 further functions to control access to the RF bus 262 for providing the inbound data 274 as an RF bus inbound data signal 276 to the processing module RF bus transceiver 258 or to the memory RF bus transceiver 260. Note that in an embodiment of the RF transceiver device, the baseband processing module 254 is coupled to the RF section 256 via a wireless digital-RF interface.

FIG. 37 is a schematic block diagram of an embodiment of an RF transceiver device that includes a processing module 250, memory 252, a baseband processing module 254, an RF section 256, the RF bus controller 1088 and an RF bus 262. The processing module 250 includes a processing module RF bus transceiver 258 and the memory includes a memory RF bus transceiver 260. In this embodiment, the baseband processing module 254 includes an RF bus transceiver 280, which converts the inbound data 274 into the RF bus inbound data signal 276 and converts the RF bus outbound data signal 278 into the outbound data 264.

FIG. 38 is a schematic block diagram of an embodiment of an RF transceiver device that includes a processing module 250, memory 252, a baseband processing module 254, an RF section 256, the RF bus controller 1088 and an RF bus 262. The processing module 250 includes a processing module RF bus transceiver 258 and the memory includes a memory RF bus transceiver 260. In this embodiment, the RF section 256 receives the RF bus outbound data signal 278 and converts it into a baseband (BB) or near baseband outbound data signal 290, which has a carrier frequency of 0 Hz to a few MHz. Note that the RF section 256 may be coupled to multiple antennas and/or coils (as shown) or may be coupled to a single antenna/coil.

The baseband processing module 254 converts the baseband or near baseband outbound data signal 290 into the outbound data 264 in accordance with a standardized wireless communication protocol (e.g., GSM, EDGE, GPRS, CDMA, IEEE 802.11 Bluetooth), a modified standard wireless communication protocol (e.g., a modified version of GSM, EDGE, GPRS, CDMA, IEEE 802.11 Bluetooth), or a proprietary wireless communication protocol (e.g., non-return to zero encode/decode, bi-phase encode/decode). The baseband processing module 254 then converts the outbound data 264 into the outbound symbol stream 266, which is converted into the outbound RF signal 268 by the RF section 256.

The RF section 256 receives the inbound RF signal 270 and converts it into the inbound symbol stream 272. The baseband processing module 254 converts the inbound symbol stream 272 into the inbound data 274 and then converts the inbound data 274 into a baseband or near baseband inbound data signal 292. The RF section 256 converts the baseband or near baseband inbound data signal 292 into the RF bus inbound data signal 276. Note that in an embodiment the baseband processing module converts the outbound data 264 into the outbound symbol stream 266 and converts the inbound symbol stream 272 into the inbound data 274 in accordance with one or more of a wireless personal area network (WPAN) protocol (e.g., Bluetooth), a wireless local area network (WLAN) protocol (e.g., IEEE 802.11), a cellular telephone voice protocol (e.g., GSM, CDMA), a cellular telephone data protocol (e.g., EDGE, GPRS), an audio broadcast protocol (e.g., AM/FM radio), and a video broadcast protocol (e.g., television).

In the various embodiments of an RF transceiver device as discussed with reference to FIGS. 36-38, the inbound and outbound RF signals 268 and 270 may be in the same frequency band or a different frequency band than the RF bus inbound and outbound data signals 276 and 278. For example, the inbound and outbound RF signals 268 and 270 may have a carrier frequency in a 2.4 GHz or 5 GHz frequency band while the RF bus inbound and outbound data signals 276 and 278 may have a carrier frequency in a 60 GHz frequency band. As another example, the inbound and outbound RF signals 268 and 270 and the RF bus inbound and outbound data signals 276 and 278 may have a carrier frequency in a 60 GHz frequency band. When the signals 268, 270, 276, and 278 are in the same frequency band, the frequency band may be shared to minimize interference between the different signals.

FIG. 39 is a diagram of an example of a frame of an RF transceiver device wireless communication that shares a frequency band and minimizes interference between the different signals 268, 270, 276, and 278. In this example, the frame includes an inbound RF signal slot 300, an RF bus inbound data signal slot 302, an RF bus outbound data signal 304, and an outbound RF signal 306. The slots 300-306 may be TDMA slots, CDMA slots, or FDMA slots, which may be reallocated on a frame by frame basis by the RF bus controller 1088. For example, the processing module 250 and/or the baseband processing module 254 may request one or more slots from the RF bus controller 1088 for the inbound RF signal 270, the outbound RF signal 268, the RF bus inbound data signal 276, and/or the RF bus outbound data signal 278. Note that the frame may include an additional slot for bus access communications if the RF bus requests and RF bus grants are communicated wirelessly within the same frequency band as the signals 268, 270, 276, and 278.

FIG. 37 is a logic diagram of an embodiment of a method of resource allocation for an intra-device wireless communication that begins at step 1310 where the processing module 250 and/or the baseband processing module 254 determine a potential overlapping of one of the RF bus inbound data signal 276 and the RF bus outbound data signal 278 with one of the inbound RF signal 270 and the outbound RF signal 268. In this embodiment, the signals 268, 270, 276, and 278 may be transmitted and/or received at any time without a structured ordering of the signals (in other words, the signals do not have allocated slots). If a potential overlap is not detected (i.e., the transmission or reception of one signal will not interfere with the transmission or reception of another signal), the process proceeds to step 1312 where the RF bus communication (e.g., the RF bus inbound or outbound data signal 276 or 278) or the inbound or outbound RF signal 270 or 268 is transmitted or received.

If a potential overlap is detected, the process proceeds to step 1314 where the frequency and/or phase of the RF bus inbound data signal 276 and/or of the RF bus outbound data signal 278 is adjusted. For example, if a potential overlap is detected, the phase of the RF bus communications (e.g., signals 276 or 278) may be adjusted to be orthogonal with the inbound or outbound RF signals 270 or 268 thereby substantially reducing the received signal strength of the orthogonal signal. As another example, the carrier frequency may be adjusted by a frequency offset such that it has a different carrier frequency than the inbound or outbound RF signal 270 or 268.

The process then proceeds to step 1316 where blocking of the inbound RF signal 270 or the outbound RF signal 268 for the RF bus communication is enabled. As such, by adjusting the phase and/or frequency of the RF bus communication, the inbound or outbound RF signal 270 or 268 may be treated as an interferer with respect to the RF bus communications that can be substantially blocked. Thus, if a potential overlap exists, the RF bus communications are adjusted such that they experience acceptable levels of interference from the inbound or outbound RF signals.

FIG. 41 is a diagram of another example of a frame of an RF transceiver device wireless communication that shares a frequency band and minimizes interference between the different signals 268, 270, 276, and 278. In this example, the frame includes the inbound RF signal slot 1300; an outbound RF signal, an RF bus inbound data signal, or composite signal slot 1320, and the RF bus outbound data signal 1304. The slots 1300, 1320, and 1304 may be TDMA slots, CDMA slots, or FDMA slots, which may be reallocated on a frame by frame basis by the RF bus controller 1088. Note that the frame may include an additional slot for bus access communications if the RF bus requests and RF bus grants are communicated wirelessly within the same frequency band as the signals 268, 270, 276, and 278.

In this example, the baseband processing module 254 processes the data for the outbound RF signal 268 and the RF bus inbound data signal 276. As such, the baseband processing module 254 has knowledge of which signal it is processing and thus can request allocation of a resource for the appropriate signal (e.g., 268 or 276). In addition, the baseband processing module 254 may simultaneously process the data for the outbound RF signal 268 and the RF bus inbound data signal 276 via a composite signal.

FIG. 42 is a diagram of an example of mapping data of an RF transceiver device wireless communication into a composite signal. In this example, the baseband processing module 254 combines bits 322 of the outbound data 264 and bits 1324 of the inbound data 274 to produce composite data. In this example, the bits 1322 of the outbound data 264 are least significant bits of the composite data and the bits 324 of the inbound data 274 are most significant bits of the composite data. The baseband processing module then encodes the composite data to produce encoded data; interleaves the encoded data to produce interleaved data; maps the interleaved data to produce mapped data; and converts the mapped data from the frequency domain to the time domain to produce a baseband or near baseband composite outbound data signal. The RF section 256 converts the baseband or near baseband composite outbound data signal into a composite outbound RF signal, wherein the composite outbound RF signal includes the outbound RF signal 268 and the RF bus inbound data signal 276.

The RF bus transceiver 258 or 260 receives the composite outbound RF signal, converts it into the baseband or near baseband composite outbound data signal. A baseband processing module within the RF bus transceiver 258 or 260 converts the baseband or near baseband composite outbound data signal from the time domain to the frequency domain to produce the mapped data; demaps the mapped data to produce interleaved data; deinterleaves the interleaved data to produce encoded data; and decodes the encoded data to produce the inbound data 274 and outbound data 264. The RF bus transceiver 258 or 260 is programmed to ignore the outbound data 264 bits of the composite data such that the resulting recovered data from the composite outbound RF signal is the inbound data 274.

An RF transceiver within the target of the outbound RF signal 268 treats the composite outbound RF signal as a lower mapped rate outbound RF signal. As shown, the composite data is mapped using a 16 QAM (quadrature amplitude mapping scheme). A first quadrant has mapped bits of 0000, 0001, 0010, and 0011; a second quadrant has mapped bits of 0100, 0101, 0110, and 0111; a third quadrant has mapped bits of 1100, 1101, 1110, and 1111; and a fourth quadrant has mapped bits of 1000, 1001, 1010, and 1011. If the RF transceiver within the target uses a QPSK (quadrature phase shift keying), if the composite signal is within the first quadrant, the RF transceiver will interpret this as a mapped value of 00, if the composite signal is within the second quadrant, the RF transceiver will interpret this as a mapped value of 01, if the composite signal is within the third quadrant, the RF transceiver will interpret this as a mapped value of 11, and if the composite signal is within the fourth quadrant, the RF transceiver will interpret this as a mapped value of 10.

In general, since the RF bus transceivers should experience significantly greater signal integrity than the RF transceiver within the target, the RF bus transceivers can operate at a higher mapping rate than the RF transceiver within the target. As such, the baseband processing module may convert the bits 1322 of the outbound data 264 and the bits 1324 of the inbound data 274 into the baseband or near baseband composite outbound data signal using one of N-QAM (quadrature amplitude modulation) and N-PSK (phase shift keying), wherein N equals $2^x$ and x equals the number of bits of the outbound data 264 plus the number of bits of the inbound data 274.

FIG. 43 is a schematic block diagram of another embodiment of an RF transceiver device that includes a processing module 250, memory 252, a baseband processing module 254, an RF section 256, the RF bus controller 1088, an RF bus 262, a peripheral interface module 224, an RF I/O bus 244, and a plurality of peripheral circuits 228-230. Each of the processing module 250, the memory 242, the peripheral interface module 224, and the peripheral circuits 228-230 includes at least one RF bus transceiver 235, 236, 238, 240, 258, and 260.

In this embodiment, a dual bus structure is shown where the RF bus controller 1088 controls access to the RF bus 262 for providing the RF bus outbound data signal 278 from one of the processing module RF bus transceiver 258, the memory RF bus transceiver 260, and the peripheral interface RF bus transceiver 236. The RF bus controller 1088 also controls access to the RF bus 262 for providing the RF bus inbound data signal 276 to one of the processing module RF bus transceiver 258, the memory RF bus transceiver 260, and the peripheral interface RF bus transceiver 236.

The RF bus controller 1088 further controls access to a peripheral I/O RF bus 244 among a plurality of peripheral circuits 228-230. In an embodiment, when access is granted to one of the plurality of peripheral circuits 228-230, it provides an inbound RF peripheral data signal to the peripheral interface RF bus transceiver 238 or receives an outbound RF peripheral data signal from the peripheral interface RF bus transceiver 238. The inbound or outbound RF peripheral data signal may data from the processing module 250, may be data from the memory 252, may be the RF bus inbound data signal 276, may be the RF bus outbound data signal 278, may be the inbound data 274, and/or may be the outbound data 264. It should be noted that the RF bus 262 and RF I/O bus 244 can be implemented with different technologies as well as different frequencies. In one example, the RF bus 262 can operate using inductive coupling and one or more magnetic communication path and RF I/O bus 244 can operate using one or more millimeter wave communication paths. Other examples are likewise possible.

FIG. 44 is a schematic block diagram of another embodiment of an RF transceiver device that includes a processing module 1330, memory 1332, a baseband processing module 254, an RF section 256, the RF bus controller 1088, a bus structure 1334, a peripheral interface module 224, an external RF bus 1336, and a plurality of peripheral circuits 228-230. Each of the peripheral interface module 224 and the peripheral circuits 228-230 includes at least one RF bus transceiver 235, 238, and 240. The processing module 1330 and the baseband processing module 254 may be the same processing module or different processing modules, where a processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element (e.g., memory 332), which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In this embodiment, the processing module 1330, the memory 1332, the baseband processing module 254, and the peripheral interface module 224 are coupled together via a bus structure 1334, which may be an advanced high-performance (AHB) bus matrix. As such, data between these modules occurs with the bus. The peripheral interface module 224 is coupled to the plurality of peripheral circuits 228-230 via the external RF bus 1336, which may be one or more waveguide RF communication paths, one or more dielectric RF communication paths, one or more magnetic communication paths and/or one or more free-space RF communication paths.

In this instance, the RF bus controller 1088 controls access the external RF bus 336 among a plurality of peripheral circuits 228-230. In an embodiment, when access is granted to one of the plurality of peripheral circuits 228-230, it provides an inbound RF peripheral data signal to the peripheral interface RF bus transceiver 238 or receives an outbound RF peripheral data signal from the peripheral interface RF bus transceiver 238. The inbound or outbound RF peripheral data signal may data from the processing module 1330, may be data from the memory 1332, may the inbound data 274, and/or may be the outbound data 264.

FIG. 45 is a schematic block diagram of another embodiment of an RFID system that includes at least one RFID transceiver, at least one RFID tag, and a network connection module 1352. The RFID reader 1054 includes a reader processing module 340, an RFID transceiver 1342, and an RF bus transceiver 1344. The RFID tag 1060 includes a power recovery module 1346, a tag processing module 1348, and a transmit section 1350. The network connection module 1352 includes an RF bus transceiver 1354.

The reader processing module 1340 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In an embodiment, reader processing module 1340 encodes outbound RFID data 1356 to produce outbound RFID encoded data 1358. The encoding may be done in accordance with an RFID protocol such as FM0, FM1, etc., may be a modified RFID protocol, and/or a proprietary protocol. Note that the reader processing module 1340 may generate the outbound RFID data 1356 or receive it from the network connection module 1352 via the RF bus 1374. Further note that the outbound RFID data 1356 may be a request for status information from one or more RFID tags, may be data for storage and/or processing by one or more RFID tags, may be commands to be performed by one or more RFID tags, etc.

The RFID transceiver 1342 is coupled to convert the outbound RFID encoded data 358 into an outbound RF RFID signal 1360. One or more of the RFID tags 1060 receives the outbound RF RFID signal 1360 via an antenna coupled to the power recovery module 1346. The power recovery module 1346 is coupled to produce a supply voltage (Vdd) 1362 from the outbound RF RFID signal 1360 and to produce a received RF RFID signal 1364.

The tag processing module 1348 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

The tag processing module 1348 is coupled to recover the outbound RFID data 1356 from the received RF RFID signal 1364 and to generate tag RFID data 1366 in response thereto. The tag RFID data 1366 may be response to an inquiry, may be an acknowledgement of data storage, may be an acknowledgement of a program update, and/or may be an acknowledgement of completion of execution of a command. The transmit section 1350 is coupled to convert the tag RFID data 1366 into and inbound RF RFID signal 1368 using a backscatter technique or some other RF modulation protocol.

The RFID transceiver 1342 is further coupled to convert the inbound RF RFID signal 1368 into inbound RFID encoded data 1370. In one embodiment, the RFID transceiver 1342 includes a transmitter section and a receiver section.

The reader processing module 1340 decodes the inbound RFID encoded data 1370 to produce inbound RFID data 1372. The decoding may be done in accordance with an RFID protocol such as FM0, FM1, etc., may be a modified RFID protocol, and/or a proprietary protocol.

In an embodiment, the reader RF bus transceiver 1344 exchanges at least one of the inbound RFID data 1372 and the outbound RFID data 1356 with the network RF bus transceiver 1354 via the RF bus 1374. Note that the RF bus 1374 may be one or more waveguide RF communication paths, one or more dielectric RF communication paths, one or more magnetic communication paths and/or one or more free-space RF communication paths.

In one embodiment of the RFID system, the inbound and outbound RF RFID signals 1360 and 1368 have a carrier frequency in a first frequency band and the RF bus 374 supports RF bus communications having a carrier frequency in a second frequency band. For example, the first or the second frequency band may be a 60 GHz frequency band. In this instance, the RFID communications and the RF bus communications provide little interference for one another.

FIG. 46 is a schematic block diagram of another embodiment of an RFID system that includes a network connection module 1352, an RF bus 1372, and an RF bus controller 1088. Each of the RFID readers 1454-1458 includes the RFID transceiver 342 and the RF bus transceiver 1344. The network connection module 1352 includes the RF bus transceiver 1354 and a WLAN (wireless local area network) or WPAN (wireless personal area network) transceiver 1380.

In an embodiment, the RF bus controller 1088 controls access to carrier frequencies within a frequency band, wherein the inbound and outbound RF RFID signals 1360 and 1368 having a carrier frequency within the frequency band and the RF bus 1374 supports RF bus communications having a carrier frequency within the frequency band.

In another embodiment, the inbound and outbound RF RFID signals 1360 and 1368 have a carrier frequency in a first frequency band. The RF bus 1374 supports RF bus communications having a carrier frequency in a second frequency band. The WLAN transceiver 1380 transceives RF signals having a carrier frequency in a third frequency band, wherein the first, second or the third frequency bands is within a 60 GHz or other millimeter wave frequency band.

In another embodiment, the inbound and outbound RF RFID signals 1360 and 1368 have a carrier frequency within a frequency band and the RF bus 1374 supports RF bus communications having the carrier frequency within the same frequency band. The WLAN transceiver 1380 transceives RF signals having a carrier frequency outside of the frequency band. In this instance, the RF bus controller 1088 controls access to carrier frequencies within the frequency band using a TDMA allocation, an FDMA allocation, a CDMA allocation, a CSMA with collision avoidance scheme, a polling-response scheme, a token passing scheme, and/or a combination thereof.

In another embodiment, the inbound and outbound RF RFID signals 1360 and 1368 have a carrier frequency within a frequency band, the RF bus 1374 supports RF bus communications having a carrier frequency within the frequency band, and the WLAN transceiver 1380 transceives RF signals having a carrier frequency within the frequency band. In this instance, the RF bus controller 1088 controls access to carrier frequencies within the frequency band using a TDMA allocation, an FDMA allocation, a CDMA allocation, a CSMA with collision avoidance scheme, a polling-response scheme, a token passing scheme, and/or a combination thereof.

FIG. 47 is a schematic block diagram of an embodiment of an RFID reader 1054 that includes a processing module 390, a transmitter section 392, and a receiver section 394. The processing module 390 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the processing module 390 is coupled to encode tag inquiry data 408 to produce encoded tag inquiry data 410. The encoding may be done in accordance with an RFID protocol such as FM0, FM1, etc., may be a modified RFID protocol, and/or a proprietary protocol. Note that the processing module 390 may generate the tag inquiry data 408 or receive it from a network connection module 352 via the RF bus 374. Further note that the tag inquiry data 408 may be a request for status information from one or more RFID tags, may be data for storage and/or processing by one or more RFID tags, may be commands to be performed by one or more RFID tags, etc.

For the processing module 390 to receive the tag inquiry data 408 from the network connection module 352, the network connection module 352 generates the data 408 and the RF bus transceiver 354 converts it into an inbound RF bus signal 402. The receiver section 394, which will be described in greater detail with reference to FIG. 29, converts the inbound RF bus signal 402 into inbound RF bus encoded data 404. The processing module 390 decodes the inbound RF bus encoded data 404 to produce inbound RF bus data 406, which, in this example, is the tag inquiry data 408. Note that other data may be received from the network connection module 352 in this manner.

The transmitter section 392 is coupled to convert the encoded tag inquiry data 410 into an outbound RF tag inquiry signal 412. If the tag inquiry data 408 instructs the RFID tag to respond, the receiver section 394 receives the inbound RF tag response signal 414.

The receiver section 394 converts the inbound RF tag response signal 414 into encoded tag response data 416. The processing module 390 decodes the encoded tag response data 416 to recover the tag response data 418. If the tag response data 418 is to be provided to the network connection module 352, the processing module 390 utilizes the tag response data 418 as the outbound RF bus data 396 and encodes the outbound RF bus data 396 to produce outbound RF bus encoded data 398.

The transmitter section 392 converts the outbound RF bus encoded data 398 into an outbound RF bus signal 400. The network connection module 352 receives the outbound RF bus signal 400 via the RF bus and its RF bus transceiver 354. Note that other data may be transmitted to the network connection module 352 in this manner.

In an embodiment, the processing module 390 further functions to arbitrate between RF bus communications (e.g., inbound and outbound RF bus signals 400 and 402) and RFID tag communications (e.g., outbound RF tag inquiry signal 412 and inbound RF tag response signal 414). In this manner, interference between the RF bus communications and the RFID tag communications is minimal. Note that in an embodiment, the RF bus communications and the RFID tag communications having a carrier frequency in a 60 GHz frequency band or a frequency band used for inductive coupling between one or more devices.

FIG. 48 is a schematic block diagram of another embodiment of a device that includes a plurality of integrated circuits (ICs) 500-502 and an RF bus structure 528. Each of the plurality of ICs 500-502 includes a plurality of circuit modules 504-506, 508-510, a switching module 512, 514, an RF bus transceiver 516, 518, an antenna interface 520, 522, and an antenna structure 534, 526 such as a coil or other antenna. The circuit modules 504-510 may be any type of digital circuit, analog circuit, logic circuit, and/or processing circuit. For example, one of the circuit modules 504-510 may be, but is not limited to, a microprocessor, a component of a microprocessor, cache memory, read only memory, random access memory, programmable logic, digital signal processor, logic gate, amplifier, multiplier, adder, multiplexer, etc.

In this embodiment, the circuit modules 504-506 and 508-510 of an IC 500, 502 share an RF bus transceiver 516, 518 for external IC communications (e.g., intra-device communications and/or inter-IC communications) and communicate via the switching module 512, 514 for internal IC communications (e.g., intra-IC communications). The switching module 512, 514 may include a wireline bus structure (e.g., AHB) and a plurality of switches, multiplexers, demultiplexers, gates, etc. to control access to the wireline bus structure and/or access to the RF bus transceiver.

The antenna interface 520, 522 may include one or more of a transformer balun, an impedance matching circuit, and a transmission line to provide a desired impedance, frequency response, tuning, etc. for the antenna structure 524, 526. The antenna structure 524, 526 may be implemented as described in co-pending patent application entitled AN INTEGRATED CIRCUIT ANTENNA STRUCTURE, having a filing date of Dec. 29, 2006, and a Ser. No. 11/648,826.

The RF bus structure 528, which may be one or more waveguide RF communication paths, one or more dielectric RF communication paths, magnetic communication paths and/or one or more free-space RF communication paths, receives outbound RF bus signal from the antenna structure 524, 526 and provides it to the antenna structure 524, 526 of another one of the plurality of ICs 500-502.

In an embodiment, the switching module 512, 514 performs the method of FIG. 49 to control internal IC communications and external IC communications. The method begins at step 530 where the switching module 512, 514 receives an outbound bus communication from one of the plurality of circuit modules 504-510. The process then proceeds to step 532 where the switching module 512, 514 determines whether the outbound bus communication is an internal IC communication or an external IC communication.

When the outbound bus communication is an internal IC communication, the process proceeds to step 534 where the switching module 512, 514 provides the outbound bus communication to another one of the plurality of circuit modules 504-506, 508-510. In this instance, the switching module 512, 514 utilizes the wireline bus structure and the appropriate switches, multiplexers, etc. to couple one circuit module 504 to the other 506 for the conveyance of the outbound bus communication.

When the outbound bus communication is an external IC communication, the switching module 512, 514 outputs the outbound bus communication to the RF bus transceiver 516, 518, which converts the outbound bus communication into an outbound RF bus signal. The antenna interface and the antenna structure provide the outbound RF bus signal to the RF bus structure 528 for conveyance to another circuit module of another IC.

For an inbound RF bus signal, the antenna structure 524, 526 receives the inbound RF bus signal from the RF bus structure 528 and provides it to the RF bus transceiver 516, 518 via the antenna interface 520, 522. The RF bus transceiver 516, 518 converts the inbound RF bus signal into an inbound bus communication. The switching module 512, 514 interprets the inbound bus communication and provides it to the addressed circuit module or modules.

FIG. 50 is a schematic block diagram of an embodiment of an RF bus controller 1088 that includes an interface 730 and a processing module 732. The processing module 732 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 732 may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module 732 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module 732 executes, hard coded and/or operational instructions corresponding to at least some of the steps and/or functions illustrated in FIGS. 51-61.

The interface 730 may be a wireline interface (e.g., an Ethernet connection, a USB connection, an I2C connection, an I2S connection, or any other type of serial interface) or a wireless interface (e.g., WLAN, WPAN, Intra-device communication, etc.) If the interface 730 is a wireless interface, it may include a transceiver module to access a control RF communication path having a different frequency than a frequency of the RF bus, a transceiver module to access a control time slot of a time division multiple access partitioning of the RF bus, a transceiver module to access a control frequency slot of a frequency division multiple access partitioning of the RF bus, or a transceiver module to access the RF bus for communicating the intra-device RF bus access requests and allocations via a carrier sense multiple access (CSMA) protocol. Regardless of the type of interface, the interface 732 is coupled for communicating intra-device RF bus access requests and allocations.

FIG. 51 is a logic diagram of method for controlling access to an RF bus that is performed by the RF bus controller 1088. The method begins at step 734 where the RF Bus controller 1088 receives an access request to an RF bus via the interface 730. The access request may be received in a variety of ways. For example, the access request may be received in response to a polling request, in an allocated time division multiple access (TDMA) slot, in response to a token ring passing scheme, in accordance with a carrier sense multiple access (CSMA) protocol of a RF bus control resource, in accordance with an interrupt protocol, in an allocated frequency division multiple access (FDMA) slot, and/or in an allocated code division multiple access (CDMA) slot.

The method continues at step 736 where the RF bus controller 1088 determines RF bus resource availability. This step may also include determining an RF bus protocol based on the access request. The RF bus protocol may be a standardized wireless protocol (e.g., GSM, EDGE, GPRS, IEEE 802.11, Bluetooth, etc), a proprietary wireless protocol, and/or a modified standardized wireless protocol (based on one of the standard protocols but modified, for instance, using an IEEE 802.11 protocol but skipping the interleaving).

The method branches at step 738 based on whether sufficient RF bus resources are availability. When sufficient RF bus resources are available, the process proceeds to step 740 where the RF bus controller allocates, via the interface, at least one RF bus resource in response to the access request. Note that the RF bus resources include, but are not limited to, a Single Input Single Output (SISO) channel, a Multiple Input Multiple Output (MIMO) channel, multiple SISO channels, multiple MIMO channels, null-reinforce multipath patterning (e.g., use multipath reinforced areas for RF bus communications between two ICs and multipath nulls to block RF bus communications between two ICs), frequency band selection, a TDMA slot, a CDMA slot, an FDMA slot, an unused free-space RF communication path or channel, an unused waveguide RF communication path or channel, an unused dielectric RF communication path or channel, and/or any other medium or portioning scheme for transmitting RF signals.

When sufficient RF bus resources are not available, the method proceeds to step 742 where the RF bus controller 1088 determining what RF bus resources are available. The method then proceeds to step 744 where the RF bus controller determines whether the access request can be adequately accommodated by the available RF bus resources. In other words, optimal servicing of the original resource request would require a certain level of RF bus resource allocation based on the amount of data to be transmitted, the type of data being transmitted, the requestor of the RF bus access, the target(s) of the data, etc. In this instance, the optimal amount of RF bus resources is not available, but there are some resources available and the RF bus controller is determining whether this less than optimal amount of RF bus resources can adequately accommodate (e.g., less than optimal, but acceptable) the request. For example, assume that for a particular RF bus access request, the optimal amount of RF bus resources supports a data transfer rate of 100 Mega-bits per second, but that the available RF bus resources can only accommodate 66 Mega-bits per second. In this example, the RF bus controller 1088 will determine whether the 66 Mbps rate will accommodate the request (i.e., won't suffer loss of data integrity, loss of data continuity, etc.).

When the access request can be accommodated by the available RF bus resources, the method proceeds to step 746 where the RF bus controller 1088 allocates the available RF bus resources to for the access request. If, however, the access request cannot be accommodated by the available RF bus resources, the method proceeds to step 748 where the RF bus controller queues the access request.

FIG. 52 is a diagram of another embodiment of a frame 750 of an RF bus communication that includes a request control slot 752, an allocation control slot 754, and a data slot(s) 756. In this embodiment, the slots 752-756 may be TDMA slots, FDMA slots, or CDMA slots on a single channel or multiple channels. Access to the request control slot 752 be allocated to the requesting ICs or circuit modules by the RF bus controller 1088 in a round robin manner, in a poll-request manner, in a CSMA with collision avoidance manner, etc.

In this embodiment, when an IC or circuit module has data to transmit via an RF bus (e.g., intra-IC RF bus and/or inter-IC RF bus), the requesting IC or circuit module provides its request within the request control slot 752. The requesting IC or circuit module waits until it detects an RF bus grant from the RF bus controller via the allocation control slot 754. The RF bus grant will indicate the RF bus resources being allocated, the duration of the allocation, etc. and may further include an indication of the RF bus protocol to be used. Once the requesting IC or circuit module has been granted access, it transmits its data via the allocated RF bus resources during the appropriate data slots 756.

FIG. 53 is a logic diagram of method for determining RF bus resource availability of step 736 of FIG. 65. This method begins at step 760 where the RF bus controller determines transmission requirements of the access request, RF bus capabilities of requestor, and/or RF bus capabilities of target. The transmission requirements include one or more of amount of information to be conveyed, priority level of requestor (e.g., application level priority, operating system level priority, continuous data priority, discontinuous data priority, etc.), priority level of the information to be conveyed (e.g., application data, interrupt data, operating system data, etc.), real-time or non-real-time aspect of the information to be conveyed, and/or information conveyance integrity requirements.

The conveyance integrity requirements relate to the sensitivity of the data, the requester, and/or the target is to data transmission errors and the ability to correct them. Thus, if any of the target or requester is intolerant to data transmission errors and/or they cannot be corrected, the data needs to be transmitted with the highest level of integrity to insure that very few data transmission errors will occur. Conversely, if the requestor and target can tolerate data transmission errors and/or can correct them; lower levels of integrity can be used to provide an adequate RF bus communication. Thus, the RF bus controller may consider the RF communication paths available (e.g., waveguide, dielectric, free-space), the level of rate encoding, the level of interleaving, the level of error correction, and/or the level of acknowledgement. For example, a request that can tolerate data transmission errors, the data may be bi-phase encoded with no interleaving and rate encoding and transmitted over a free-space RF communication path, where a request that cannot tolerate data transmission errors, the data will be encoded using the rate encoding, it will be interleaved, error correction (e.g., forward error correct) enabled, and transmitted over a waveguide RF communication path.

The method then proceeds to step 762 where the RF bus controller determines required RF bus resources based on the at least one of the transmission requirements, the RF bus capabilities of the requester, and the RF bus capabilities of the target. The method then proceeds to step 764 where the RF bus controller determines whether the required RF bus resources are available for allocation.

FIG. 54 is a logic diagram of another method for controlling access to an RF bus that is performed by the RF bus controller 1088. The method begins at step 734 where the RF Bus controller 1088 receives an access request to an RF bus via the interface 730. The access request may be received in a variety of ways. For example, the access request may be received in response to a polling request, in an allocated time division multiple access (TDMA) slot, in response to a token ring passing scheme, in accordance with a carrier sense multiple access (CSMA) protocol of a RF bus control resource, in accordance with an interrupt protocol, in an allocated frequency division multiple access (FDMA) slot, and/or in an allocated code division multiple access (CDMA) slot.

The method continues at step 736 where the RF bus controller 1088 determines RF bus resource availability. This step may also include determining an RF bus protocol based on the access request. The RF bus protocol may be a standardized wireless protocol (e.g., GSM, EDGE, GPRS, IEEE 802.11, Bluetooth, etc), a proprietary wireless protocol, and/or a modified standardized wireless protocol (based on one of the standard protocols but modified, for instance, using an IEEE 802.11 protocol but skipping the interleaving).

The method branches at step 738 based on whether sufficient RF bus resources are availability. When sufficient RF bus resources are available, the process proceeds to step 740 where the RF bus controller allocates, via the interface, at least one RF bus resource in response to the access request. Note that the RF bus resources include, but are not limited to, a Single Input Single Output (SISO) channel, a Multiple Input Multiple Output (MIMO) channel, multiple SISO channels, multiple MIMO channels, null-reinforce multipath patterning (e.g., use multipath reinforced areas for RF bus communications between two ICs and multipath nulls to block RF bus communications between two ICs), frequency band selection, a TDMA slot, a CDMA slot, an FDMA slot, an unused free-space RF communication path or channel, an unused waveguide RF communication path or channel, an unused dielectric RF communication path or channel, and/or any other medium or portioning scheme for transmitting RF signals.

When sufficient RF bus resources are not available, the method proceeds to step 766 where the RF bus controller 1088 determines whether priority of requester is at or above a first priority level. The priority level may be user defined, system defined, an ordering based on data type (e.g., operating system level data, application level data, interrupt data, real-time or continuous data v. non-real-time or discontinuous data, etc.), system level based (e.g., processing module, memory, peripheral device, etc. in order) and/or any other priority and/or ordering scheme. When the request is not above the 1st level, the method proceeds to step 768 where the RF bus controller queues the request.

When priority of the requestor is at or above the first priority level, the method proceeds to step 770 where the RF bus controller 1088 determines whether allocated RF bus resources can be reallocated to make available the sufficient RF bus resources. In this determination, the RF bus controller is determining whether existing RF bus communications can have their RF bus resources reallocated such that their level of service is below optimal, but still acceptable, to make sufficient resources available for the 1st level or higher priority RF bus request.

When the RF bus resources can be reallocated, the method proceeds to step 772 where the RF bus controller reallocates at least some of the allocated RF bus resources to make resources available for the 1st level or higher priority RF bus request. The method then proceeds to step 774 where the RF bus controller 1088 allocates the sufficient RF bus resources to the 1st level or higher priority request.

When the allocated RF bus resources cannot be reallocated and still provide an acceptable level of performance, the RF bus controller 1088 determines whether the priority of the requester is of a second priority level (i.e., of the highest level that if its request is not timely satisfied, the entire system or device may lock up). If the priority is not at the 2nd level, the method proceeds to step 768 where the RF bus controller 1088 queues the request.

If, however, the priority level of the requestor is of the second priority level, the method proceeds to step 778 where the RF bus controller reclaims RF bus resources from the allocated RF bus resources to provide the sufficient RF bus resources. In other words, the RF bus controller cancels a current RF bus communication to reclaim them for the 2nd priority level request. In one embodiment, the current RF bus communication having the most tolerance to a data transmission interruption is selected for reclaiming the RF bus resources. The method then proceeds to step 780 where the RF bus controller 1088 allocates the reclaimed RF bus resources to the 2nd priority level requester.

FIG. 55 is a schematic block diagram of another embodiment of a millimeter wave interface 1080 that includes a requester IC or circuit module 790, a target IC or circuit module 792, the RF bus controller 1088, a system level RF bus 814, and an application level RF bus 816. The requester 790 and the target 792 each include an RF bus transceiver 974. The RF bus transceiver 794 includes a programmable encode/decode module 796, a programmable interleave/deinterleave module 798, a programmable map/demap module 800, an inverse fast Fourier transform (IFFT)/FFT module 804, an RF front-end 804, and a plurality of multiplexers 806-810. The system level RF bus 814 and the application level RF bus 816 each include one or more waveguide RF communication paths, one or more dielectric RF communication paths, and/or one or more free-space RF communication paths.

In this embodiment, the RF bus controller 1088 controls access to the system level RF bus 814 for operating system level data conveyances and controls access to the application level RF bus 816 for application level data conveyances. Such data conveyances may include control information, operational instructions, and/or data (e.g., raw data, intermediate data, processed data, and/or stored data that includes text information, numerical information, video files, audio files, graphics, etc.).

In addition to controlling access to the RF buses 814 and 816, the RF bus controller 1088 may indicate to the RF bus transceivers 794 the RF bus protocol to be used for converting outbound data into outbound RF bus signals. For example, the RF bus protocol may be a standardized wireless protocol (e.g., IEEE 802.11, Bluetooth, GSM, EDGE, GPRS, CDMA, etc.), may be a proprietary wireless protocol, or a modified standard wireless protocol.

For example, if the RF bus controller 1088 indicates using a standard IEEE 802.11 wireless protocol (e.g., IEEE 802.11a, b, g, n, etc.), the RF bus transceiver 794 enables the programmable modules 796, 798, and 800 and the multiplexers 806-810 to perform in accordance with the IEEE 802.11 standard. For instance, multiplexer 806 provides outbound data to the programmable encoding/decoding module 706 that performs a half rate (or other rate) convolution encoding on the outbound data to produce encoded data. The programmable encoding/decoding module 706 may further puncture the encoded data to produce punctured data.

Continuing with the example, the encoded or punctured data is outputted to multiplexer 808, which provides the data to the programmable interleave/deinterleave module 708. The programmable interleave/deinterleave module 708 interleaves bits of different encoded data words to produce interleaved data. Multiplexer 810 provides the interleaved data to the programmable map/demap module 800 which maps the interleaved data to produce mapped data. The mapped data is converted from the frequency domain to the time domain by the IFFT portion of the IFFT/FFT module 802 to produce an outbound symbol stream. Multiplexer 810 provides the outbound symbol stream to the RF front end 804, which includes an RF transmitter section and an RF receiver section. The RF transmitter section converts the outbound symbol stream into an outbound RF bus signal.

The target 792 receives the outbound RF bus signal via the system level RF bus 814 or the application level RF bus 816 via its RF bus transceiver 794. The receiver section of the RF front end 804 converts the received RF bus signal into an inbound symbol stream. The FFT portion of the IFFT/FFT module 802 converts the inbound symbol stream from the time domain to the frequency domain to produce inbound mapped data. The programmable map/demap module 800 demaps the inbound mapped data to produce inbound interleaved data. Multiplexer 810 provides the inbound interleaved data to the programmable interleave/deinterleave module 798, which deinterleaves the inbound interleaved data to produce encoded or punctured data. The programmable encoding/decoding module 796 depunctures and/or decodes the encoded or punctured data to recapture the data.

As an example of a modified standard wireless protocol, multiplexer 806 provides outbound data to the programmable encoding/decoding module 706 that performs a half rate (or other rate) convolution encoding on the outbound data in accordance with a standard wireless protocol (e.g., IEEE 802.11) to produce encoded data. The programmable encoding/decoding module 706 may further puncture the encoded data to produce punctured data.

Continuing with the example, the encoded or punctured data is outputted to multiplexer 808, which provides the data to the programmable map/demap module 800 which maps the encoded or punctured data to produce mapped data. The mapped data is converted from the frequency domain to the time domain by the IFFT portion of the IFFT/FFT module 802 to produce an outbound symbol stream. Multiplexer 810 provides the outbound symbol stream to the RF transmitter section, which converts the outbound symbol stream into an outbound RF bus signal. As illustrated by this example, a modified standard wireless protocol is based on a standard wireless protocol with one or more of its functional steps omitted or modified.

As another example of a modified standard wireless protocol, multiplexer 806 provides outbound data to the programmable map/demap module 800 which maps the outbound data to produce mapped data. The mapped data is converted from the frequency domain to the time domain by the IFFT portion of the IFFT/FFT module 802 to produce an outbound symbol stream, which is subsequently converted into the outbound RF bus signal.

As an example of a proprietary RF bus protocol, multiplexer 806 provides outbound data to the programmable encoding/decoding module 706 that performs a bi-phase, return to zero (RTZ), non-return to zero (NRZ), and/or another binary encoding scheme to produce binary encoded data. The binary encoded data may be provided directly to the RF front end 804 via multiplexers 808 and 812, to the programmable interleave/deinterleave module 798 via multiplexer 808, or to the programmable map/demap module 800 via multiplexers 808 and 810.

The programmable map/demap module 800 may be programmed to map/demap data in a variety of ways. For example, the programmable map/demap module 800 may map the data into Cartesian coordinates having an in-phase component (e.g., $A_I(t)\cos\omega(t)$) and a quadrature component (e.g., $A_Q(t)\sin\omega(t)$). As another example, the programmable map/demap module 800 may map the data into polar coordinates (e.g., $A(t)\cos(\omega(t)+\phi(t))$). As yet another example, the programmable map/demap module 800 may map the data into hybrid coordinates having a normalized in-phase component (e.g., $\cos(\omega(t)+\phi(t))$) and a normalized quadrature component (e.g., $\sin(\omega(t)+\phi(t))$).

FIG. 56 is a logic diagram of another method for controlling access to an RF bus. The method begins at step 818 where the RF bus controller determines access requirements to an RF bus. The access requirements may include system configuration information, system level RF bus resources, application level RF bus resources, RF bus capabilities of requester, RF bus capabilities of target, amount of information to be conveyed, priority level of requestor, priority level of the information to be conveyed, real-time or non-real-time aspect of the information to be conveyed, and/or information conveyance integrity requirements.

The system configuration information includes number of ICs in the device, number of circuit modules in the ICs, nulling and reinforcing patterns, number and type of intra-device RF data bus, number and type of intra-device RF instruction bus, number and type of intra-device RF control bus, number and type of intra-IC RF data bus, number and type of intra-IC RF instruction bus, number and type of intra-IC RF control bus, types of ICs in the device, and/or bus interface capabilities of the ICs and/or its circuit modules. Note that the information conveyance integrity requirements include level of rate encoding (e.g., ½ rate, ¾ rate, etc.), level of interleaving, level of error correction, and/or level of acknowledgement (e.g., whether an ACK back is required or not, if required content of the ACK). Further note that the system level RF bus resources and the application level RF bus resources includes a Single Input Single Output (SISO) channel, a Multiple Input Multiple Output (MIMO) channel, multiple SISO channels, multiple MIMO channels, null-reinforce multipath patterning, frequency band selection, waveguide RF path, dielectric RF path, free space RF path, time division multiple access (TDMA) time slot, frequency division multiple access (FDMA) frequency slot, code division multiple access (CDMA) code slot, proprietary resource, and carrier sense multiple access (CSMA).

The method then proceeds to step 820 where the RF bus controller determines RF bus resource available. This step may further include determining an RF bus protocol based on the access request, wherein the RF bus protocol is one of: a standardized wireless protocol, a proprietary wireless protocol, and a modified standardized wireless protocol.

The method then proceeds to step 822 where the RF bus controller allocates, via the interface, RF bus resources in accordance with the access requirements and the RF bus resource availability. This may be done by determining whether sufficient RF bus resources are available to fulfill the access requirements; when the sufficient RF bus resources are available to fulfill the access request, allocating the sufficient RF bus resources to a requestor; when the sufficient RF bus resources are not available to fulfill the access request, determining available RF bus resources; determining whether the access requirements can be accommodated by the available RF bus resources; when the access request can be accommodated by the available RF bus resources, allocating the available RF bus resources to the requester; and when the access request cannot be accommodated by the available RF bus resources, queuing the access requirements.

The method may further include, when the sufficient RF bus resources are not available to fulfill the access requirements, the RF bus controller determining whether priority of the requester is at or above a first priority level; when priority of the requester is at or above the first priority level, determining whether allocated RF bus resources can be reallocated to make available the sufficient RF bus resources; when the allocated RF bus resources can be reallocated, reallocating at least some of the allocated RF bus resources; when the RF bus resources cannot be reallocated, determining whether the priority of the requester is of a second priority level; when the priority level of the requester is of the second priority level, reclaiming RF bus resources from the allocated RF bus resources to provide the sufficient RF bus resources; and when the priority level of the requestor is below the second priority level, queuing the access requirements.

FIG. 57 is a logic diagram of another method for controlling access to an RF bus. The method begins at step 824 where the RF bus controller determines access requirements to an RF bus for a circuit of an integrated circuit (IC) of a plurality of integrated circuits. This may be done as previously discussed. The method then proceeds to step 826 where the RF bus controller determines whether the access requirements pertain to an inter-IC communication or an intra-IC communication.

The method then proceeds to step 828 where the RF bus controller 1088 determines RF bus resource available in accordance with inter-IC communication or the intra-IC communication. This may be done as previously described. The method then proceeds to step 830 where the RF bus controller allocates, via the interface, RF bus resources in accordance with the access requirements and the RF bus resource availability.

FIG. 58 is a schematic block diagram of an embodiment of an RF bus transceiver 840 that may be used as or in combination with one or more of the RF bus transceivers or other transceivers previously described. The RF bus transceiver 840 includes a transmitter 842 and a receiver 844. The transmitter 842 and the receiver 844 performs one or more methods of the present invention.

FIG. 59 is a logic diagram of method for RF bus transmitting that begins at step 846 where the transmitter 842 determine whether outbound information is to be transmitted via the RF bus. Such a determination may be made by setting a flag by the IC or circuit module that includes the RF bus transceiver, by providing the outbound information to the RF bus transceiver, and/or any other mechanism for notifying that it has information to transmit.

When the outbound information is to be transmitted via the RF bus, the method proceeds to step 848 where the transmitter 842 determines whether the RF bus is available. When the RF bus is not available, the transmitter 842 waits until the RF bus becomes available. The transmitter 842 may determine by the availability of the RF bus by utilizing a carrier sense multiple access with collision avoidance (CSMA/CD) access protocol, utilizing a request to send frame and clear to send frame exchange access protocol, utilizing a poll-response access protocol, interpreting a control time slot of a time division multiple access (TDMA) frame, interpreting a control frequency slot of a frequency division multiple access (FDMA) frame, interpreting a control code slot of a code division multiple access (CDMA) frame, and/or utilizing a request-grant access protocol.

When the RF bus is available, the method proceeds to step 850 where the transmitter 842 secures access to the RF bus. The transmitter 842 may secure access to the RF bus by accessing the RF bus in accordance with a carrier sense multiple access with collision avoidance (CSMA/CD) access protocol, accessing the RF bus in response to a favorable request to send frame and clear to send frame exchange, accessing the RF bus in accordance with a poll-response access protocol, accessing the RF bus via an allocated time slot of a time division multiple access (TDMA) frame, accessing the RF bus via an allocated frequency slot of a frequency division multiple access (FDMA) frame, accessing the RF bus via an allocated code slot of a code division multiple access (CDMA) frame, and/or accessing the RF bus in accordance with a request-grant access protocol. Note that the transmitter 842 may determine whether the RF bus is available and secures access to the RF bus by communicating with the RF bus controller 1088 via a wireline link, via a wireless link, and/or via the RF bus.

The method proceeds to step 852 where the transmitter 842 converts the outbound information into outbound RF bus signal. The method then proceeds to step 844 where the transmitter 842 transmits the outbound RF bus signal via the RF bus when access to the RF bus is secured. As such, the transmitter 842 prepares data for transmission via one of the RF buses in a device and transmits the RF bus signal when it is the transmitter's turn and/or when the RF bus is not in use.

FIG. 60 is a logic diagram of method for RF bus receiving that begins at step 856 where the receiver 844 determines whether inbound information is to be received via the RF bus. The receiver 844 may determine that there is inbound information to be received by utilizing a carrier sense multiple access with collision avoidance (CSMA/CD) access protocol, utilizing a request to send frame and clear to send frame exchange access protocol, utilizing a poll-response access protocol, interpreting a control time slot of a time division multiple access (TDMA) frame, interpreting a control frequency slot of a frequency division multiple access (FDMA) frame, interpreting a control code slot of a code division multiple access (CDMA) frame, and/or utilizing a request-grant access protocol.

When there is inbound information to be received via the RF bus, the method proceeds to step 858 where the receiver 844 determines access parameters to the RF bus for receiving the inbound information. The receiver 844 may determine the access parameters by receiving the inbound RF bus signal in accordance with a carrier sense multiple access with collision avoidance (CSMA/CD) access protocol, receiving the inbound RF bus signal in accordance with a request to send frame and clear to send frame exchange, receiving the inbound RF bus signal in accordance with a poll-response access protocol, receiving the inbound RF bus signal via an allocated time slot of a time division multiple access (TDMA) frame, receiving the inbound RF bus signal via an allocated frequency slot of a frequency division multiple access (FDMA) frame, receiving the inbound RF bus signal via an allocated code slot of a code division multiple access (CDMA) frame, and/or receiving the inbound RF bus signal in accordance with a request-grant access protocol. Note that the receiver 844 may determine the access parameters by communicating with the RF bus controller 1088 via a wireline link, a wireless link, and/or the RF bus.

The method then proceeds to step 860 where the receiver 844 receives an inbound RF bus signal during the access to the RF bus in accordance with the access parameters. The method then proceeds to step 862 where the receiver 844 converts the inbound RF bus signal into the inbound information.

FIG. 61 is a logic diagram of method for determining whether information is to be transmitted via an RF bus by the transmitter 842. The method begins at step 870 where the transmitter 842 identifies a target of the outbound information. In one embodiment, the outbound information will be in packet or frame format having a header portion that includes the address of the source, the address of the destination, the size of the packet or frame, etc.

The method then proceeds to step 872 where the transmitter 842 determines whether the target is accessible via the RF bus. The target may not be accessible via the RF bus for several reasons. For example, the nature of the data being transmitted may require that it be transmitted via a wireline link, the target may be in a multipath null with respect to the source, the target is currently using the RF bus for another RF bus communication, etc. When the target is not accessible via the RF bus, the method proceeds to step 876 where the transmitter 842 sends the outbound information via a wireline link.

When the target is accessible via the RF bus, the method proceeds to step 874 where the transmitter determines the type of the outbound information to be transmitted. When the type of the outbound information is of a first type (e.g., tolerant of transmission errors), the method proceeds to step 878 where the transmitter 842 indicates that the outbound information is to be transmitted via the RF bus. When the type of the outbound information is of a second type (e.g., not tolerant of transmission errors), the method proceeds to step 876 where the transmitter 842 indicates that the outbound information is to be transmitted via a wireline link. Note that step 874 could be omitted.

FIG. 62 is a flowchart representation of a method in accordance with an embodiment of the present invention. In particular a method is shown for use in conjunction with one or more functions and features described in conjunction with FIGS. 1-61. In step 900, a first inductive interface of a first integrated circuit and a second inductive interface of a second integrated circuit are aligned. In step 904, signals are magnetically communicated between a first circuit of the first integrated circuit and a second circuit of the second integrated circuit via the first inductive interface and the second inductive interface.

In an embodiment of the present invention, step 904 includes bidirectionally communicating signals between the first circuit and the second circuit. Step 900 can include stacking the first integrated circuit and the second integrated circuit and/or aligning a first coil of the first inductive interface with a second coil of the second inductive interface.

FIG. 63 is a flowchart representation of a method in accordance with an embodiment of the present invention. In particular a method is shown for use in conjunction with one or more functions and features described in conjunction with FIGS. 1-61 and in particular with the method of FIG. 62. In step 902, the first integrated circuit is bonded to the second integrated circuit using a ferromagnetic glue.

FIG. 64 is a flowchart representation of a method in accordance with an embodiment of the present invention. In particular a method is shown for use in conjunction with one or more functions and features described in conjunction with FIGS. 1-63. In step 910, a first inductive interface of a first integrated circuit die and a second inductive interface of a second integrated circuit die are aligned. In step 914, signals are magnetically communicated between a first circuit of the first integrated circuit die and a second circuit of the second integrated circuit die via the first inductive interface and the second inductive interface.

In an embodiment of the present invention, step 914 includes bidirectionally communicating signals between the first circuit and the second circuit. Step 910 can include stacking the first integrated circuit and the second integrated circuit and/or aligning a first coil of the first inductive interface with a second coil of the second inductive interface.

FIG. 65 is a flowchart representation of a method in accordance with an embodiment of the present invention. In particular a method is shown for use in conjunction with one or more functions and features described in conjunction with FIGS. 1-63 and in particular, the method of FIG. 64. In step 912, the first integrated circuit die is bonded to the second integrated circuit die.

FIG. 66 is a flowchart representation of a method in accordance with an embodiment of the present invention. In particular a method is shown for use in conjunction with one or more functions and features described in conjunction with FIGS. 1-65. In step 920, a first inductive interface of a first integrated circuit die and a second inductive interface of a second integrated circuit die are aligned with a magnetic communication path included in a substrate. In step 924, signals are magnetically communicated between a first circuit of the first integrated circuit die and a second circuit of the second integrated circuit die via the first inductive interface and the second inductive interface and via the magnetic communication path.

Step 920 can include aligning a third coil of the magnetic communication path with a first coil of the first integrated circuit die and aligning a fourth coil of the magnetic communication path with a second coil of the first integrated circuit die. Further step 920 can include planarly aligning a third coil of the magnetic communication path with a first coil of the first integrated circuit die, planarly aligning a fourth coil of the magnetic communication path with a second coil of the first integrated circuit die, axially aligning a third coil of the magnetic communication path with a first coil of the first integrated circuit die, and/or axially aligning a fourth coil of the magnetic communication path with a second coil of the first integrated circuit die. The magnetic communication path can include a ferromagnetic material. Step 924 can include bidirectionally communicating signals between the first circuit and the second circuit.

FIG. 67 is a flowchart representation of a method in accordance with an embodiment of the present invention. In particular a method is shown for use in conjunction with one or more functions and features described in conjunction with FIGS. 1-65 and in particular with the method of FIG. 66. In step 922, the first integrated circuit die is bonded to the substrate via a ferromagnetic glue.

FIG. 68 is a flowchart representation of a method in accordance with an embodiment of the present invention. In particular a method is shown for use in conjunction with one or more functions and features described in conjunction with FIGS. 1-67 and in particular with the method of FIG. 66. In step 922, the second integrated circuit die is bonded to the substrate via a ferromagnetic glue.

FIG. 69 is a flowchart representation of a method in accordance with an embodiment of the present invention. In particular a method is shown for use in conjunction with one or more functions and features described in conjunction with FIGS. 1-68. In step 930, first signals are communicated between a first plurality of integrated circuit dies of an integrated circuit via corresponding millimeter wave interfaces. In step 932 second signals are communicated between a second plurality of integrated circuit dies of the integrated circuit via corresponding inductive interfaces.

In an embodiment of the present invention, at least one of the first plurality of integrated circuit dies is included in the second plurality of integrated circuit dies. Further, two or more of the first plurality of integrated circuit dies can be included in the second plurality of integrated circuit dies.

FIG. 70 is a flowchart representation of a method in accordance with an embodiment of the present invention. In particular a method is shown for use in conjunction with one or more functions and features described in conjunction with FIGS. 1-69. In step 934, third signals are communicated between at least one of the first plurality of integrated circuit dies and a remote device via the corresponding millimeter wave interface.

FIG. 71 is a flowchart representation of a method in accordance with an embodiment of the present invention. In particular a method is shown for use in conjunction with one or more functions and features described in conjunction with FIGS. 1-70. In step 940, first signals are communicated between a first plurality of integrated circuits via corresponding millimeter wave interfaces. In step 942, second signals are communicated between a second plurality of integrated circuits via corresponding inductive interfaces.

In an embodiment of the present invention, at least one of the first plurality of integrated circuits is included in the second plurality of integrated circuits. Further, two or more of the first plurality of integrated circuits can be included in the second plurality of integrated circuits.

FIG. 72 is a flowchart representation of a method in accordance with an embodiment of the present invention. In particular a method is shown for use in conjunction with one or more functions and features described in conjunction with FIGS. 1-71. In step 944, third signals are communicated between at least one of the first plurality of integrated circuits and a remote device via the corresponding millimeter wave interface.

FIG. 73 is a flowchart representation of a method in accordance with an embodiment of the present invention. In particular a method is shown for use in conjunction with one or more functions and features described in conjunction with FIGS. 1-72. In step 950, first signals are magnetically communicated between a first integrated circuit and a second interface circuit via a first inductive interface and a second inductive interface. In step 952, near field communicates are engaged in via the second inductive interface with a remote device, wherein the near field communications include second signals.

In an embodiment of the present invention, the first signals are magnetically communicated in a first frequency band and the near field communications are communicated in a second frequency band that is different from the first frequency band. Steps 950 and 952 can be performed serially or contemporaneously.

FIG. 74 is a flowchart representation of a method in accordance with an embodiment of the present invention. In particular a method is shown for use in conjunction with one or more functions and features described in conjunction with FIGS. 1-74. In step 60, first signals are magnetically communicated between a first integrated circuit die and a second interface circuit die via a first inductive interface and a second inductive interface. In step 962, near field communications are engaged in via the second inductive interface with a remote device, wherein the near field communications include second signals.

In an embodiment of the present invention, the first signals are magnetically communicated in a first frequency band and the near field communications are communicated in a second frequency band that is different from the first frequency band. Steps 960 and 962 can be performed serially or contemporaneously.

FIG. 75 is a flowchart representation of a method in accordance with an embodiment of the present invention. In particular a method is shown for use in conjunction with one or more functions and features described in conjunction with FIGS. 1-74. In step 970, signals are magnetically communicated between a plurality of integrated circuit dies in accordance with a multi access protocol.

In an embodiment of the present invention, the signals are communicated via an RF bus. Step 970 can include arbitrating access to the RF bus. Arbitrating the access to the RF bus can include: receiving an RF bus access request; determining RF bus resource availability; determining when sufficient RF bus resources are available; and allocating at least one RF bus resource when sufficient RF bus resources are available. Arbitrating the access to the RF bus can include: polling the plurality of inductive interfaces; and allocating at least one RF bus resource in response to poll. Arbitrating the access to the RF bus can include: receiving a request to reserve at least one RF bus resource from one of the plurality of inductive interfaces; and reserving the at least one RF bus resource. The multiple access protocol includes one of: a time division multiple access protocol, a frequency division multiple access protocol, a random access protocol and a code division multiple access protocol. Step 970 can include communicating the signals between a plurality of integrated circuit dies include communicating the signals bidirectionally.

FIG. 76 is a flowchart representation of a method in accordance with an embodiment of the present invention. In particular a method is shown for use in conjunction with one or more functions and features described in conjunction with FIGS. 1-75. In step 980, signals are magnetically communicated between a plurality of integrated circuits in accordance with a multi access protocol.

In an embodiment of the present invention, the signals are communicated via an RF bus. Step 980 can include arbitrating access to the RF bus. Arbitrating the access to the RF bus can include: receiving an RF bus access request; determining RF bus resource availability; determining when sufficient RF bus resources are available; and allocating at least one RF bus resource when sufficient RF bus resources are available. Arbitrating the access to the RF bus can include: polling the plurality of inductive interfaces; and allocating at least one RF bus resource in response to poll. Arbitrating the access to the RF bus can include: receiving a request to reserve at least one RF bus resource from one of the plurality of inductive interfaces; and reserving the at least one RF bus resource. The multiple access protocol includes one of: a time division multiple access protocol, a frequency division multiple access protocol, a random access protocol and a code division multiple access protocol. Step 980 can include communicating the signals between a plurality of integrated circuit dies include communicating the signals bidirectionally.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An integrated circuit comprising:
a first integrated circuit die having a first circuit and a first inductive interface that includes a first coil; and
a second integrated circuit die having a second circuit and a second inductive interface that includes a second coil;
a substrate coupled to support the first integrated circuit die and the second integrated circuit die, the substrate including a magnetic communication path aligned with the first inductive interface and the second inductive interface, to magnetically communicate signals between the first circuit and the second circuit;
wherein the magnetic communication path includes a third coil aligned with the first coil and a fourth coil, coupled to the third coil and aligned with the second coil.

2. The integrated circuit of claim 1 wherein the first integrated circuit die is bonded to the substrate via a ferromagnetic glue.

3. The integrated circuit of claim 2 wherein the second integrated circuit die is bonded to the substrate via a ferromagnetic glue.

4. The integrated circuit of claim 1 wherein the third coil is planarly aligned with the first coil and the fourth coil is planarly aligned with the second coil.

5. The integrated circuit of claim 1 wherein the third coil is axially aligned with the first coil and the fourth coil is axially aligned with the second coil.

6. The integrated circuit of claim 1 wherein the magnetic communication path includes a ferromagnetic material.

7. The integrated circuit of claim 1 wherein the magnetic communication path is aligned to magnetically communicate signals bidirectionally between the first circuit and the second circuit.

8. The integrated circuit of claim 1 wherein the first integrated circuit die is stacked above the substrate and the second integrated circuit die is stacked below the substrate in a flip-chip configuration.

9. An integrated circuit comprising:
a first integrated circuit die having a first circuit and a first inductive interface; and
a second integrated circuit die having a second circuit and a second inductive interface;
a substrate coupled to support the first integrated circuit die and the second integrated circuit die, the substrate including a magnetic communication path aligned with the first inductive interface and the second inductive interface, to magnetically communicate signals between the first circuit and the second circuit;
wherein the magnetic communication path is aligned to magnetically communicate signals bidirectionally between the first circuit and the second circuit.

10. The integrated circuit of claim 9 wherein the first integrated circuit die is bonded to the substrate via a ferromagnetic glue.

11. The integrated circuit of claim 10 wherein the second integrated circuit die is bonded to the substrate via a ferromagnetic glue.

12. The integrated circuit of claim 9 wherein the first inductive interface includes a first coil and the second inductive interface includes a second coil.

13. The integrated circuit of claim 12 wherein the magnetic communication path includes a third coil aligned with the first coil and a fourth coil, coupled to the third coil and aligned with the second coil.

14. The integrated circuit of claim 13 wherein the third coil is planarly aligned with the first coil and the fourth coil is planarly aligned with the second coil.

15. The integrated circuit of claim 13 wherein the third coil is axially aligned with the first coil and the fourth coil is axially aligned with the second coil.

16. The integrated circuit of claim 9 wherein the magnetic communication path includes a ferromagnetic material.

17. The integrated circuit of claim 9 wherein the first integrated circuit die is stacked above the substrate and the second integrated circuit die is stacked below the substrate in a flip-chip configuration.

* * * * *